United States Patent
Kato et al.

(10) Patent No.: US 10,134,750 B2
(45) Date of Patent: Nov. 20, 2018

(54) STACKED TYPE SEMICONDUCTOR MEMORY DEVICE AND METHOD FOR MANUFACTURING THE SAME

(71) Applicant: Toshiba Memory Corporation, Minato-ku (JP)

(72) Inventors: Tatsuya Kato, Yokkaichi (JP); Wataru Sakamoto, Yokkaichi (JP); Fumitaka Arai, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 14/838,854

(22) Filed: Aug. 28, 2015

(65) Prior Publication Data

US 2016/0190147 A1 Jun. 30, 2016

Related U.S. Application Data

(60) Provisional application No. 62/097,982, filed on Dec. 30, 2014.

(51) Int. Cl.
*H01L 29/788* (2006.01)
*H01L 27/11556* (2017.01)
*H01L 27/11519* (2017.01)
*H01L 27/11548* (2017.01)

(52) U.S. Cl.
CPC .. *H01L 27/11556* (2013.01); *H01L 27/11519* (2013.01); *H01L 27/11548* (2013.01)

(58) Field of Classification Search
None
See application file for complete search history.

(56) References Cited

U.S. PATENT DOCUMENTS

| | | | | |
|---|---|---|---|---|
| 2009/0268522 | A1* | 10/2009 | Maejima | G11C 5/02 365/185.11 |
| 2011/0199804 | A1* | 8/2011 | Son | G11C 5/04 365/51 |
| 2012/0001247 | A1* | 1/2012 | Alsmeier | H01L 27/11551 257/316 |
| 2012/0261742 | A1* | 10/2012 | Hirano | H01L 21/28282 257/324 |
| 2013/0334589 | A1* | 12/2013 | Ahn | H01L 29/7926 257/324 |
| 2015/0200199 | A1 | 7/2015 | Sakamoto et al. | |
| 2016/0093392 | A1 | 3/2016 | Sakamoto | |

* cited by examiner

*Primary Examiner* — Cory Eskridge
(74) *Attorney, Agent, or Firm* — Oblon, McClelland, Maier & Neustadt, L.L.P.

(57) ABSTRACT

According to one embodiment, a semiconductor memory device includes a substrate, semiconductor pillars, first electrode films, a second electrode film, a first insulating film, a second insulating film, and a contact. The semiconductor pillars are provided on the substrate, extend in a first direction crossing an upper surface of the substrate, and are arranged along second and third directions being parallel to the upper surface and crossing each other. The first electrode films extend in the third direction. The second electrode film is provided between the semiconductor pillars and the first electrode films. The first insulating film is provided between the semiconductor pillars and the second electrode film. The second insulating film is provided between the second electrode film and the first electrode films. The contact is provided at a position on the third direction of the semiconductor pillars and is connected to the first electrode films.

8 Claims, 94 Drawing Sheets

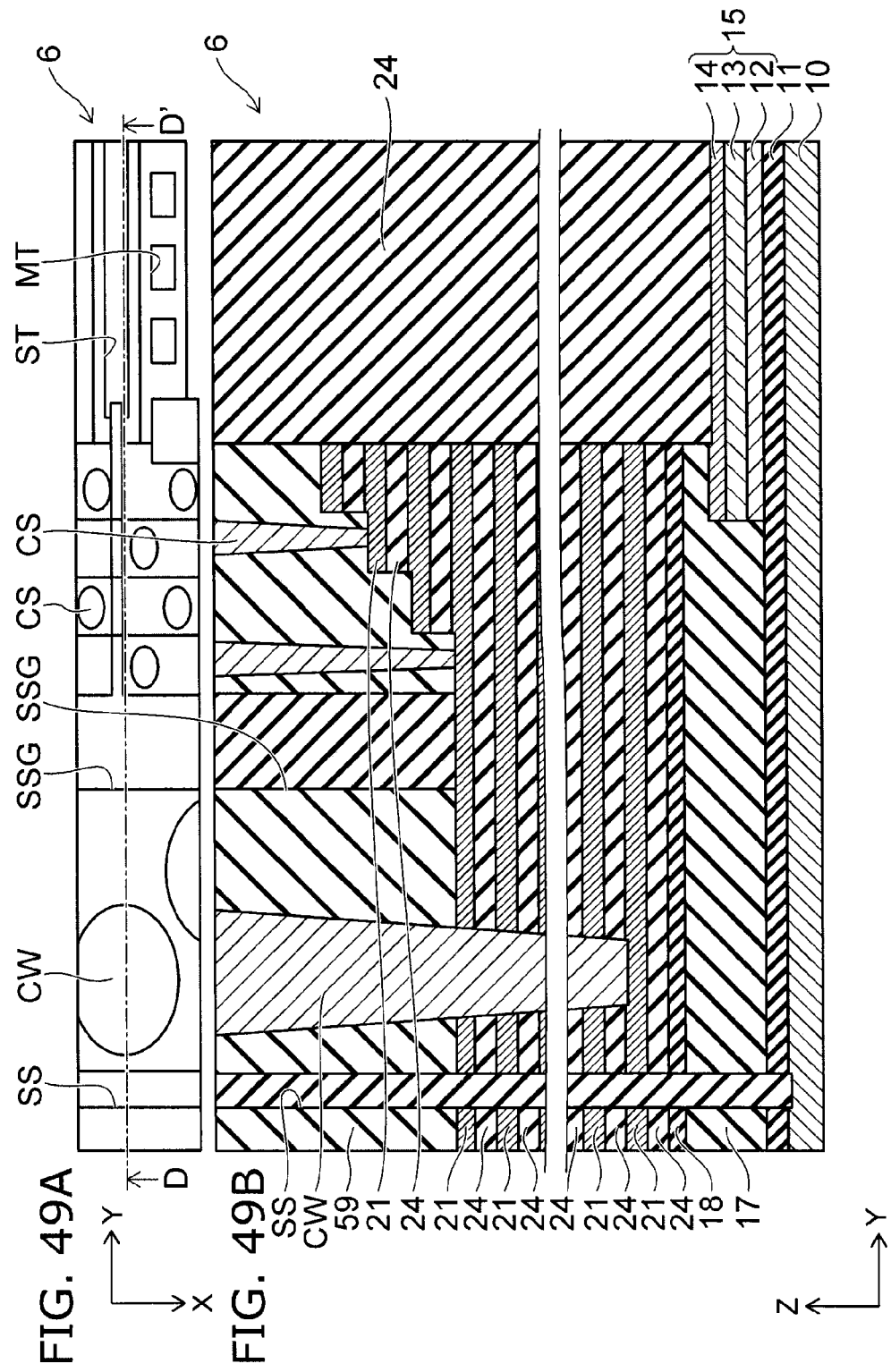

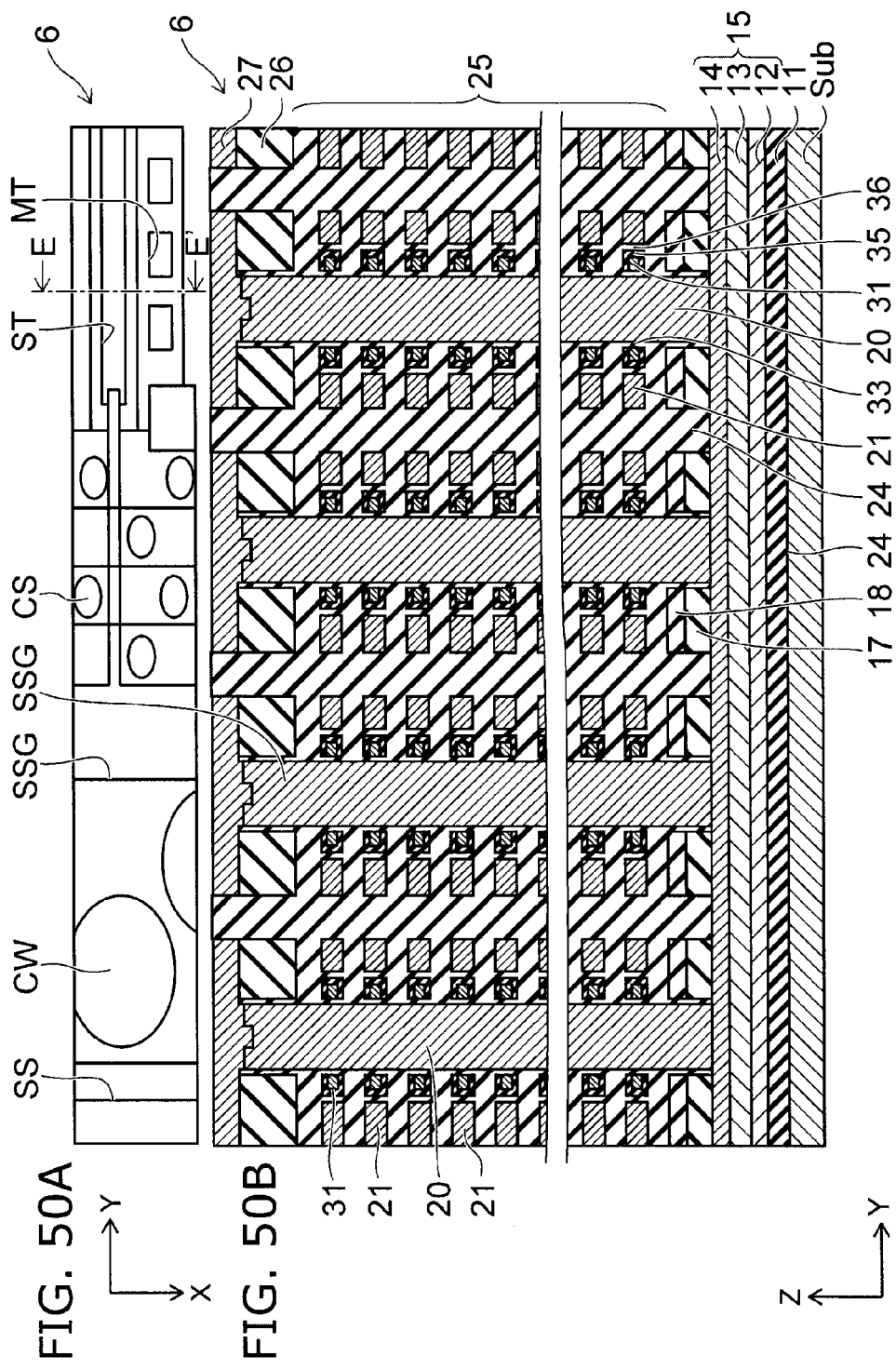

STACKED TYPE SEMICONDUCTOR MEMORY DEVICE AND METHOD FOR MANUFACTURING THE SAME

CROSS-REFERENCE TO RELATED APPLICATIONS

This application is based upon and claims the benefit of priority from U.S. Provisional Patent Application 62/097,982, filed on Dec. 30, 2014; the entire contents of which are incorporated herein by reference.

FIELD

Embodiments described herein relate generally to a semiconductor memory device and a method for manufacturing the same.

BACKGROUND

The bit cost of NAND flash memories has been reduced by miniaturization of the planar structure and use of multi-valued memory cells. However, the miniaturization of the planar structure is approaching the limit due to the limitations of processing technologies and the cost increase of lithography devices. Thus, technologies for vertically stacking memory cells have been proposed in recent years.

BRIEF DESCRIPTION OF THE DRAWINGS

FIG. 49A is a plan view showing the semiconductor memory device according to the sixth embodiment, FIG. 49B is a sectional view taken along line D-D' shown in FIG. 49A;

FIG. 50A is a plan view showing the semiconductor memory device according to the sixth embodiment, FIG. 50B is a sectional view taken along line E-E' shown in FIG. 50A;

DETAILED DESCRIPTION

Figure 1:
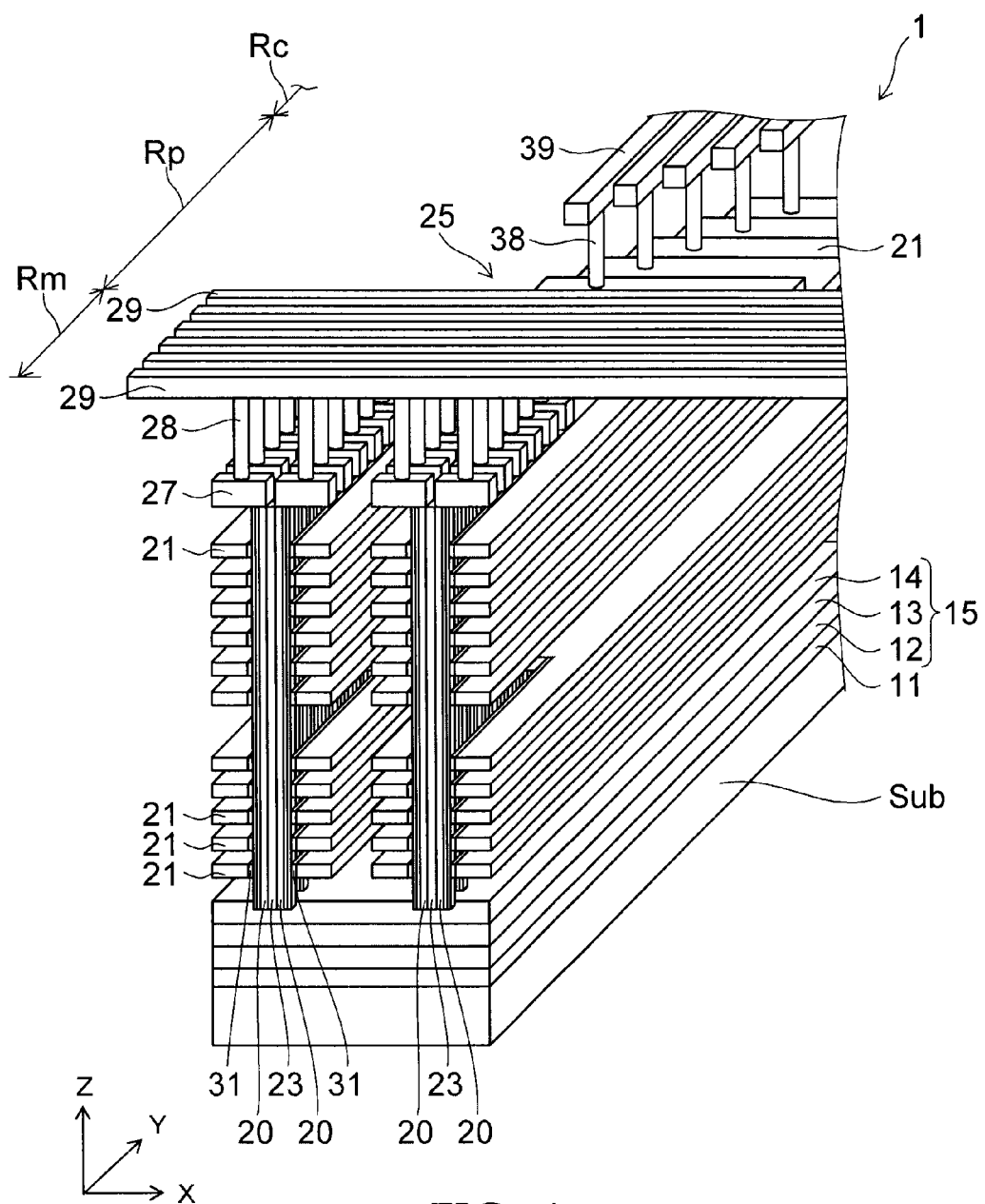
FIG. 1 is a perspective view showing a semiconductor memory device according to a first embodiment.

According to one embodiment, a semiconductor memory device includes a substrate, semiconductor pillars, a plurality of first electrode films, a second electrode film, a first insulating film, a second insulating film, and a contact. The semiconductor pillars are provided on the substrate, extend in a first direction crossing an upper surface of the substrate, and are arranged along a second direction and a third direction being parallel to the upper surface and crossing each other. The first electrode films extend in the third direction. The second electrode film is provided between the semiconductor pillars and the first electrode films. The first insulating film is provided between the semiconductor pillars and the second electrode film. The second insulating film is provided between the second electrode film and the first electrode films. The contact is provided at a position on the third direction of the semiconductor pillars and is connected to the first electrode films. Two adjacent ones of the first electrode films are connected to each other.

(Common Configuration)

Various embodiments will be described hereinafter with reference to the accompanying drawings.

The semiconductor device according to the embodiments described below includes a memory cell region Rm, a pullout region Rp, and a peripheral circuit region Rc. The memory cell region Rm includes memory cells arranged in three dimensions. The pullout region Rp pulls out interconnects from the memory cell region Rm. The peripheral circuit region Rc includes a driving circuit for operating the memory cell region Rm.

In the embodiments described below, the memory cell region Rm and the peripheral circuit region Rc are nearly identical in configuration. They are different in the connection of interconnects between the memory cell region Rm and the pullout region Rp. Furthermore, they are different in the order of process steps in the manufacturing method. The configuration of the memory cell region Rm and the peripheral circuit region Rc will be described in details in the first embodiment. However, the configuration also applies to the other embodiments.

TABLE 1 lists the connection of interconnects and the order of process steps in the embodiments. In TABLE 1, "MT" indicates a memory trench and a series of process steps for forming the memory trench. A silicon pillar is disposed along the inner surface of the memory trench. "ST" indicates a slit formed between the control gate electrode films and a series of process steps for forming the slit. "SS" indicates a series of process steps for cutting the end part of the select gate electrode film. "SSG" indicates a series of process steps for cutting the control gate electrode film forming the gate electrode of an upper select transistor. Although not described in TABLE 1, a series of process steps for processing the silicon pillar is performed immediately after "MT".

TABLE 1

| Locations od short-circuited control gate electrode films | Existence of SS | Processing order | Pattern of MT, ST | Embodiment |
|---|---|---|---|---|
| Both sides of ST | Yes | MT→ST→ SS→SSG | Equal length | first |
| | | | ST elongated on one side | second |
| | | | ST elongated on both sides | third |
| | | MT→SS→ ST→SSG | Equal length | fourth |
| | | | ST elongated on one side | fifth |
| | | SS→MT→ ST→SSG | Equal length | sixth |
| | | | ST elongated on one side | seventh |
| | No (MT only) | MT→ST→ SSG | Equal length | eighth |
| | | | ST elongated on one side | ninth |
| Both sides of MT | Yes | MT→ST→ SS→SSG | Equal length | tenth |
| | | | ST elongated on one side | eleventh |
| | | | ST elongated on both sides | twelfth |
| | | MT→SS→ ST→SSG | Equal length | thirteenth |
| | | | ST elongated on one side | fourteenth |
| | | SS→MT→ ST→SSG | Equal length | fifteenth |
| | | | ST elongated on one side | sixteenth |
| | No (ST only) | MT→ST→ SSG | Equal length | seventeenth |

(First Embodiment)

First, a first embodiment is described.

FIG. 1 is a perspective view showing a semiconductor memory device according to the embodiment.

Figure 2:
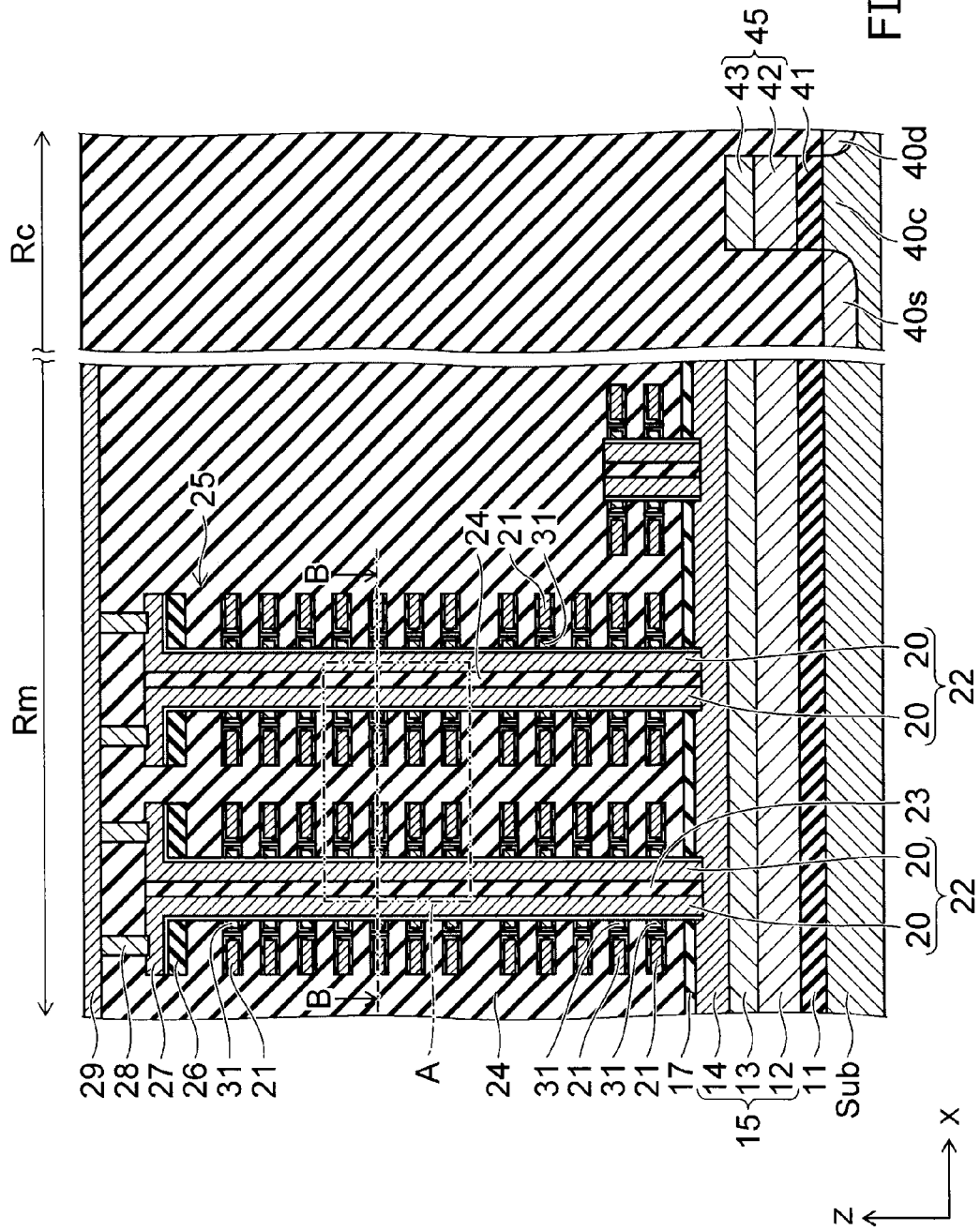
FIG. 2 is a sectional view showing the semiconductor memory device according to the first embodiment.

FIG. 2 is a sectional view showing the semiconductor memory device according to the embodiment.

Figure 3:
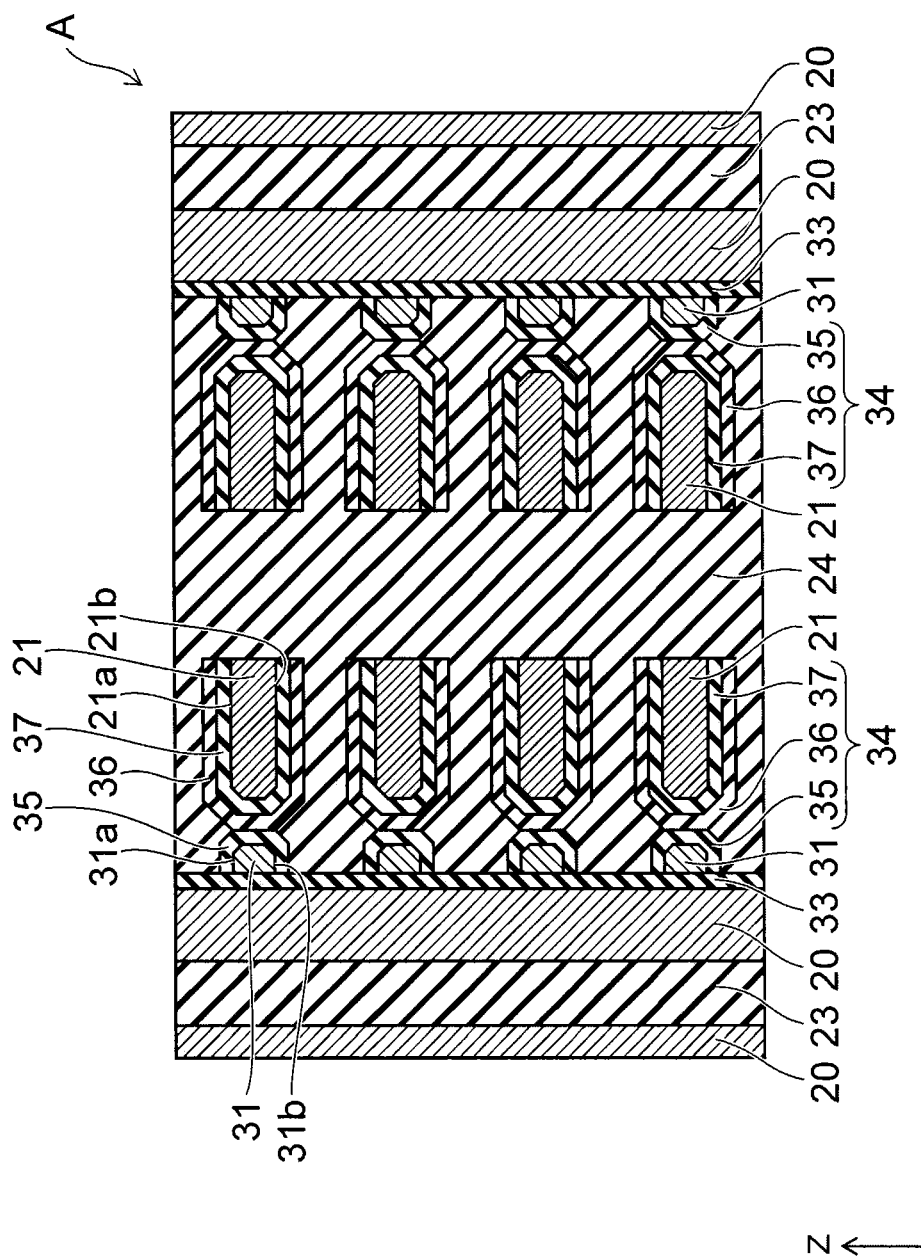
FIG. 3 is a sectional view showing region A shown in FIG. 2.

FIG. 3 is a sectional view showing region A shown in FIG. 2.

Figure 4:
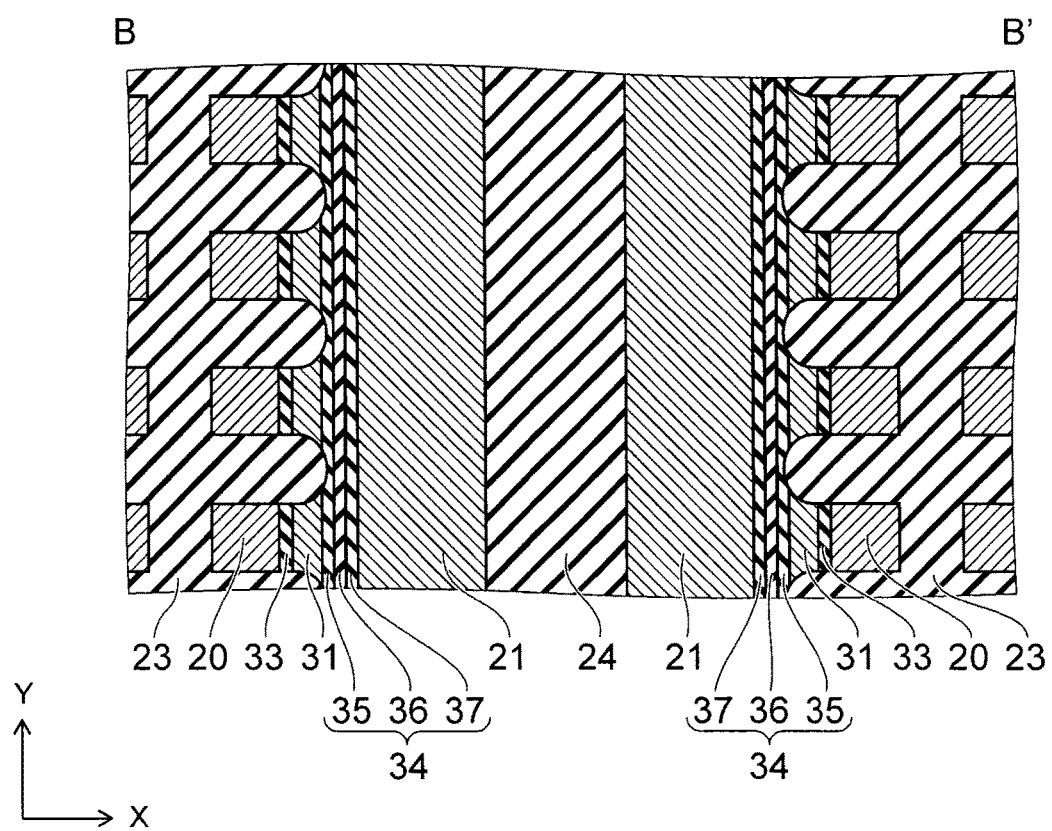
FIG. 4 is a sectional view taken along line B-B' shown in FIG. 2.

FIG. 4 is a sectional view taken along line B-B' shown in FIG. 2.

The X-direction range of the portion shown in FIG. 4 corresponds to the portion shown in FIG. 3.

As shown in FIG. 1 and FIG. 2, the semiconductor memory device 1 according to the embodiment includes a silicon substrate Sub. A memory cell region Rm, a pullout region Rp, and a peripheral circuit region Rc are defined in the silicon substrate Sub. In the following, for convenience of description, an XYZ orthogonal coordinate system is used in the specification. Two directions parallel to the upper surface of the silicon substrate Sub and orthogonal to each other are referred to as "X-direction" and "Y-direction". The direction perpendicular to the upper surface of the silicon substrate Sub is referred to as "Z-direction".

First, the memory cell region Rm is described.

In the memory cell region Rm, an insulating film 11 made of e.g. silicon oxide, a conductive layer 12 made of e.g. polysilicon, an interconnect layer 13 made of e.g. tungsten, and a conductive layer 14 made of e.g. polysilicon are stacked in this order on the silicon substrate Sub. The conductive layer 12, the interconnect layer 13, and the conductive layer 14 form a cell source line 15. An insulating film 17 made of e.g. silicon oxide is provided on the cell source line 15. A plurality of silicon pillars 20 extending in the Z-direction are provided on the cell source line 15. The silicon pillar 20 is made of e.g. polysilicon. The lower end of the silicon pillar 20 penetrates through the insulating film 17 and is connected to the cell source line 15. As viewed in the Z-direction, the silicon pillars 20 are arranged in a matrix pattern along the X-direction and the Y-direction. For each block, the silicon pillars 20 are commonly connected to a single cell source line 15.

A plurality of control gate electrode films 21 are provided on the lateral side of the silicon pillar 20. The control gate electrode films 21 are spaced from each other along the Z-direction. Each control gate electrode film 21 is made of e.g. tungsten and extends in the Y-direction. Thus, the control gate electrode film 21 is not disposed between the silicon pillars 20 arranged along the Y-direction. In the X-direction, two silicon pillars 20 and two control gate electrode films 21 are alternately arranged. In other words, the silicon pillars 20 arranged along the X-direction are grouped into a plurality of groups 22 each composed of two adjacent silicon pillars 20. Two control gate electrode films 21 are arranged so as to lie between the groups 22. Then, the control gate electrode film 21 is not disposed between the two silicon pillars 20 belonging to each group 22.

An interlayer insulating film 23 made of e.g. silicon oxide is provided between the silicon pillars 20. An interlayer insulating film 24 made of e.g. silicon oxide is provided between the control gate electrode films 21 and below the lowermost control gate electrode film 21 and above the uppermost control gate electrode film 21. The plurality of control gate electrode films 21, the interlayer insulating film 23, and the interlayer insulating film 24 form a multilayer body 25. A hard mask 26 is provided on the multilayer body 25.

The silicon pillar 20 is pulled out onto the hard mask 26 and connected to an interconnect 27 extending in the X-direction. A via 28 is provided on the interconnect 27. A bit line 29 extending in the X-direction is provided on the via 28. The bit line 29 is connected to the interconnect 27 through the via 28. Thus, each silicon pillar 20 is connected between the bit line 29 and the cell source line 15. That is, the semiconductor memory device 1 is a multilayer memory device of the I-shaped pillar type.

As shown in FIG. 3 and FIG. 4, a floating gate electrode film 31 made of e.g. polysilicon is provided between the silicon pillar 20 and the control gate electrode film 21. The floating gate electrode film 31 is provided for each crosspoint of the silicon pillar 20 and the control gate electrode film 21. Thus, the floating gate electrode films 31 are spaced from each other and arranged in a matrix pattern along the Y-direction and the Z-direction. As viewed in the Z-direction, the floating gate electrode film 31 is shaped like a sector spreading on the control gate electrode film 21 side. Thus, the Y-direction length of the end part on the silicon pillar 20 side of the floating gate electrode film 31 is shorter than the Y-direction length of the end part on the control gate electrode film 21 side of the floating gate electrode film 31.

A tunnel insulating film 33 made of e.g. silicon oxide is provided between the silicon pillar 20 and the floating gate electrode film 31. The tunnel insulating film 33 is provided for each silicon pillar 20. The tunnel insulating film 33 is shaped like a strip extending in the Z-direction with the thickness direction being the X-direction and the width direction being the Y-direction.

On the other hand, a block insulating film 34 is provided between the floating gate electrode film 31 and the control gate electrode film 21. The block insulating film 34 is a three-layer film in which a silicon nitride layer 35, a silicon oxide layer 36, and a silicon nitride layer 37 are stacked in this order from the floating gate electrode film 31 side toward the control gate electrode film 21 side. The silicon nitride layer 35 is formed so as to surround the floating gate electrode film 31. The silicon nitride layer 35 covers the upper surface 31a and the lower surface 31b of the floating gate electrode film 31. The silicon oxide layer 36 and the silicon nitride layer 37 are formed so as to surround the control gate electrode film 21. The silicon oxide layer 36 and the silicon nitride layer 37 cover the upper surface 21a and the lower surface 21b of the control gate electrode film 21.

The tunnel insulating film 33 is a film that is normally insulating. However, the tunnel insulating film 33 passes a tunnel current under application of voltage within the range of the driving voltage of the semiconductor memory device 1. The block insulating film 34 is a film passing substantially no current even under application of voltage within the range of the driving voltage of the semiconductor memory device 1. The electrical film thickness (equivalent oxide thickness, EOT) of the tunnel insulating film 33 is thicker than the electrical film thickness of the block insulating film 34. The permittivity of the tunnel insulating film 33 is lower than the permittivity of the block insulating film.

Thus, a memory cell transistor is formed for each crosspoint of the silicon pillar 20 and the control gate electrode film 21. The memory cell transistor includes the tunnel insulating film 33, the floating gate electrode film 31, and the block insulating film 34. As described above, the floating gate electrode film 31 is surrounded with an insulating film. The memory cell transistors are arranged in a three-dimensional matrix pattern along the X-direction, the Y-direction, and the Z-direction. The memory cell transistor is a transistor with the threshold changed by accumulation of charge in the floating gate electrode film 31. Thus, the memory cell transistor can store data.

Of the plurality of stages of memory cell transistors arranged along the Z-direction, one to several (e.g., four) stages of memory cell transistors from the top are used as upper select transistors. One to several (e.g., four) stages of memory cell transistors from the bottom are used as lower select transistors. The upper select transistor is used not to store data, but to select whether the bit line 29 is connected to the silicon pillar 20. Likewise, the lower select transistor is used to select whether the cell source line 15 is connected to the silicon pillar 20. The two control gate electrode films 21 forming the upper select transistors in conjunction with the two silicon pillars 20 belonging to a group 22 are pulled out to different nodes. Thus, the upper select transistors formed respectively by the two silicon pillars 20 belonging to the group 22 can be controlled independently.

Next, the peripheral circuit region Rc is described.

As shown in FIG. 2, in the peripheral circuit region Rc, a source region 40s and a drain region 40d are formed in the silicon substrate Sub with spacing from each other. The region between the source region 40s and the drain region 40d forms a channel region 40c. A gate insulating film 41 made of e.g. silicon oxide is provided on the silicon substrate Sub and directly above the channel region 40c. A conductive layer 42 made of e.g. polysilicon and an interconnect layer 43 made of e.g. tungsten are stacked in this order on the gate insulating film 41. The conductive layer 42 and the interconnect layer 43 form a gate electrode 45. The source region 40s, the drain region 40d, the channel region 40c, the gate insulating film 41, and the gate electrode 45 form a transistor 46. The transistor 46 forms a driving circuit.

The insulating film 11 in the memory cell region Rm and the gate insulating film 41 in the peripheral circuit region Rc are formed by dividing the same silicon oxide film. The conductive layer 12 in the memory cell region Rm and the conductive layer 42 in the peripheral circuit region Rc are formed by dividing the same polysilicon layer. The interconnect layer 13 in the memory cell region Rm and the interconnect layer 43 in the peripheral circuit region Rc are formed by dividing the same tungsten layer.

Next, the pullout region Rp is briefly described.

As shown in FIG. 1, both Y-direction end parts of the multilayer body 25 are processed into a staircase pattern. In each end part, a plurality of control gate electrode films 21 having an equal Z-direction position are bundled two by two, as described below. A contact 38 is provided on the end parts of each bundle of control gate electrode films 21. A word line 39 extending in the Y-direction is provided on the contact 38. In the Z-direction, the position of the word line 39 is equal to the position of the bit line 29. The word line 39 is connected to the control gate electrode film 21 through the contact 38. In FIG. 1, an upper select gate 21u and a step configured with the upper select gate 21u in the pullout region Rp described below are not shown. Next, a method for manufacturing a semiconductor memory device according to the embodiment is described.

Figure 5:
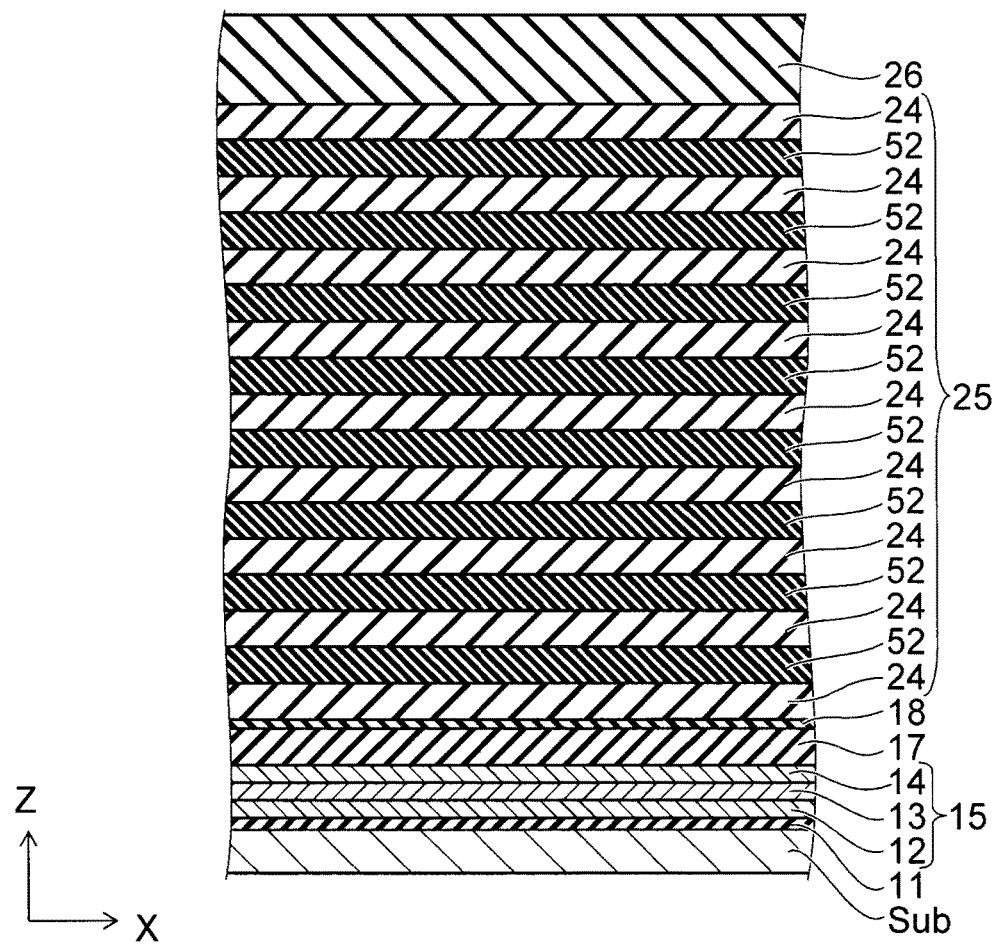
FIG. 5 is a sectional view showing a method for manufacturing a semiconductor memory device according to the first embodiment.

FIG. 5 is a sectional view showing a method for manufacturing a semiconductor memory device according to the embodiment.

Figure 6:
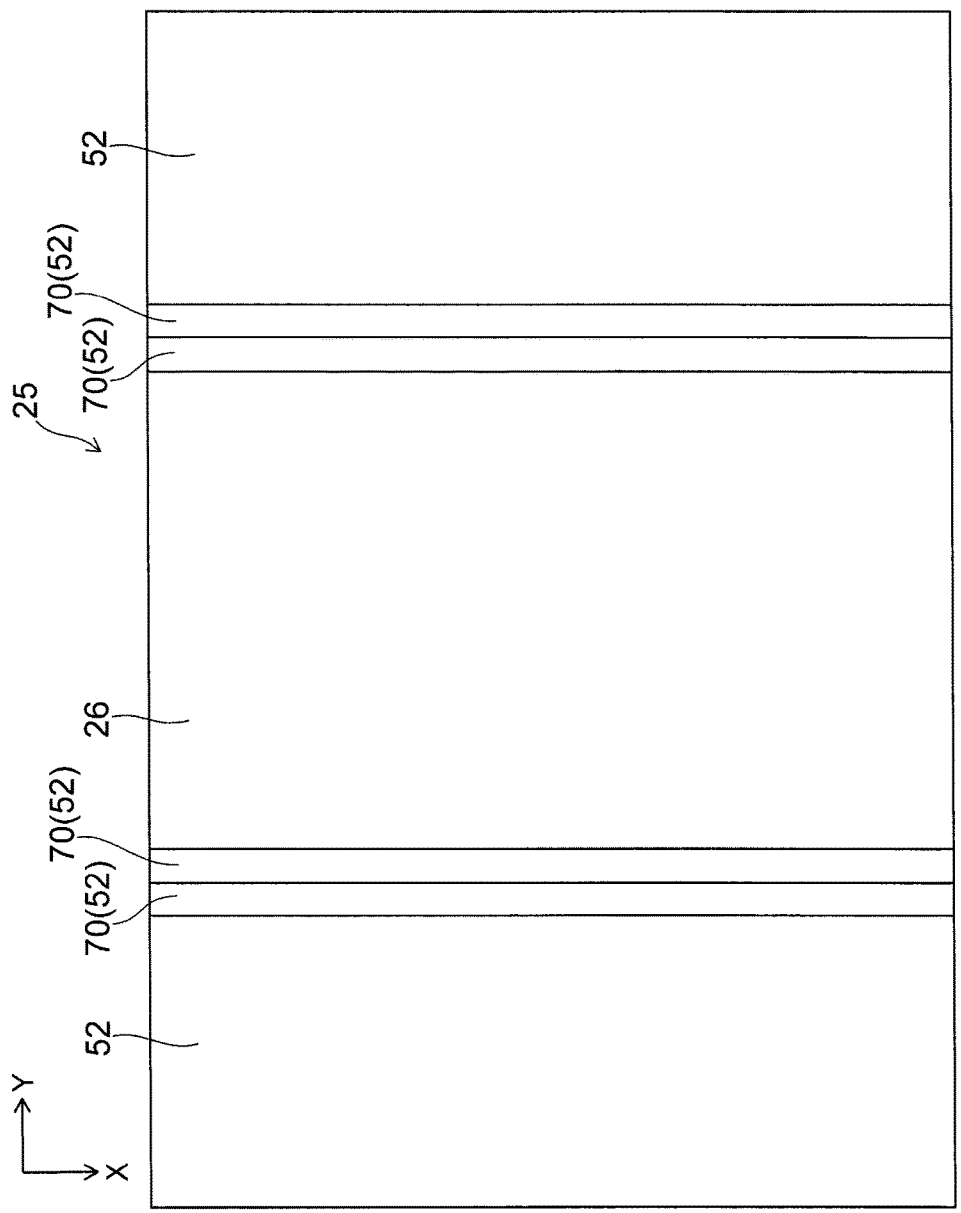
FIG. 6 is a plan view showing the method for manufacturing a semiconductor memory device according to the first embodiment.

FIG. 6 is a plan view showing the method for manufacturing a semiconductor memory device according to the embodiment.

Figure 7:
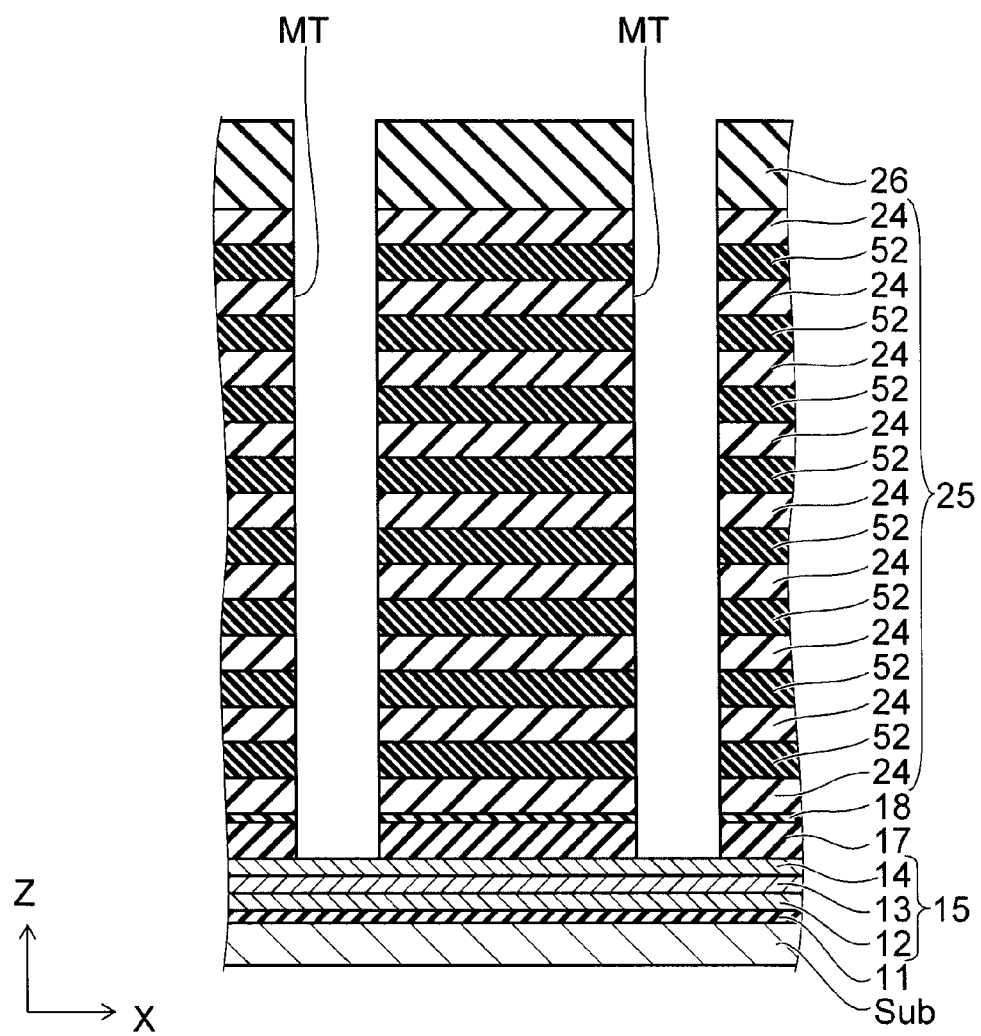
FIG. 7 is a sectional view showing the method for manufacturing a semiconductor memory device according to the first embodiment.

FIG. 7 is a sectional view showing the method for manufacturing a semiconductor memory device according to the embodiment.

Figure 8:
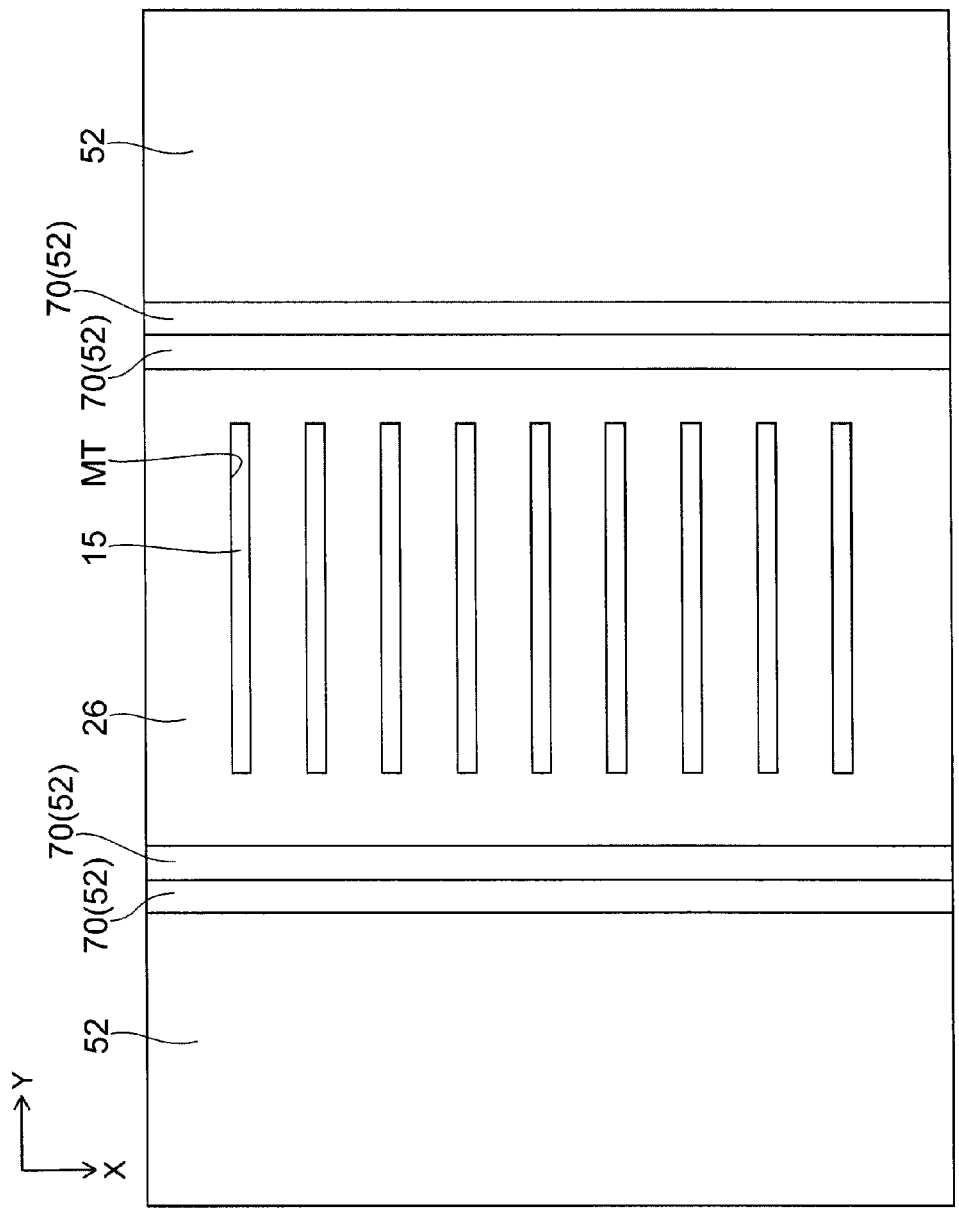
FIG. 8 is a plan view showing the method for manufacturing a semiconductor memory device according to the first embodiment.

FIG. 8 is a plan view showing the method for manufacturing a semiconductor memory device according to the embodiment.

Figure 9:
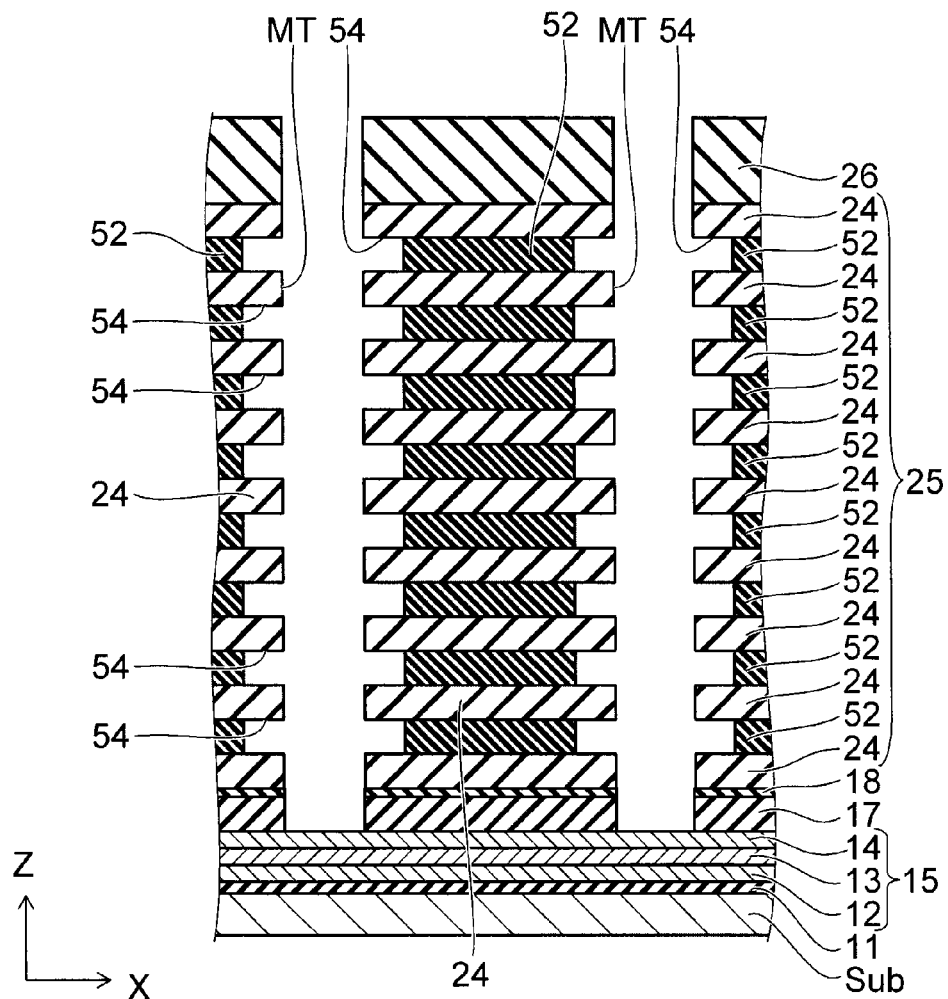
FIG. 9 to FIG. 11 are sectional views showing the method for manufacturing a semiconductor memory device according to the first embodiment.
Figure 10:
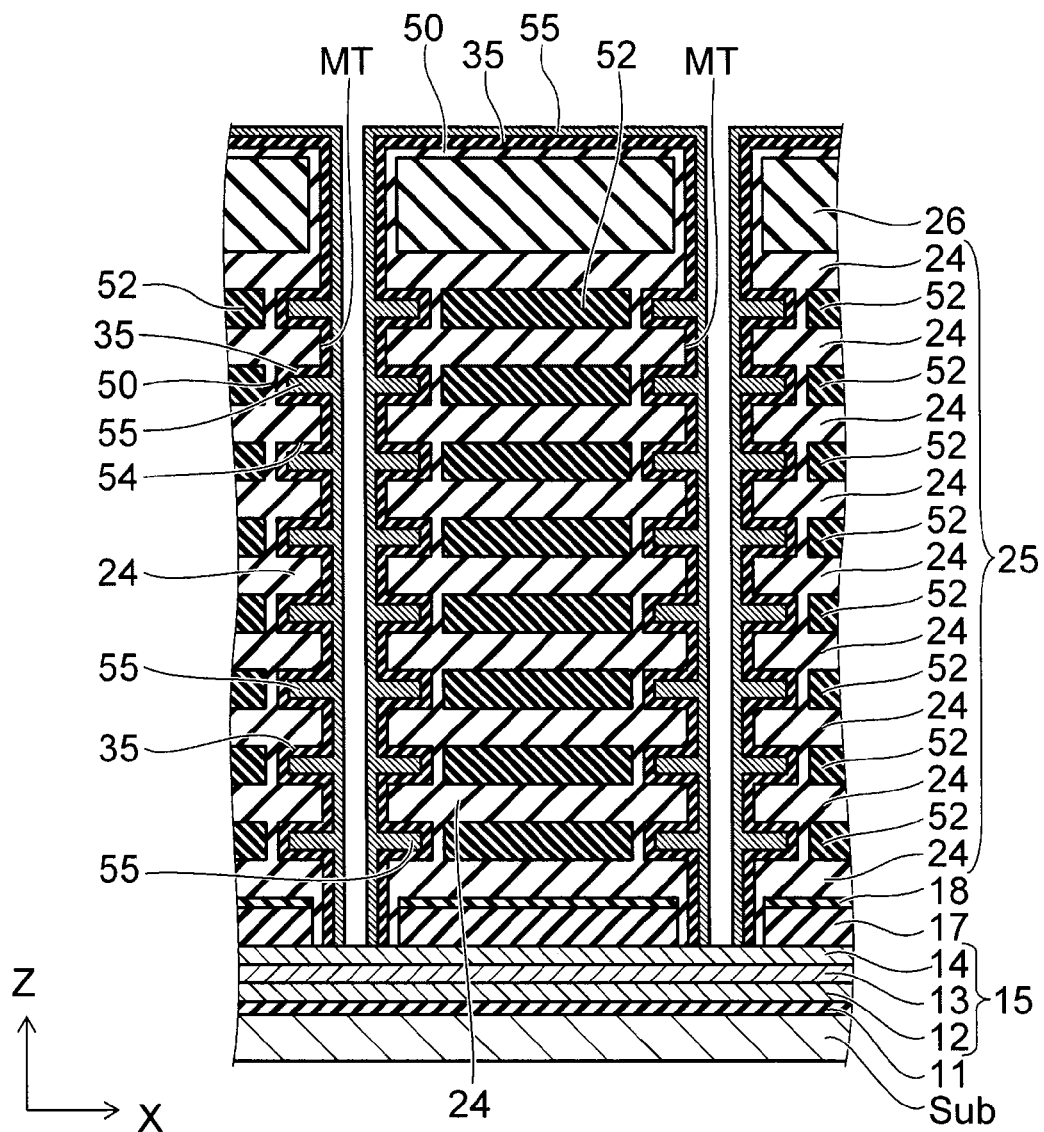
Figure 11:
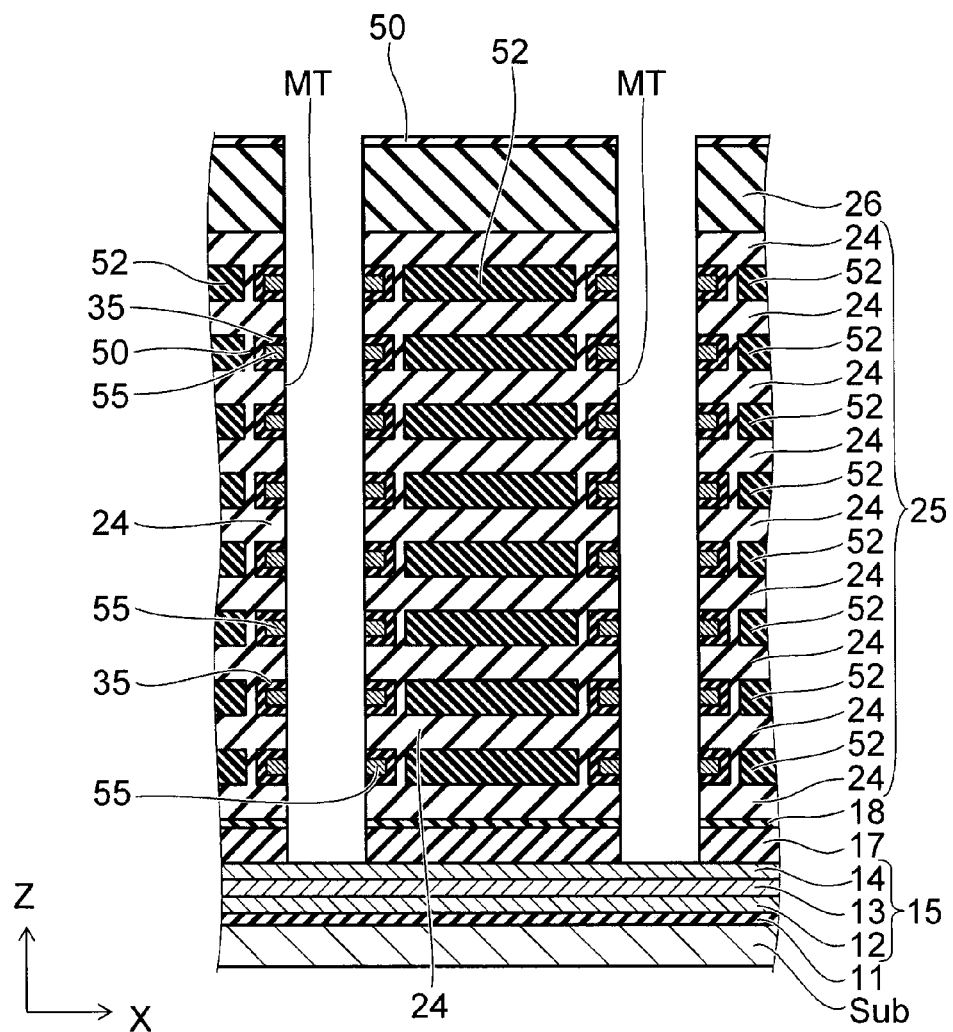

FIG. 9 to FIG. 11 are sectional views showing the method for manufacturing a semiconductor memory device according to the embodiment.

Figure 12:
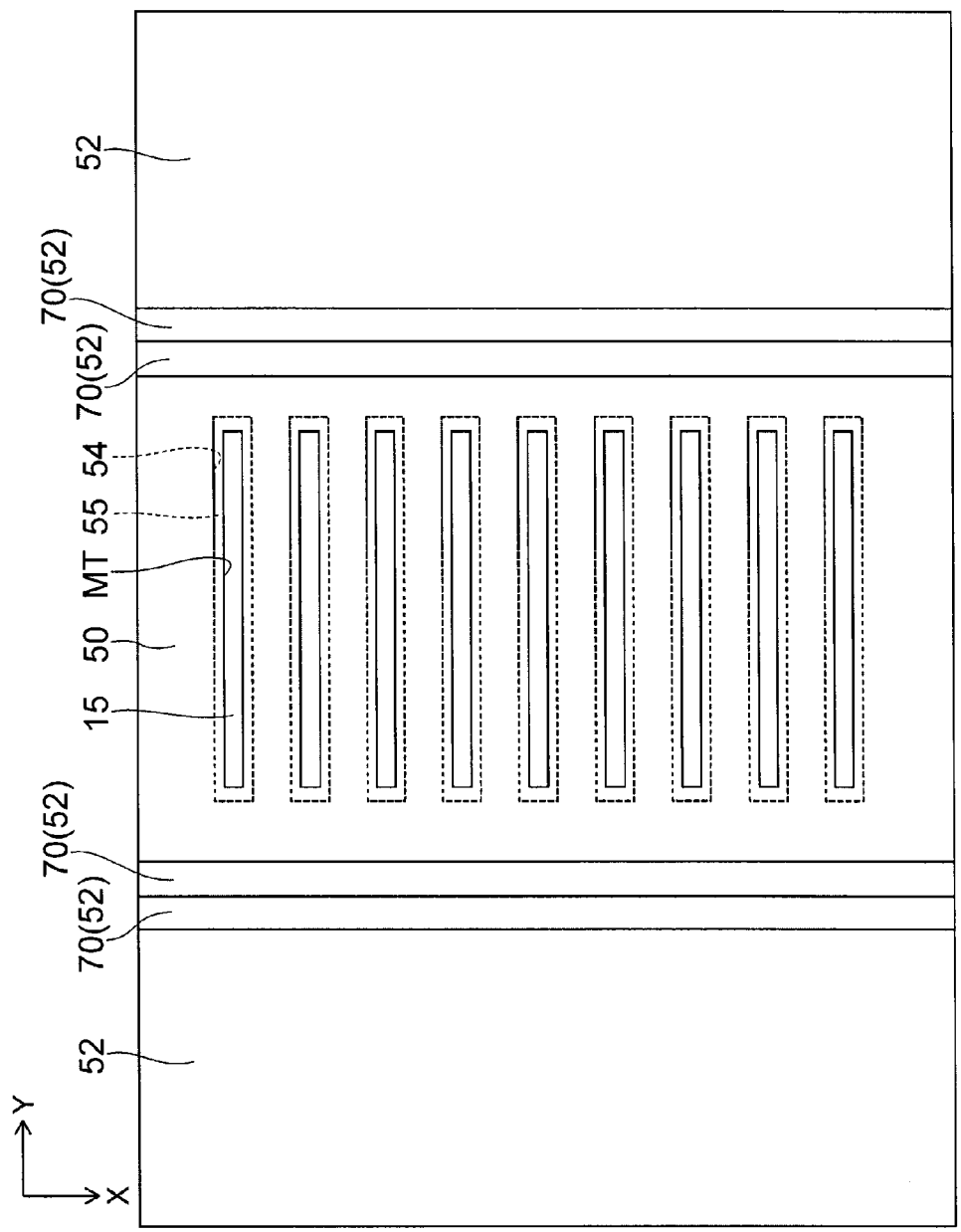
FIG. 12 is a plan view showing the method for manufacturing a semiconductor memory device according to the first embodiment.

FIG. 12 is a plan view showing the method for manufacturing a semiconductor memory device according to the embodiment.

FIG. 13 to FIG. 20 are sectional views showing the method for manufacturing a semiconductor memory device according to the embodiment.

FIG. 21 to FIG. 25 are plan views showing the method for manufacturing a semiconductor memory device according to the embodiment.

Figure 26A:
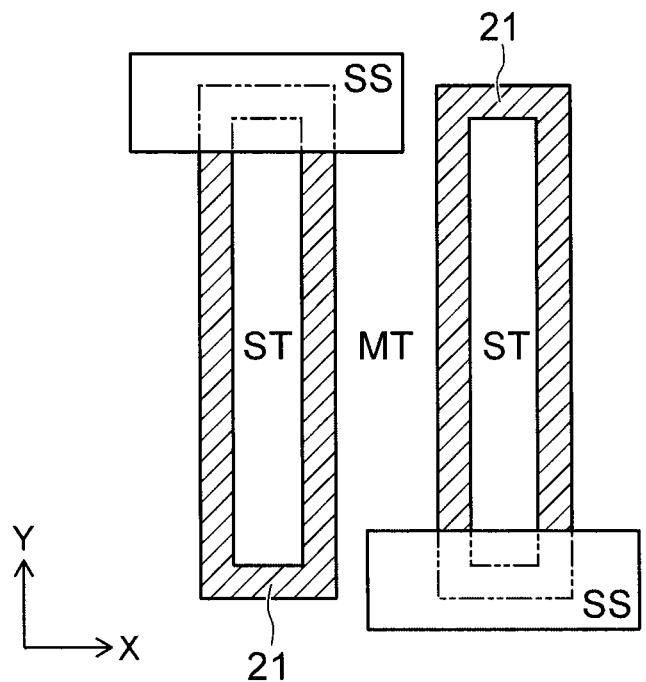
FIG. 26A is a plan view showing the relationship between the control gate electrode film and the slit in the first embodiment.
Figure 26B:
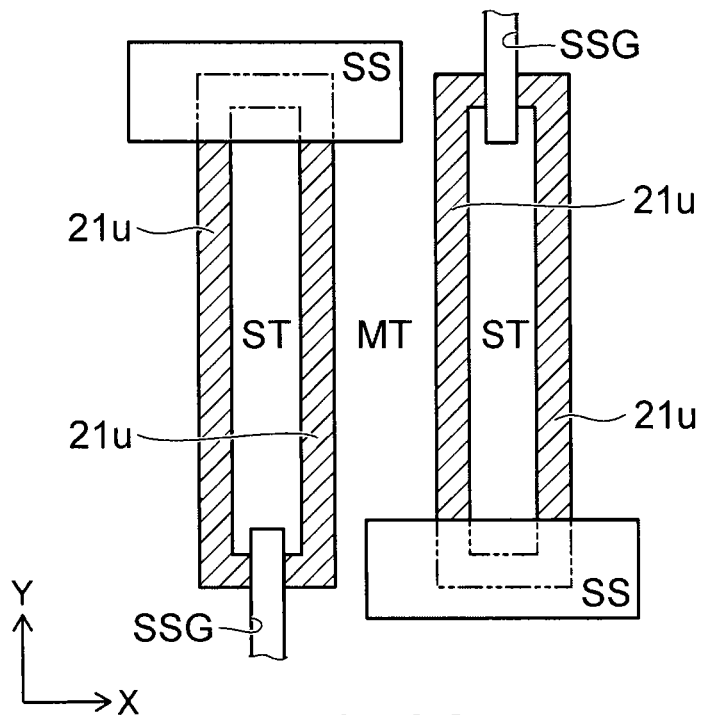
FIG. 26B is a plan view showing the relationship between an upper select gate 21u and the slit.

FIG. 26A is a plan view showing the relationship between the control gate electrode film and the slit in the embodiment. FIG. 26B is a plan view showing the relationship between the upper select gate 21u and the slit.

The above plan views schematically show only some of the members for clarity of illustration. This also applies to the other embodiments described later.

First, as shown in FIG. 2, in the peripheral circuit region Rc, part of the driving circuit such as a source region 40s and a drain region 40d is formed in the upper portion of a silicon substrate Sub.

Next, as shown in FIG. 5, an insulating film 11 made of silicon oxide, a conductive layer 12 made of polysilicon, an interconnect layer 13 made of tungsten, and a conductive layer 14 made of polysilicon are formed in this order on the silicon substrate Sub. These layers are patterned for each block by RIE (reactive ion etching). Thus, a cell source line 15 is formed for each block. On the other hand, in the peripheral circuit region Rc, the divided insulating film 11 forms a gate insulating film 41. The conductive layer 12 forms a conductive layer 42. The interconnect layer 13 forms an interconnect layer 43. The conductive layer 42 and the interconnect layer 43 form a gate electrode 45.

Next, an insulating film 17 made of e.g. silicon oxide is formed on the cell source line 15. A stopper film 18 made of e.g. silicon nitride is formed on the insulating film 17.

Next, interlayer insulating films 24 made of silicon oxide and polysilicon films 52 are alternately stacked on the stopper film 18. Thus, a multilayer body 25 is formed. At this time, the film thickness ratio of the interlayer insulating film 24 and the polysilicon film 52 is adjusted depending on the film thickness of the block insulating film 34 embedded on both sides. Next, a hard mask 26 made of e.g. silicon nitride is formed on the multilayer body 25.

Next, as shown in FIG. 6, both Y-direction end parts of the upper part of the multilayer body 25 are processed into a staircase pattern. More specifically, a step 70 is formed for each of one to several polysilicon films 52 from the top so that both Y-direction end parts of the polysilicon film 52 located at a lower stage are pulled out farther to the outside in the Y-direction. Alternatively, steps may be formed in a matrix pattern along the X-direction and the Y-direction.

Next, as shown in FIG. 7 and FIG. 8, the hard mask 26 is patterned in a line-and-space pattern by lithography technique. Next, the patterned hard mask 26 is used as a mask to perform anisotropic etching such as RIE on the multilayer body 25. Thus, a plurality of memory trenches MT are formed in the multilayer body 25. The longitudinal direction of the memory trench MT is the Y-direction. The memory trench MT penetrates through the multilayer body 25.

Next, as shown in FIG. 9, the polysilicon film 52 is recessed through the memory trench MT by isotropic etching such as wet etching. Thus, the exposed surface of the polysilicon film 52 is set back at the side surface of the memory trench MT to form a depression 54. The depression 54 is formed like a loop along the side surface of the memory trench MT.

Next, as shown in FIG. 10, a thin silicon oxide layer 50 is formed on the inner surface of the memory trench MT by oxidation processing. Next, a silicon nitride layer 35 is formed on the entire surface. Next, a polysilicon film 55 is formed on the entire surface. The silicon nitride layer 35 and the polysilicon film 55 are formed also on the inner side surface of the memory trench MT and extend into the depression 54.

Next, as shown in FIG. 11 and FIG. 12, anisotropic etching such as RIE is performed along the memory trench MT. Thus, the polysilicon film 55 and the silicon nitride layer 35 are selectively removed and left in the depression 54. The polysilicon films 55 and the silicon nitride layers 35 left in the depressions 54 adjacent in the Z-direction are divided from each other. As viewed in the Z-direction, the polysilicon film 55 and the silicon nitride layer 35 are formed like a loop along the side surface of the memory trench MT.

Figure 13:
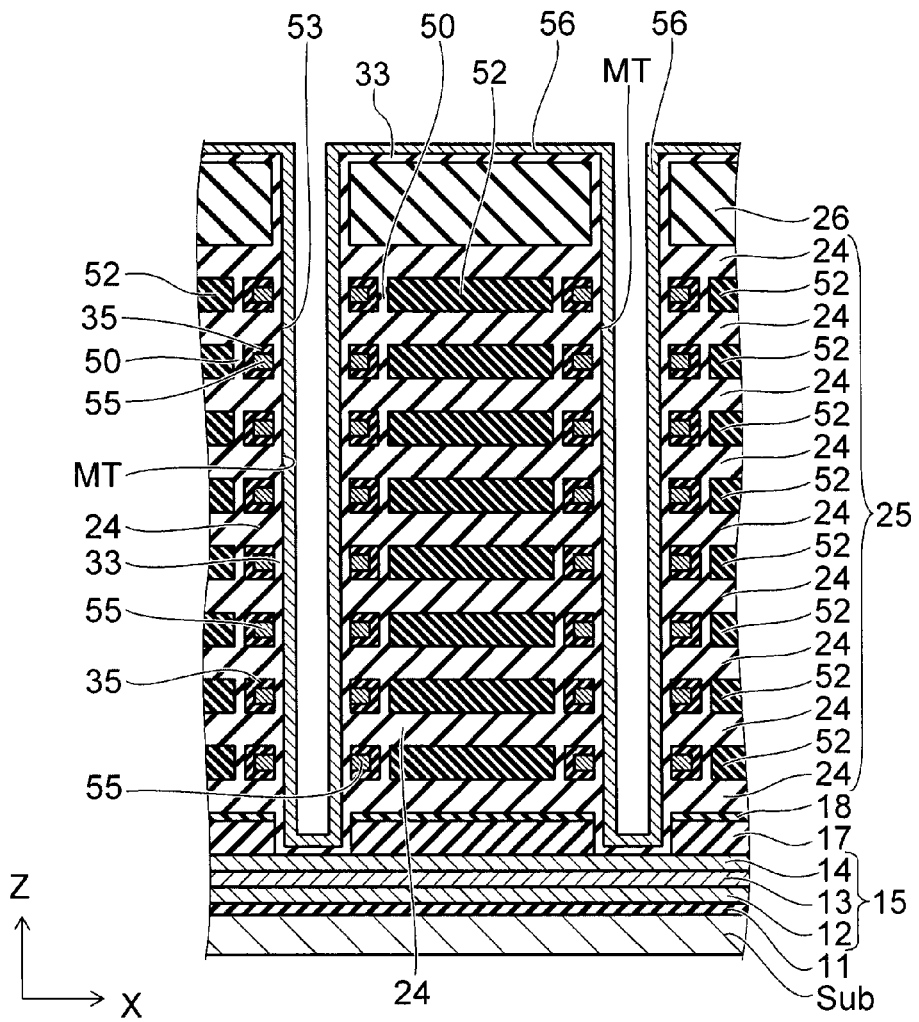
FIG. 13 to FIG. 20 are sectional views showing the method for manufacturing a semiconductor memory device according to the first embodiment.

Next, as shown in FIG. 13, a tunnel insulating film 33 and a polysilicon film 56 are deposited in this order.

Figure 14:
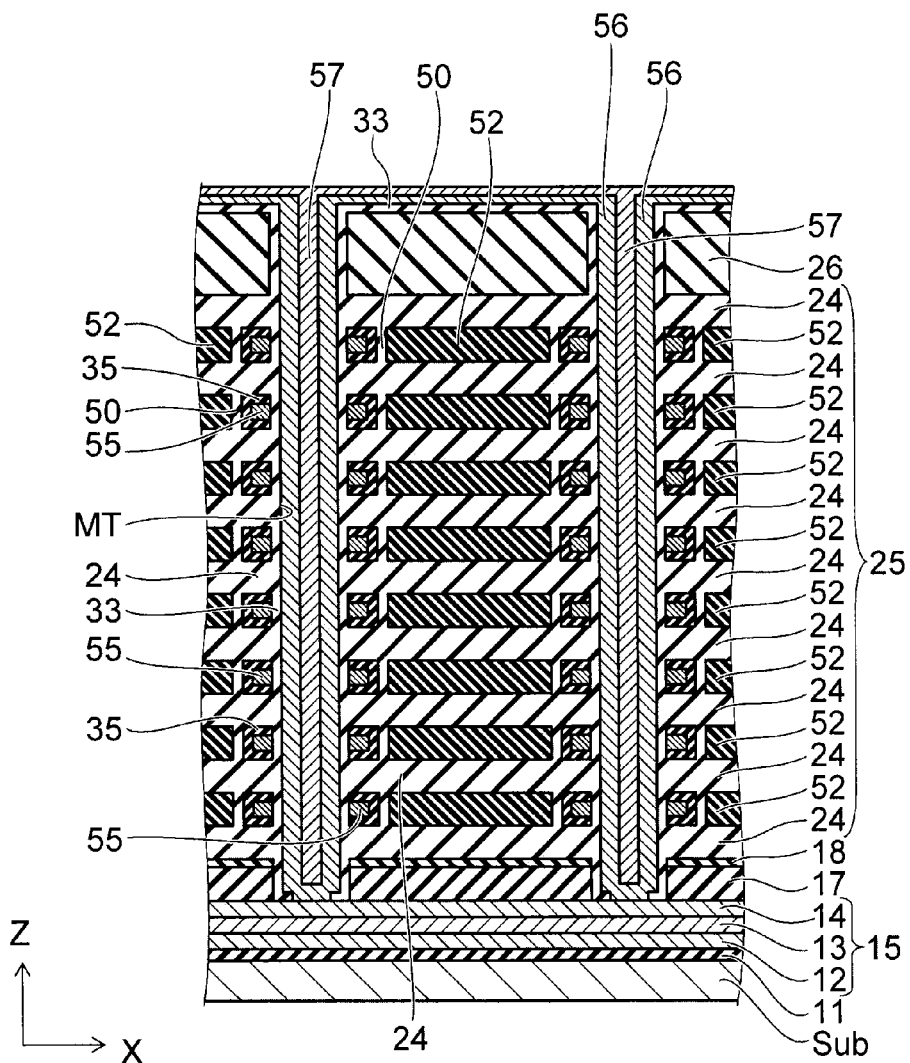

Next, as shown in FIG. 14, in the polysilicon film 56 and the tunnel insulating film 33, the portion formed on the upper surface of the hard mask 26 and the portion formed on the bottom surface of the memory trench MT are removed by RIE. Thus, the cell source line 15 is exposed at the bottom surface of the memory trench MT. Next, by depositing silicon, the polysilicon film 56 is thickened and brought into contact with the cell source line 15. Next, an amorphous silicon member 57 is embedded in the memory trench MT by depositing amorphous silicon doped with impurity. Thus, the memory trench MT is filled with the amorphous silicon member 57.

Figure 15:
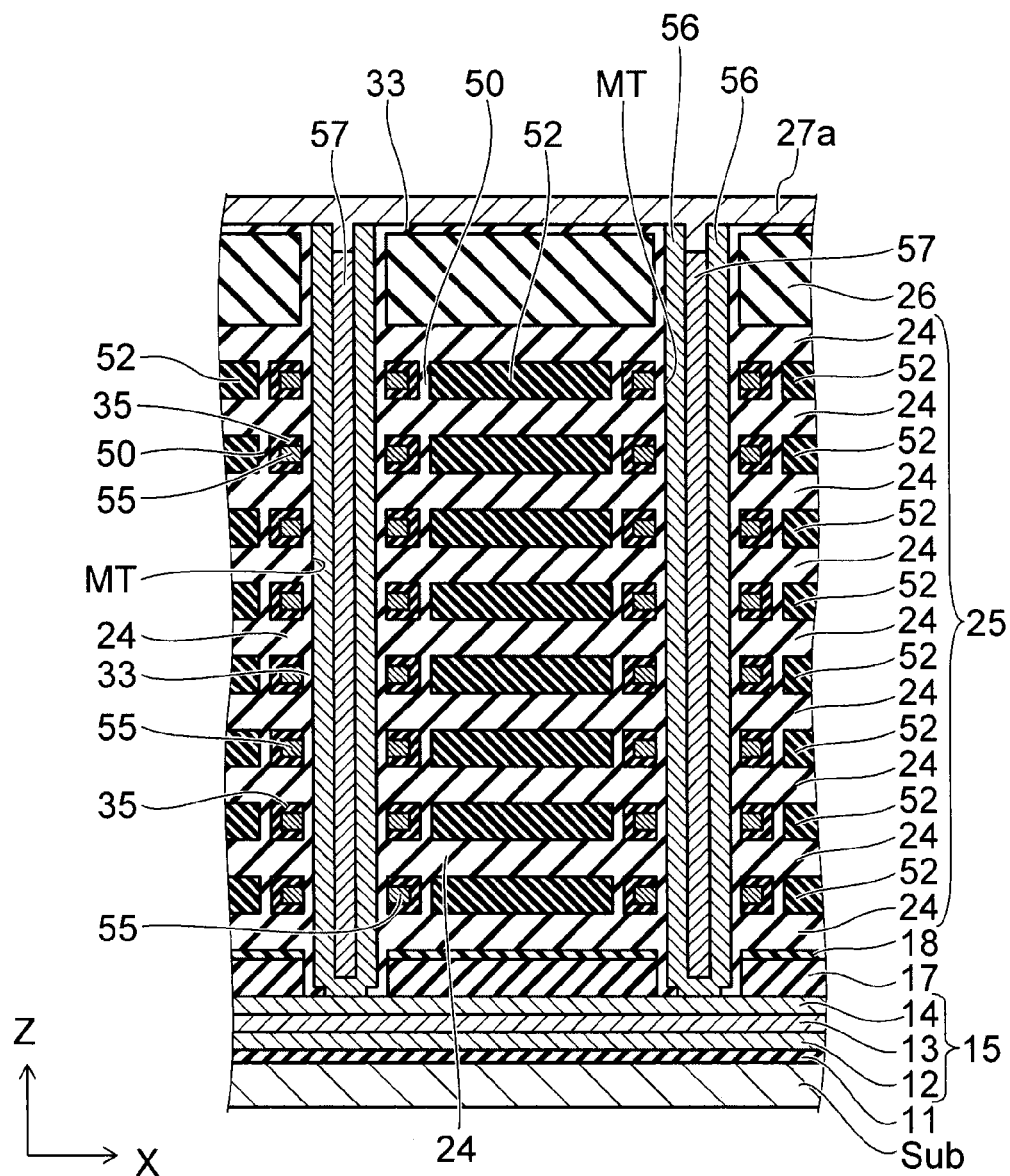

Next, as shown in FIG. 15, etch-back is performed under the condition such that the amorphous silicon member 57 is preferentially etched relative to the polysilicon film 56. Thus, the upper surface of the amorphous silicon member 57 is set back. Accordingly, the upper surface of the amorphous silicon member 57 is located below the upper surface of the hard mask 26. Furthermore, the portion of the polysilicon film 56 formed on the upper surface of the hard mask 26 is also removed. Thus, the polysilicon film 56 is divided for each memory trench MT. Next, a polysilicon film 27a is formed on the entire surface.

Figure 16:
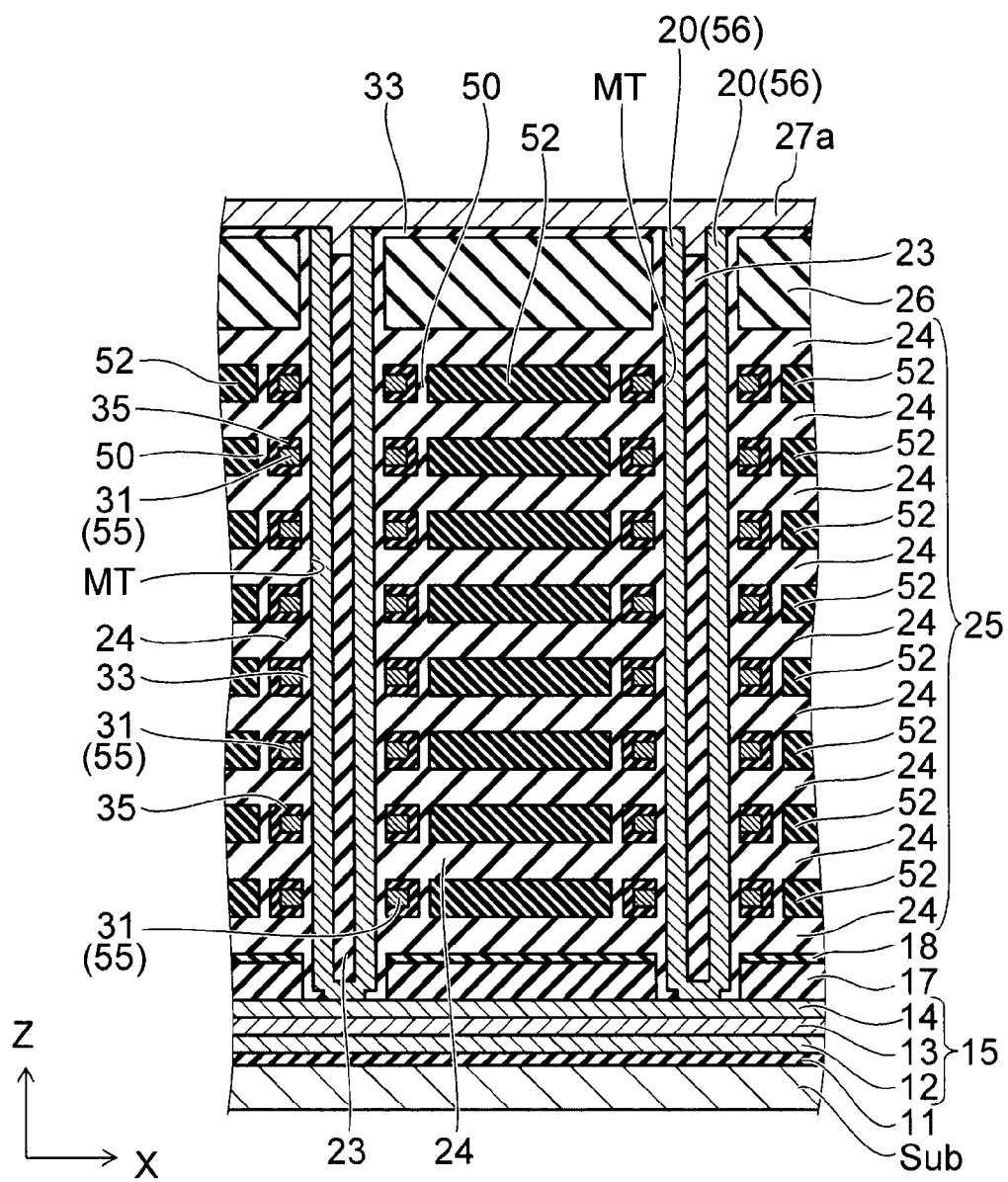

Next, as shown in FIG. 16, RIE is performed using a mask (not shown) having a line-and-space pattern extending in the X-direction. Thus, the polysilicon film 27a is selectively removed and processed into a line extending in the X-direction. Furthermore, the polysilicon film 55, the tunnel insulating film 33, the polysilicon film 56, and the amorphous silicon member 57 are selectively removed to form holes (not shown) reaching the cell source line 15. As viewed in the Z-direction, these holes are arranged in a matrix pattern along the X-direction and the Y-direction. In FIG. 16, these holes are formed behind and before the page. Thus, the polysilicon film 55 is divided along the Y-direction to form a floating gate electrode film 31. The polysilicon film 56 is also divided along the Y-direction to form a silicon pillar 20.

Next, the residual portion of the amorphous silicon member 57 (see FIG. 15) is removed through the hole by wet etching. In FIG. 16, it is removed from behind and before the page. Next, by depositing silicon oxide, an interlayer insulating film 23 is embedded in the space formed by the removal of the amorphous silicon member 57 and in the hole. In FIG. 16, the amorphous silicon member 57 is removed, and the interlayer insulating film 23 is embedded, from behind and before the page.

Figure 17:
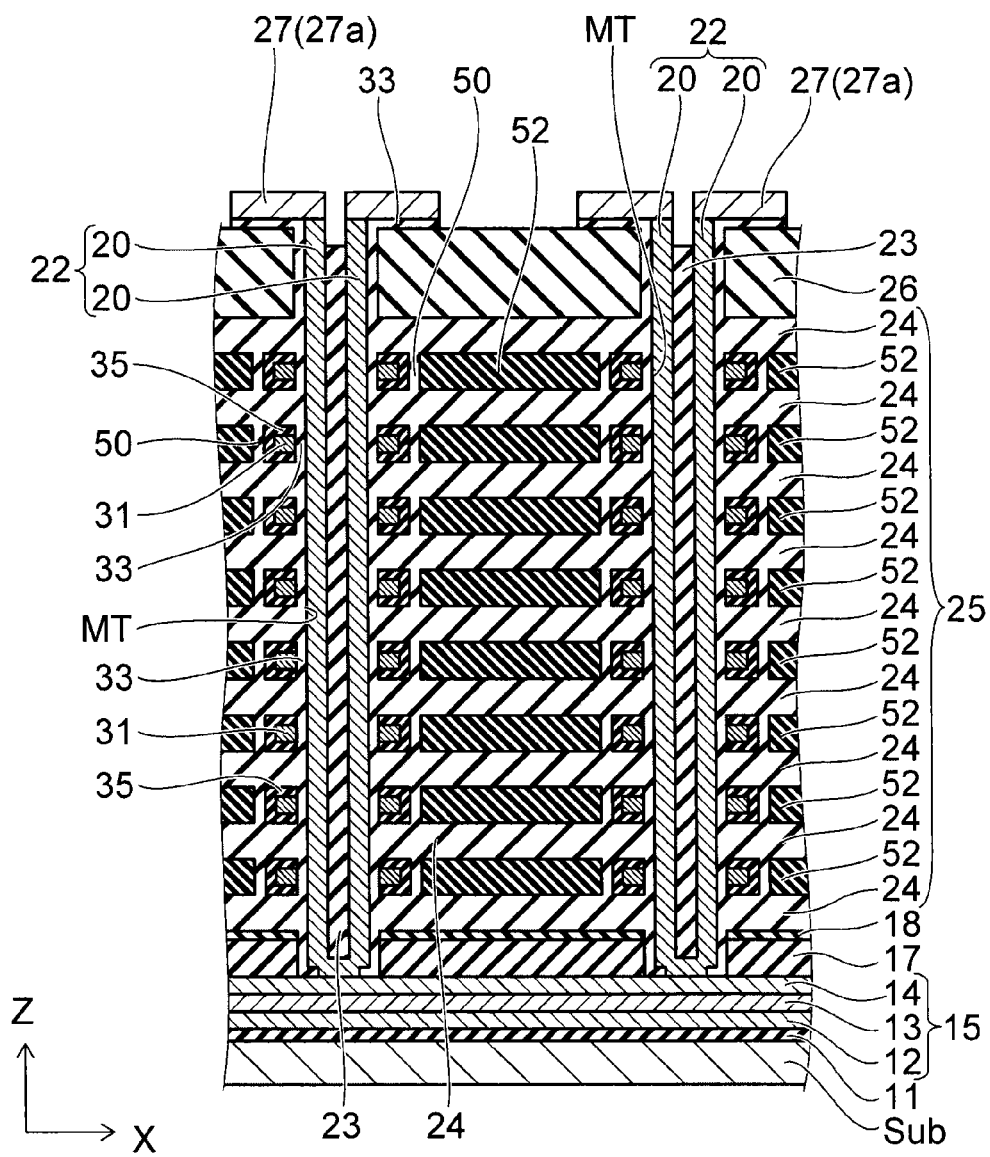

Next, as shown in FIG. 17, the polysilicon film 27a is divided along the X-direction by lithography technique and RIE technique. Thus, the polysilicon film 27a is cut for each silicon pillar 20. As a result, the polysilicon film 27a is divided in both the X-direction and the Y-direction to form a plurality of interconnects 27 arranged in a matrix pattern.

Figure 18:
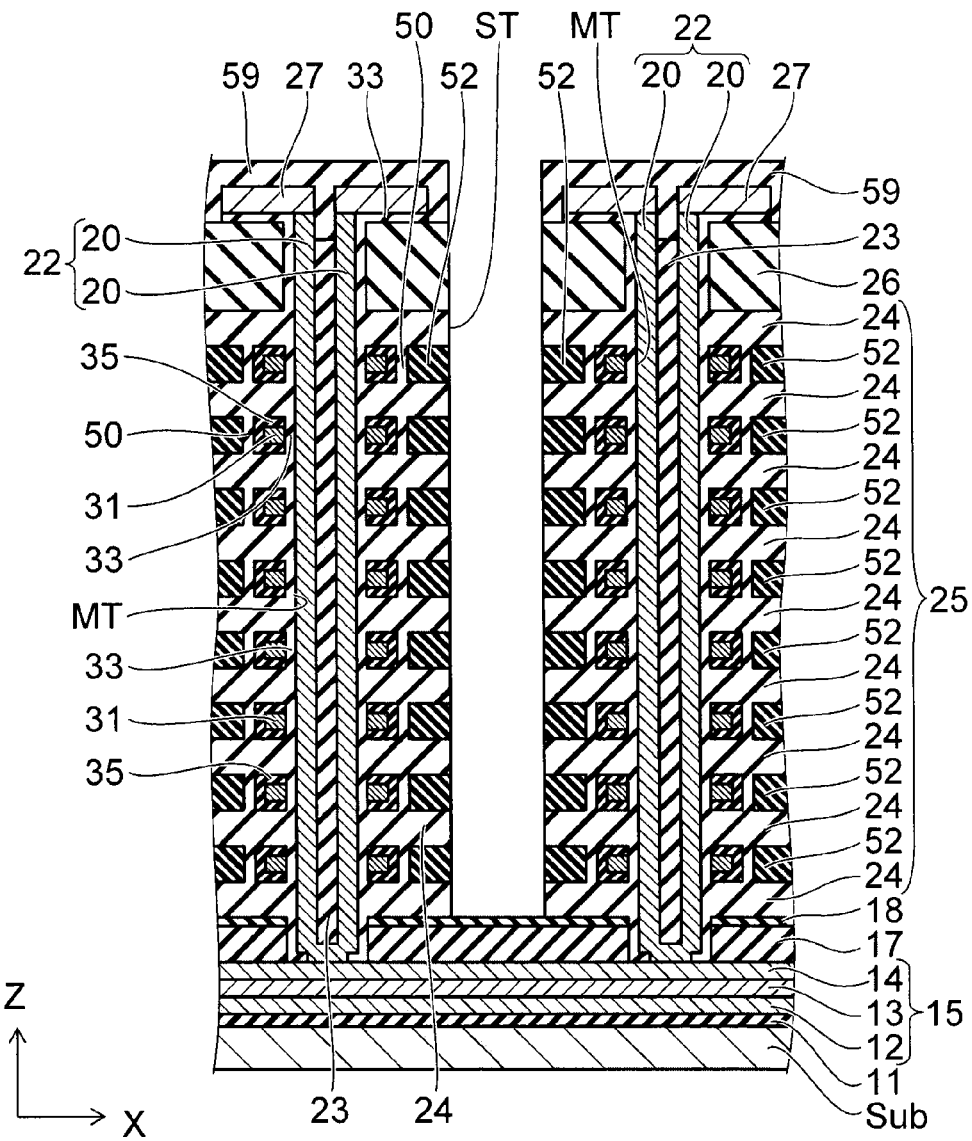

Next, as shown in FIG. 18, a hard mask 59 is formed on the hard mask 26 so as to embed the interconnect 27. Next, a mask (not shown) is formed by lithography technique. The mask includes a plurality of openings with the longitudinal direction being the Y-direction. Next, this mask is used to perform RIE with the stopper film 18 used as a stopper. Thus, a slit ST is formed in the portion of the multilayer body 25, the hard mask 26, and the hard mask 59 between the memory trenches MT. The longitudinal direction of the slit ST is the Y-direction. The memory trenches MT and the slits ST are alternately arranged along the X-direction. In the Y-direction, the length of the slit ST is equal to the length of the memory trench MT. Both longitudinal end parts of the slit ST are located at the same position as both longitudinal end parts of the memory trench MT.

Figure 19:
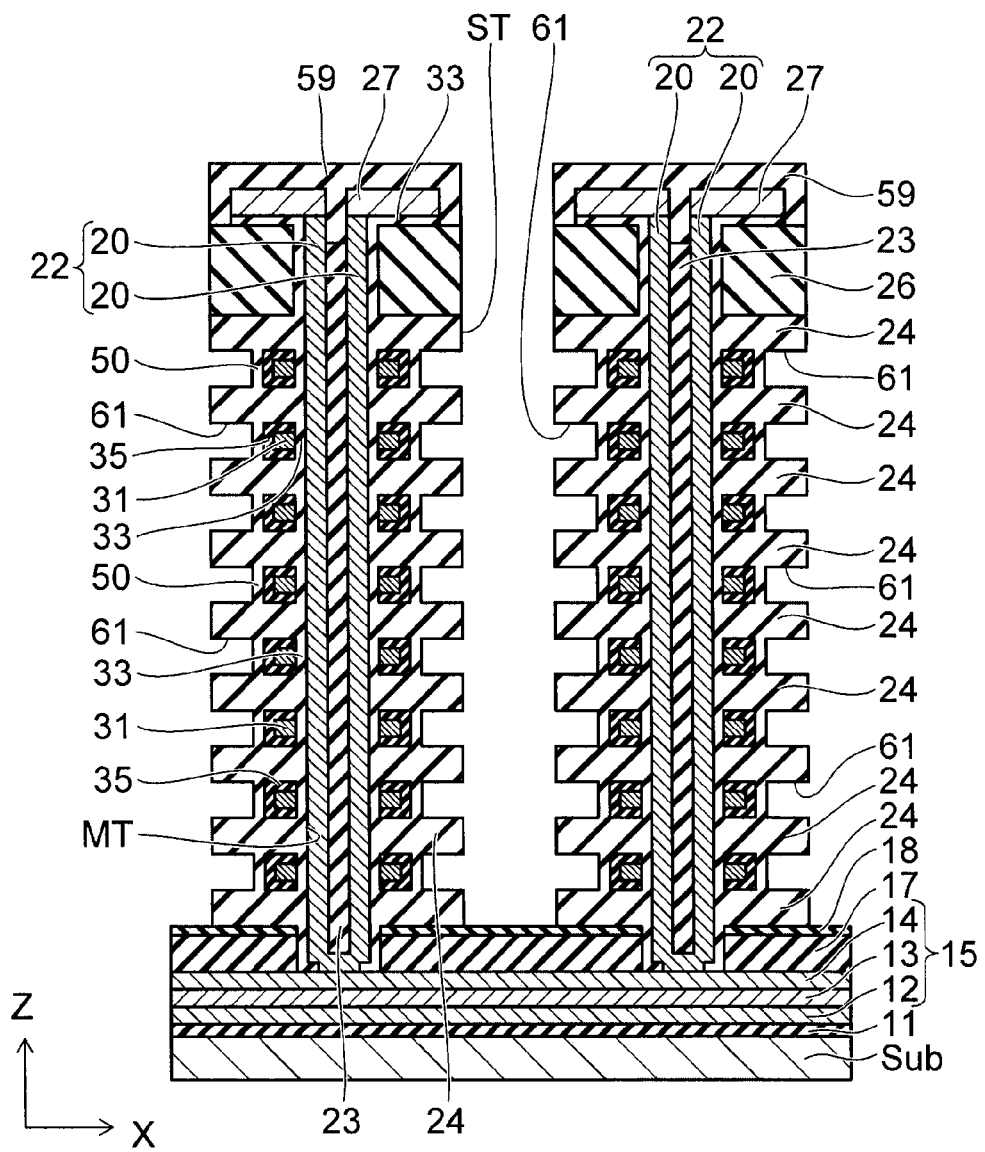

Next, as shown in FIG. 19, the polysilicon film 52 is removed through the slit ST by e.g. wet etching. Thus, a depression 61 is formed at the side surface of the slit ST. This etching is stopped by the silicon oxide layer 50 exposed at the rear surface of the depression 61. The silicon nitride layer 35 is not damaged because it is protected by the silicon oxide layer 50. As viewed in the Z-direction, the depression 61 formed like a loop along the side surface of the slit ST.

Figure 20:
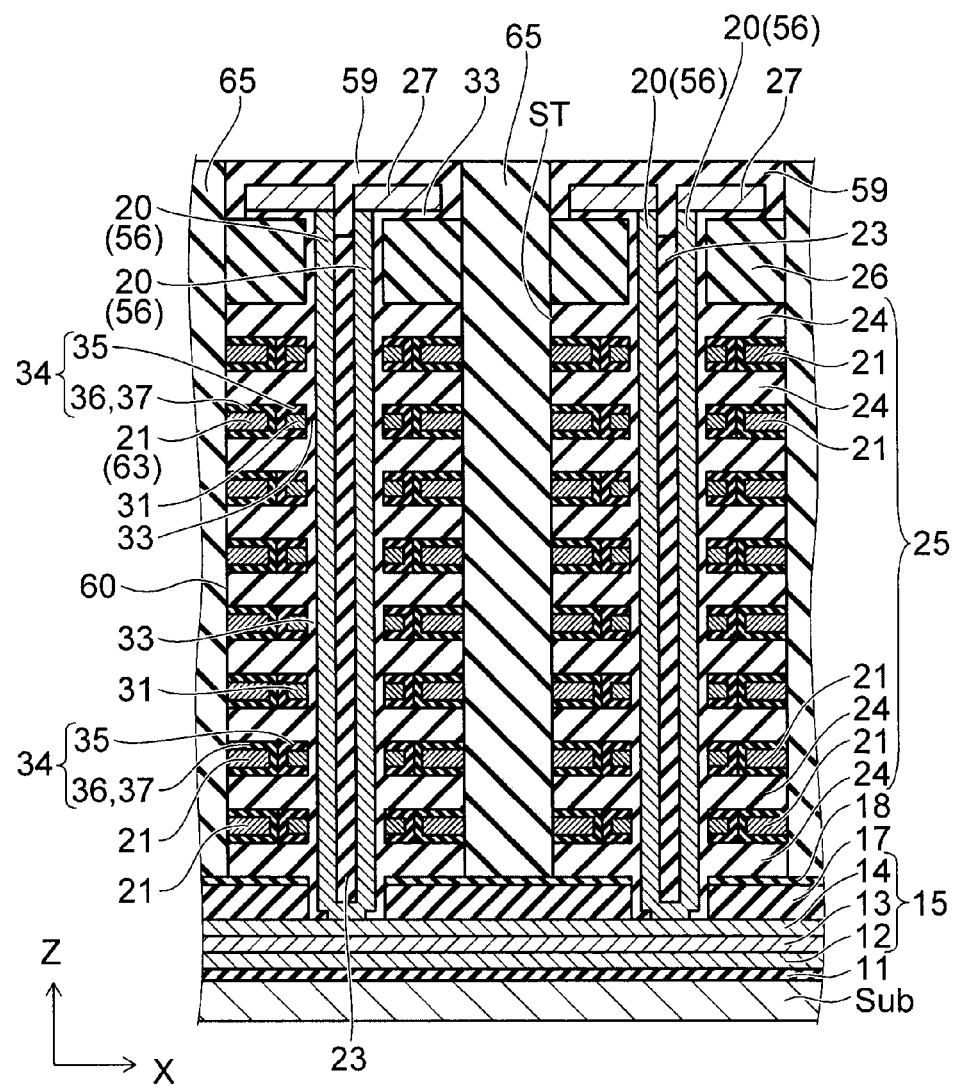
Figure 21:
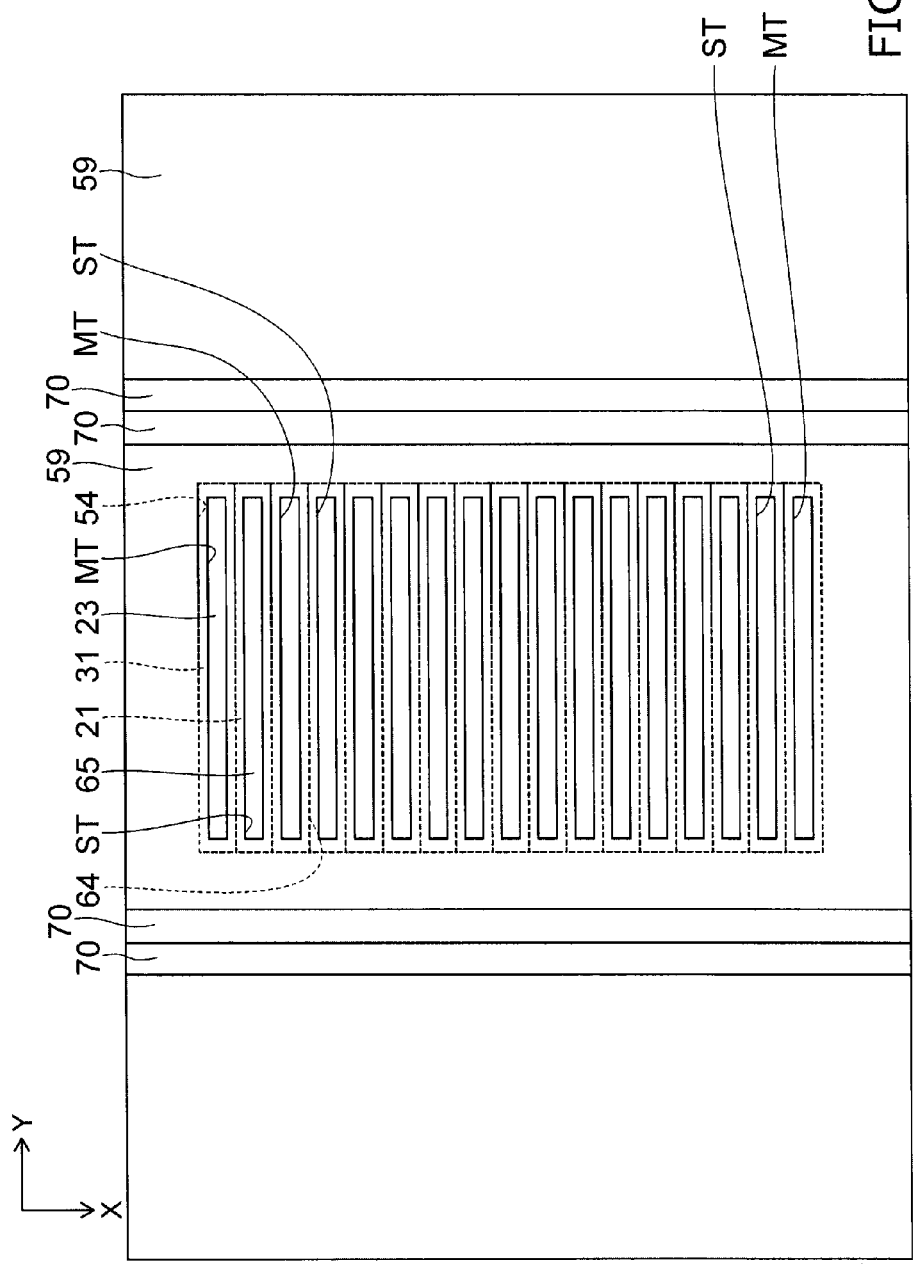
FIG. 21 to FIG. 25 are plan views showing the method for manufacturing a semiconductor memory device according to the first embodiment.

Next, as shown in FIG. 20 and FIG. 21, the silicon oxide layer 50 (see FIG. 19) exposed at the rear surface of the depression 61 is removed. Thus, the silicon nitride layer 35 is exposed at the rear surface of the depression 61. Next, a silicon oxide layer 36 and a silicon nitride layer 37 are formed on the inner surface of the slit ST. As a result, as shown in FIG. 3, the silicon nitride layer 35, the silicon oxide layer 36, and the silicon nitride layer 37 form a block insulating film 34. In FIG. 20, the silicon oxide layer 36 and the silicon nitride layer 37 are shown as a single insulating layer. The floating gate electrode film 31 is shown as being divided along the Y-direction. However, in FIG. 21, it is shown as a region shaped like a continuous loop. This also applies to the subsequent similar plan views.

In this phase, the inner surface of the depression 61 is covered with the block insulating film 34 also in both longitudinal end parts of the slit ST. Thus, even if a tungsten film 63 is formed so as to embed the depression 61 in the next process step, no electrical connection can be formed with the polysilicon film 52 of the pullout region Rp. Accordingly, a photoresist pattern exposing both end parts of the slit ST and covering the other region is formed. This photoresist pattern is used as a mask to perform wet etching or dry etching. Thus, the block insulating film 34 is removed from above the inner surface of the depression 61 in both end parts of the slit ST.

Next, a tungsten film 63 is formed on the entire surface by e.g. CVD (chemical vapor deposition) technique. The tungsten film 63 extends also into the depression 61 through the slit ST. The tungsten film 63 is insulated from the floating gate electrode film 31 by the block insulating film 34. However, the tungsten film 63 is connected to the polysilicon film 52 in both end parts of the slit ST.

Next, in the tungsten film 63, the silicon nitride layer 37, and the silicon oxide layer 36, the portion deposited outside the depression 61 is removed by anisotropic etching such as RIE. Thus, the tungsten film 63, the silicon nitride layer 37, and the silicon oxide layer 36 are left in the depression 61. Furthermore, the tungsten films 63 left in the depressions 61 adjacent in the Z-direction are divided from each other. As a result, a control gate electrode film 21 made of the tungsten film 63 is formed in the depression 61. At this time, the control gate electrode film 21 is formed like a loop along the side surface of the slit ST. In both longitudinal end parts of the slit ST, the control gate electrode film 21 is connected to the polysilicon film 52. In the following description, the polysilicon film 52 of the pullout region Rp is also described as part of the "control gate electrode film 21". Then, an interlayer insulating film 65 is embedded in the slit ST, and the upper surface is planarized.

Figure 22:
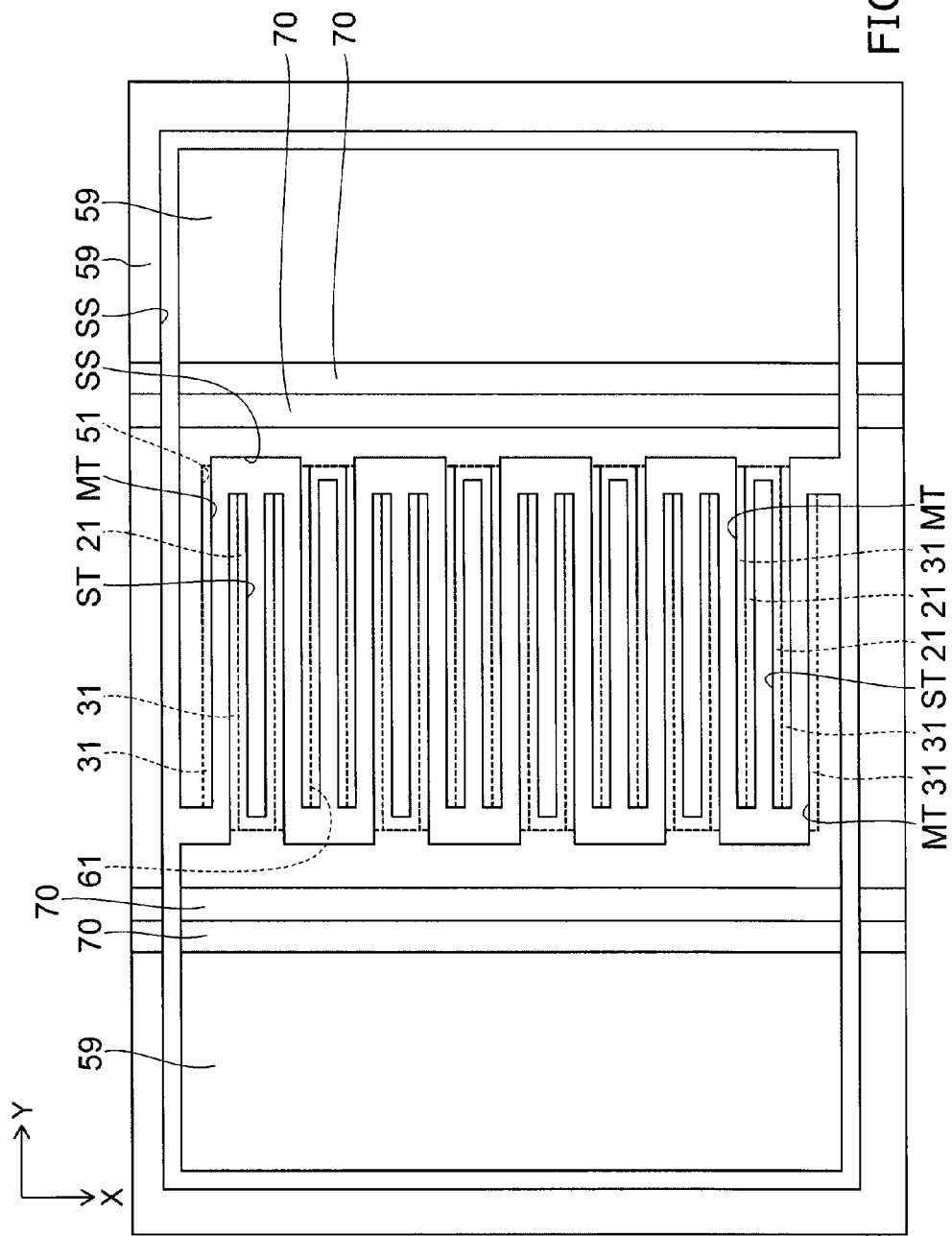

Next, as shown in FIG. 22, a slit SS penetrating through the multilayer body 25 is formed by anisotropic etching such as RIE. The slit SS includes a plurality of rectangular portions with the longitudinal direction being the X-direction, and a frame portion surrounding each block. The plurality of rectangular portions are alternately disposed on both Y-direction sides of the slit ST. Each rectangular portion is linked with one Y-direction end part of each of two adjacent memory trenches MT. In this case, the longitudinal central part of each rectangular portion is linked also to one Y-direction end part of the slit ST. Thus, one Y-direction end part of the loop-shaped control gate electrode film 21 surrounding the slit ST is removed. In the two loop-shaped control gate electrode films 21 surrounding adjacent slits ST, end parts on mutually different sides in the Y-direction are cut.

Thus, the loop of the control gate electrode film 21 surrounding the slit ST is cut at one site. As viewed in the Z-direction, the control gate electrode film 21 is U-shaped. Furthermore, the frame portion of the slit SS partitions the control gate electrode film 21 for each block. Inside the block, two control gate electrode films 21 disposed on both sides in the width direction (X-direction) of the memory trench MT are electrically isolated from each other. In other words, two control gate electrode films 21 disposed on both sides in the width direction (X-direction) of each slit ST and extending linearly in the Y-direction are short-circuited with each other. The connecting portion in which two control gate electrode films 21 are connected to each other is located between the silicon pillars 20. Then, an insulating material such as silicon oxide is embedded in the slit SS.

Figure 23:
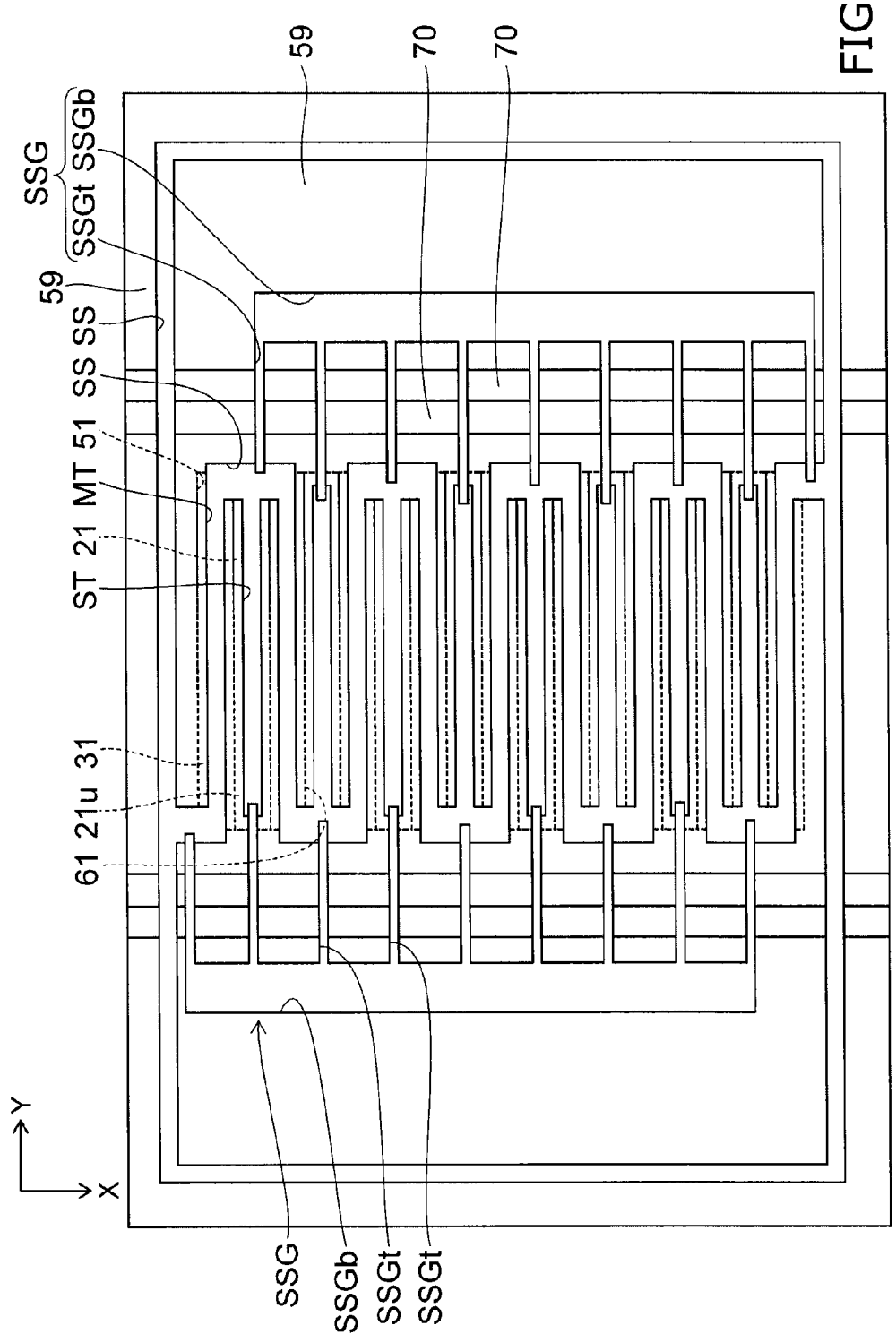

Next, as shown in FIG. 23, a slit SSG is formed in the region on both Y-direction sides of the memory trench MT and the slit ST by anisotropic etching such as RIE. The slit SSG is formed in the upper part of the multilayer body 25, and not formed in its lower part. Thus, of the plurality of control gate electrode films 21 stacked in the Z-direction, only one or more (e.g., four) control gate electrode films 21 forming the gate electrode of the upper select transistor are cut by the slit SSG. In the following, this control gate electrode film 21 forming the gate electrode of the upper select transistor is also referred to as "upper select gate 21u". On the other hand, the control gate electrode films 21 located in the lower part of the multilayer body 25 and forming the gate electrode of the memory cell transistor and the lower select transistor are not cut by the slit SSG.

The slit SSG includes two comb-shaped portions. Each comb-shaped portion includes one base part SSGb and a plurality of tooth parts SSGt. The base part SSGb has a linear shape extending in the X-direction. The tooth part SSGt has a linear shape pulled out from the base part SSGb in the Y-direction. In each comb-shaped portion, the tooth part SSGt is formed for each slit ST. The tip of the tooth part SSGt is extended to the silt ST. Thus, of the Y-direction end parts of the upper select gate 21u surrounding the slit ST, the end part not cut by the slit SS is cut by the tooth part SSGt of the slit SSG. That is, the upper select gate 21u originally shaped like a loop is processed into generally linear portions extending in the Y-direction by being cut at two sites by the slit SS and the tooth part SSGt. Thus, the upper select gate 21u is divided for each row of silicon pillars 20 arranged along the Y-direction. On the other hand, the control gate electrode films 21 other than the upper select gate 21u are not cut by the slit SSG. Thus, two control gate electrode films 21 sandwiching the slit ST remain short-circuited with each other. Then, an insulating material such as silicon oxide is embedded in the slit SSG.

Next, both Y-direction end parts of the portion except the upper part of the multilayer body 25 are processed into a staircase pattern. More specifically, a step 70 is formed for each control gate electrode film 21 so that both Y-direction end parts of the control gate electrode film 21 located at a lower stage are pulled out farther to the outside in the Y-direction. Alternatively, steps may be formed in a matrix pattern along the X-direction and the Y-direction. Here, FIG. 23 shows only the steps 70 formed corresponding to the upper select gate 21u.

Figure 24:
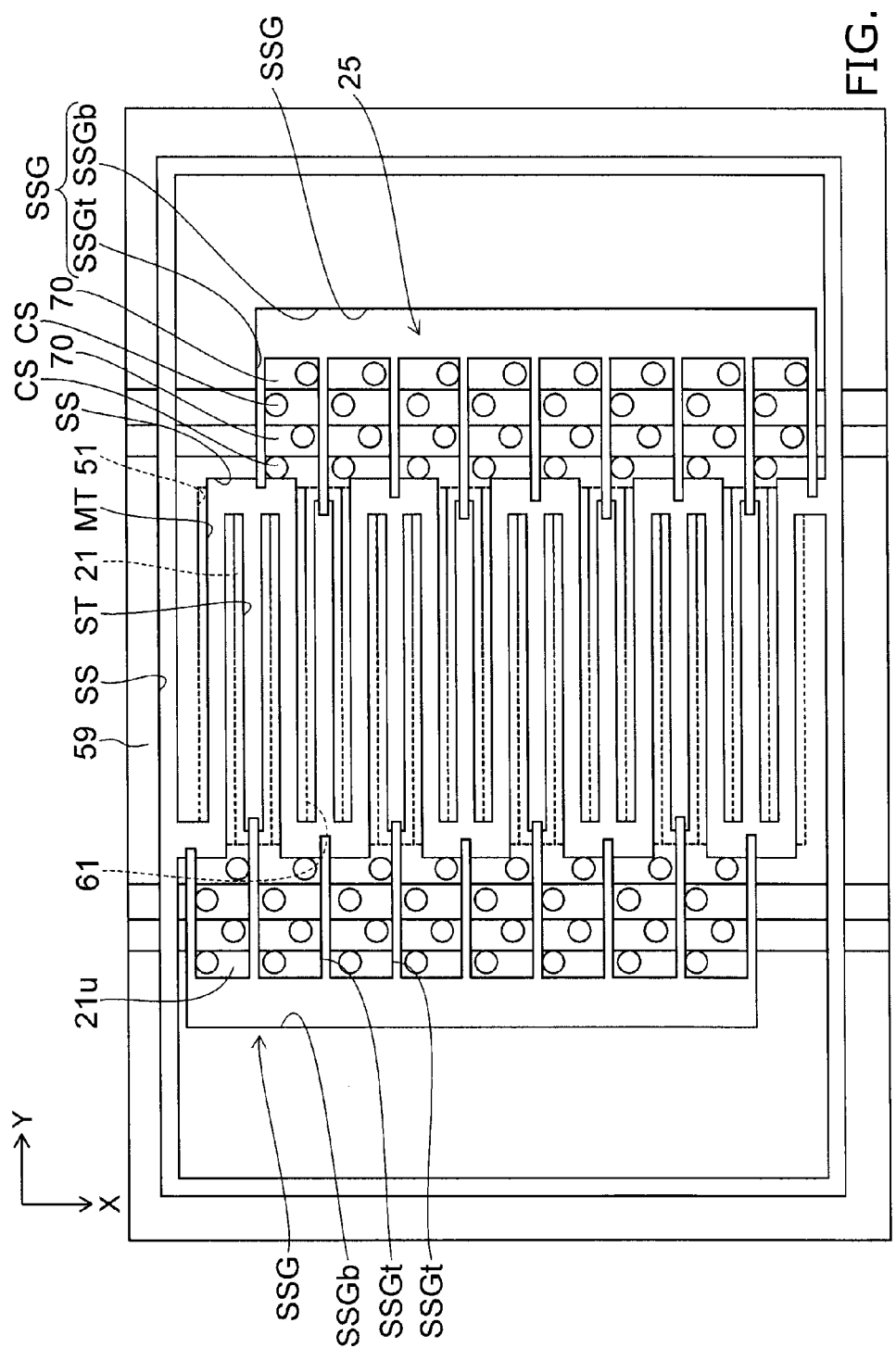

Next, as shown in FIG. 24, an upper select contact CS is formed for each step 70 corresponding to the upper select gate 21u. Each upper select contact CS is connected to the corresponding upper select gate 21u.

Figure 25:
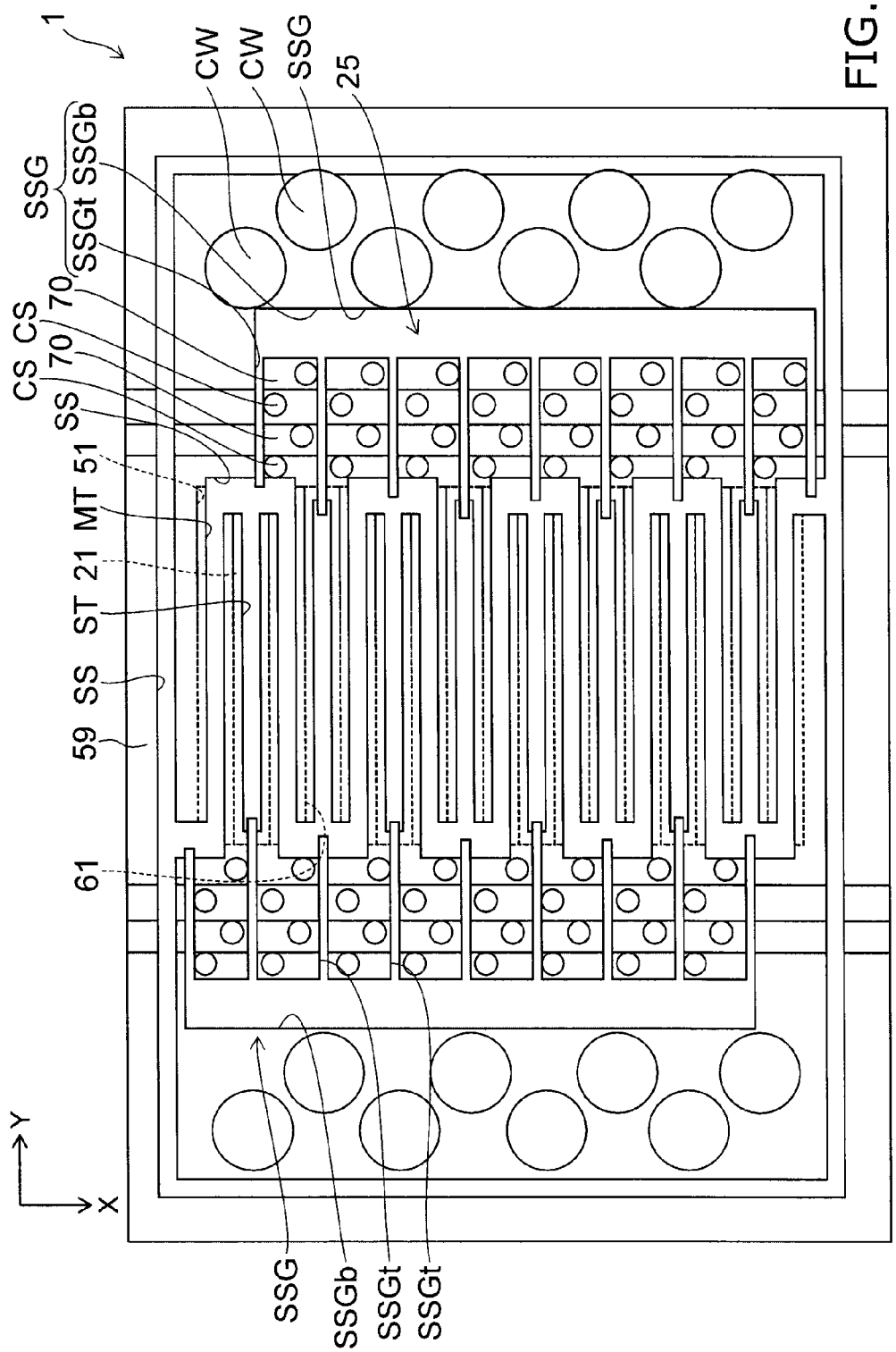

Next, as shown in FIG. 25, a word line contact CW is formed outside the slit SSG. Each word line contact CW is connected to the corresponding control gate electrode film 21 other than the upper select gate 21u. In FIG. 1, the upper select contact CS and the word line contact CW are collectively shown as contacts 38.

Next, as shown in FIG. 1, vias 28 are formed. Then, bit lines 29 and word lines 39 are formed. Thus, the semiconductor memory device 1 according to the embodiment is manufactured. In FIG. 1, the upper select gate 21u is not shown.

As shown in FIG. 26A, after the control gate electrode film 21 is formed around the slit ST, one longitudinal (Y-direction) end part of the slit ST is removed by the slit SS. Thus, two control gate electrode films 21 sandwiching the slit ST are short-circuited with each other.

As shown in FIG. 26B, the upper select gate 21u formed in the upper part of the multilayer body 25 is further cut by the silt SSG. Thus, the upper select gate 21u is divided into line-shaped portions extending in the Y-direction.

In FIG. 26A and FIG. 26B, for clarity of illustration, the control gate electrode film 21 and the upper select gate 21u are hatched.

Next, the effect of the embodiment is described.

According to the embodiment, memory trenches MT and slits ST are formed in the multilayer body 25. A floating gate electrode film 31 is formed from the memory trench MT side. A control gate electrode film 21 is formed from the slit ST side. Thus, the embodiment can manufacture a memory device in which memory cells are integrated in three dimensions and a floating gate electrode film 31 made of a conductive material is provided for each memory cell.

According to the embodiment, the control gate electrode film 21 located at the position sandwiching the memory trench MT can be separated by only one formation of the slit SS. Furthermore, the upper select gate 21u can be separated for each row of silicon pillars 20 extending in the Y-direction by only one formation of the slit SSG. Thus, according to the embodiment, a structure for pulling out interconnects from the memory cell region Rm can be formed by a small number of process steps.

(Second Embodiment)

Next, a second embodiment is described.

The embodiment is different from the above first embodiment in that one end part of the slit ST is elongated.

FIG. 27 to FIG. 31 are plan views showing a method for manufacturing a semiconductor memory device according to the embodiment.

In the following description, the portions different from those of the first embodiment are primarily described. The portions similar to those of the first embodiment are not described, or briefly described.

Figure 27:
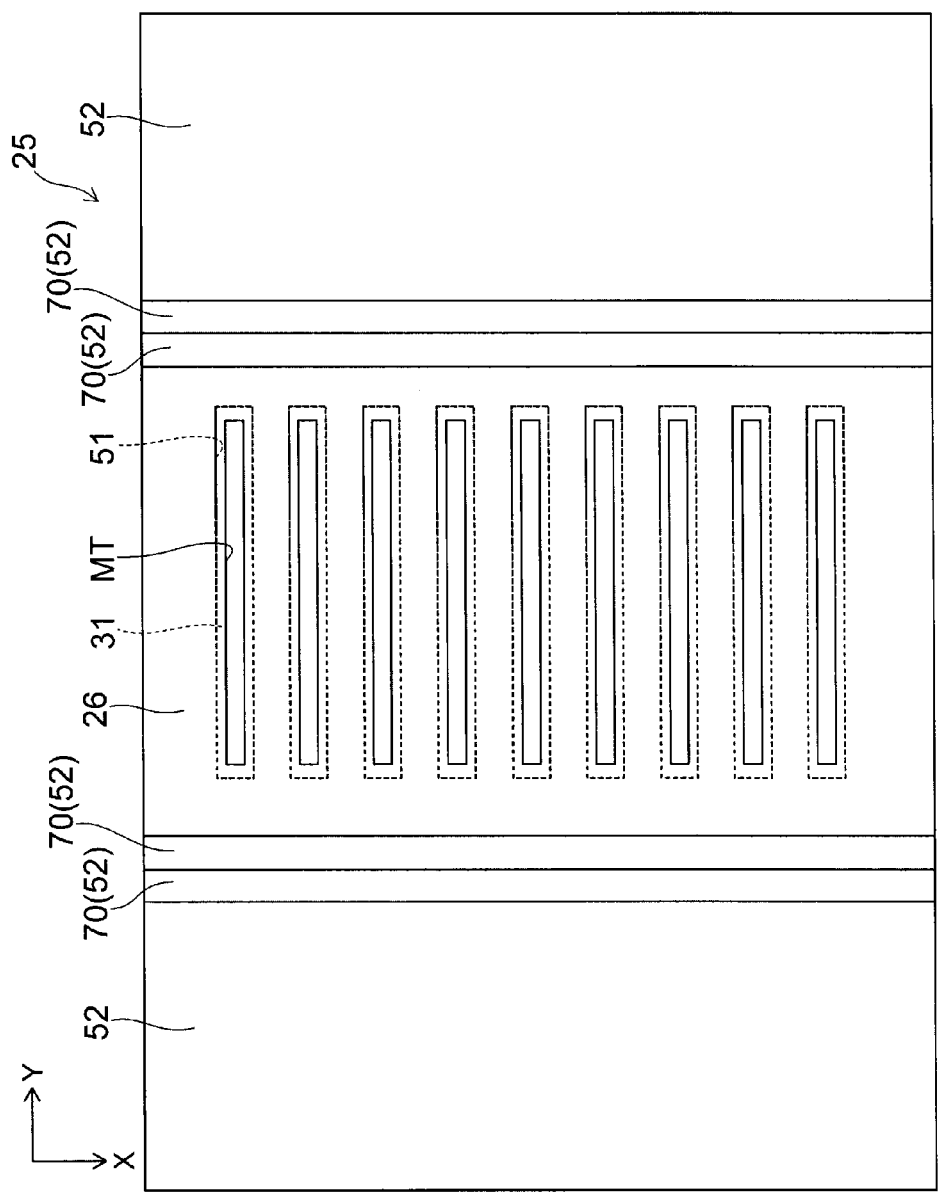
FIG. 27 to FIG. 31 are plan views showing a method for manufacturing a semiconductor memory device according to a second embodiment.

First, as shown in FIG. 27, a multilayer body 25 is formed on a silicon substrate Sub. Both Y-direction end parts in the upper part of the multilayer body 25 are processed into a staircase pattern. A plurality of memory trenches MT extending in the Y-direction are formed in the multilayer body 25. Specifically, the process shown in FIG. 5 to FIG. 17 is performed.

Figure 28:
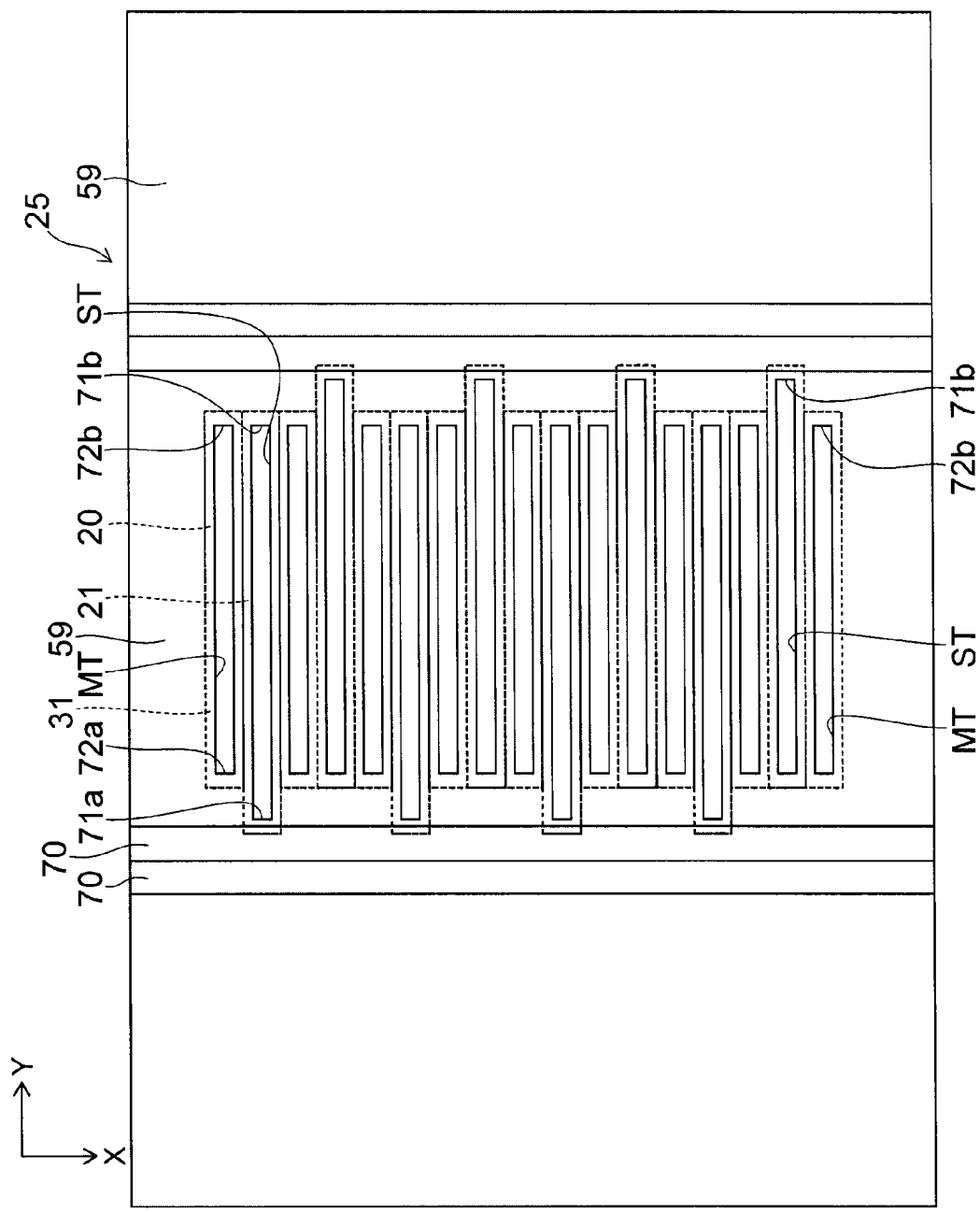

Next, as shown in FIG. 28, a slit ST is formed in the portion of the multilayer body 25 between the memory trenches MT. Specifically, the process shown in FIG. 18 to FIG. 20 is performed. At this time, in contrast to the first embodiment, in the Y-direction, the slit ST is made longer than the memory trench MT. In the Y-direction, both end parts 71a and 71b of the slit ST are alternately projected relative to both end parts 72a and 72b of the memory trench MT. The end part of the slit ST on the non-projected side is disposed at the same position as the end part of the memory trench MT.

Figure 29:
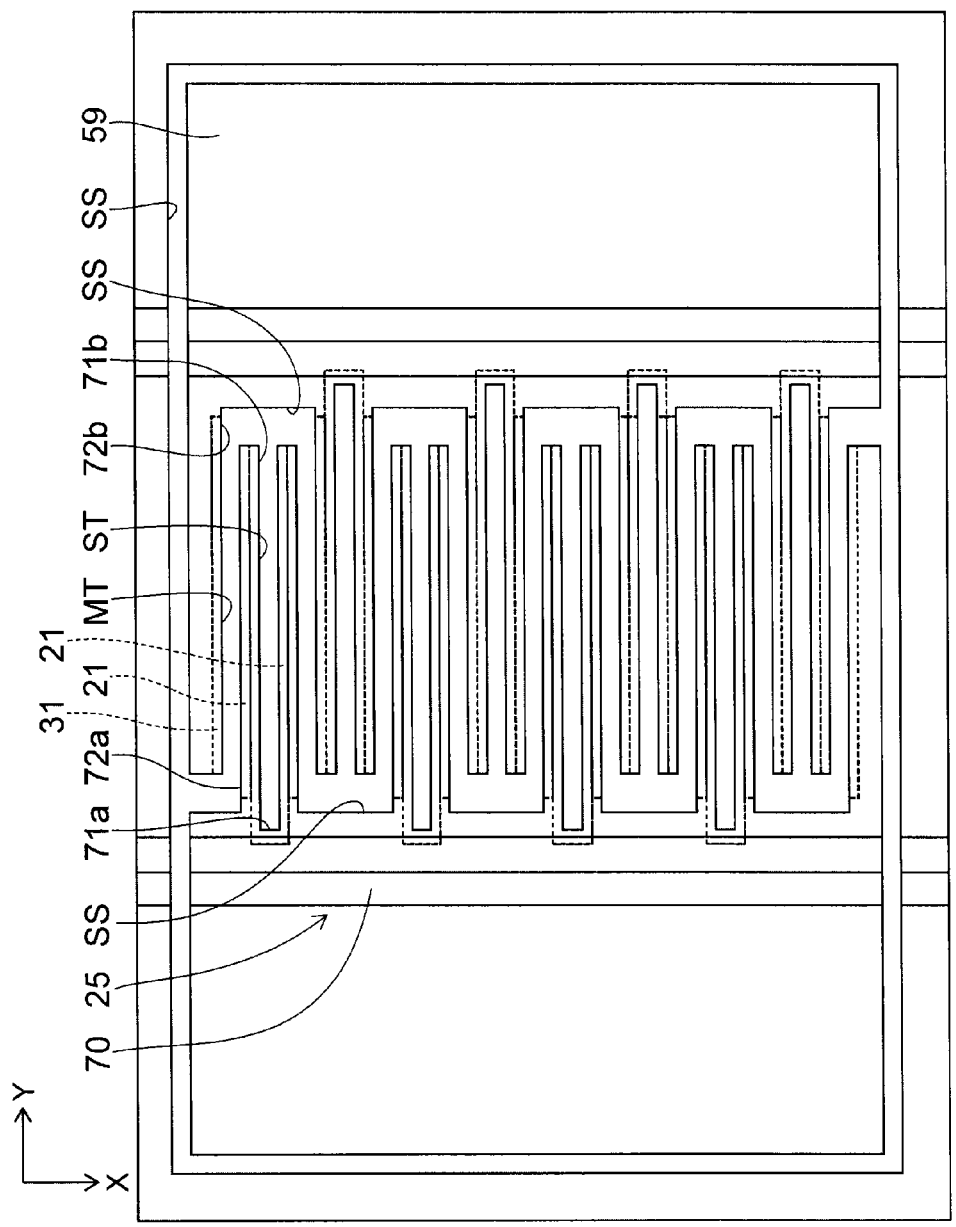

Next, as shown in FIG. 29, a slit SS is formed in the multilayer body 25. Thus, the control gate electrode film 21 formed like a loop along the side surface of the slit ST is cut in the non-projected end part of the slit ST. On the other hand, the control gate electrode film 21 is not cut in the projected end part of the slit ST. Then, an insulating material is embedded in the slit SS.

Figure 30:
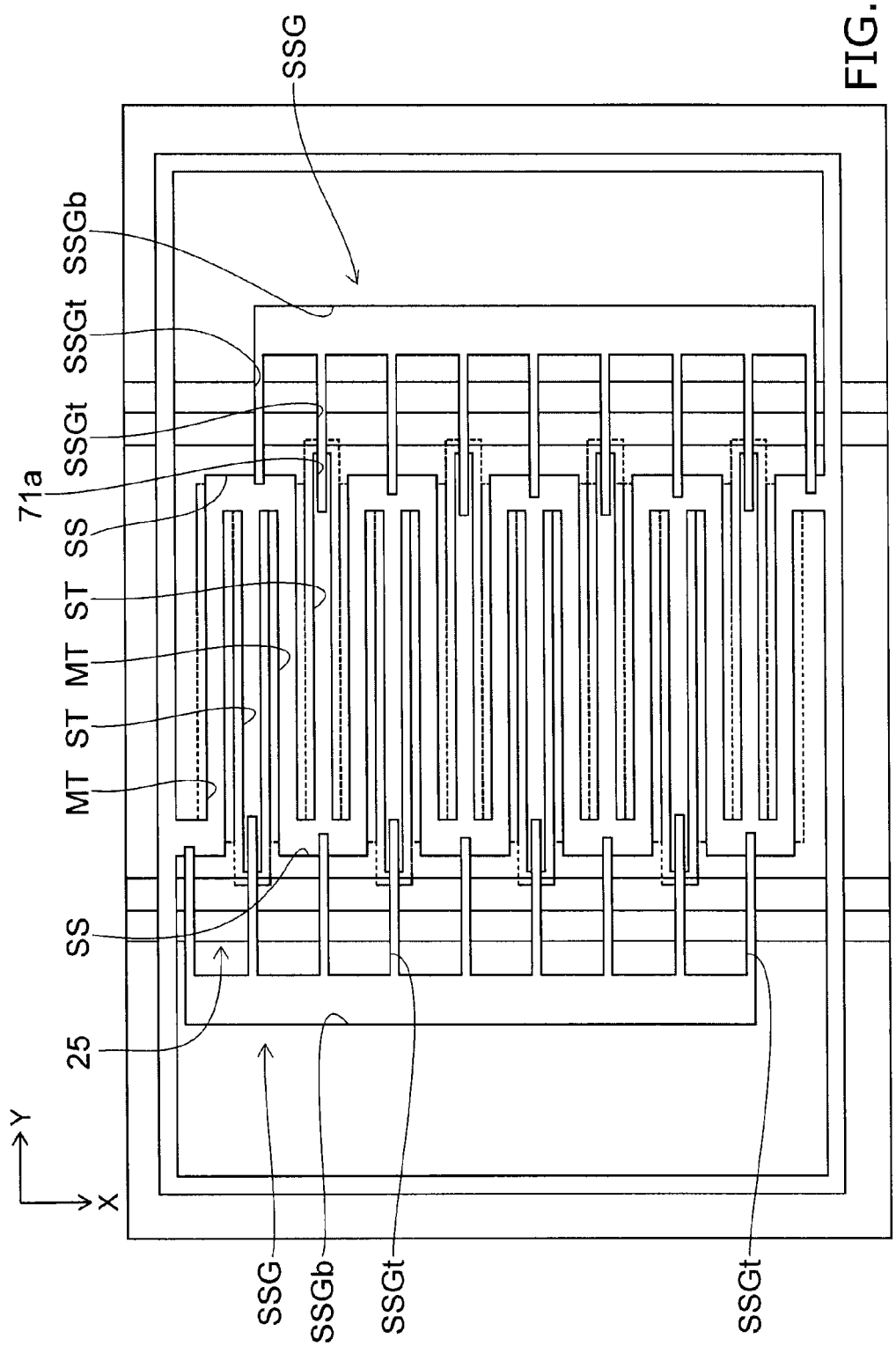

Next, as shown in FIG. 30, a slit SSG is formed in the upper part of the multilayer body 25. At this time, a tooth part SSGt of the slit SSG is formed for each of both end parts of the slit ST. The tip part of the tooth part SSGt is extended into the projected end part 71a of the slit ST. Then, an insulating material is embedded in the slit SSG.

Figure 31:
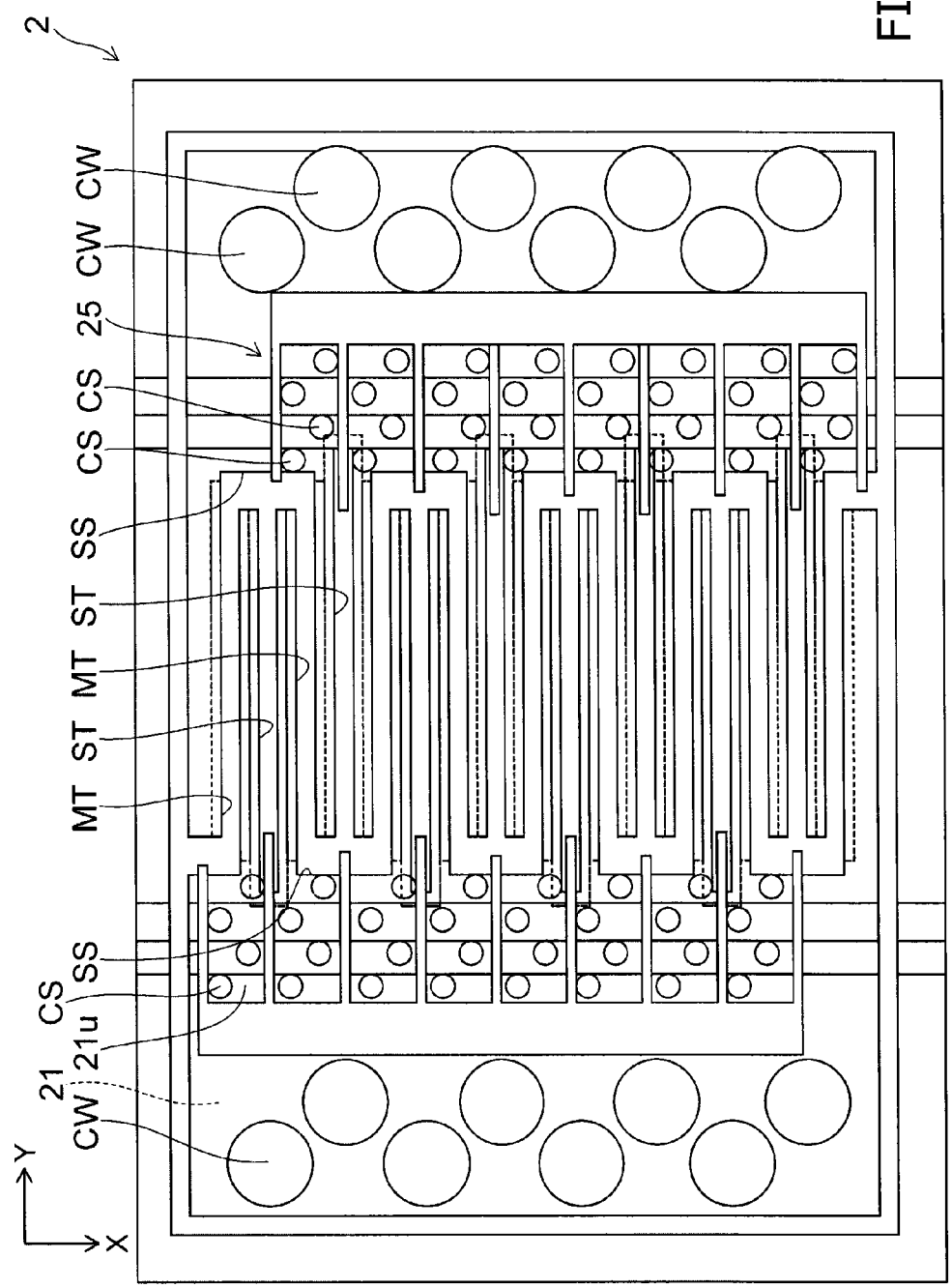

Next, as shown in FIG. 31, both Y-direction end parts of the portion except the upper part of the multilayer body 25 are processed into a staircase pattern. Then, an upper select contact CS is formed and connected to the upper select gate 21u. A word line contact CW is formed and connected to each control gate electrode film 21 other than the upper select gate 21u.

The subsequent manufacturing method is similar to that of the above first embodiment. That is, as shown in FIG. 1, word lines 39 and bit lines 29 are formed. Thus, the semiconductor memory device 2 according to the embodiment is manufactured. In the semiconductor memory device 2, the connecting portion in which two control gate electrode films 21 are connected to each other is located between the silicon pillar 20 and the contact 38 in the Y-direction.

The configuration, manufacturing method, and effect of the embodiment other than the foregoing are similar to those of the above first embodiment.

(Variation of the Second Embodiment)

Next, a variation of the second embodiment is described.

Figure 32:
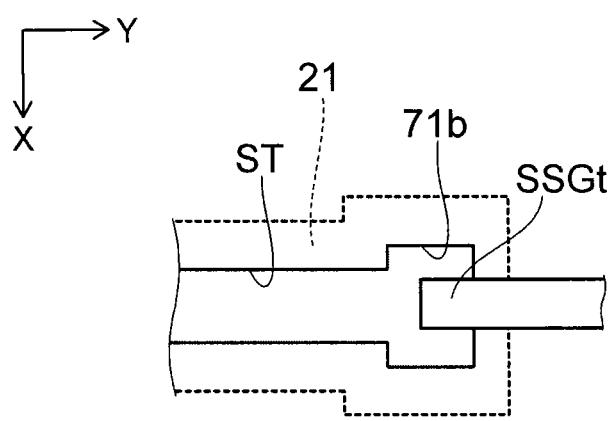
FIG. 32 is a plan view showing a method for manufacturing a semiconductor memory device according to a variation of the second embodiment.

FIG. 32 is a plan view showing a method for manufacturing a semiconductor memory device according to the variation.

As shown in FIG. 32, in the variation, the projected end part, e.g., end part 71b, of the slit ST is made thicker than the rest of the slit ST. This can provide a larger margin for alignment between the side surface of the end part 71b and the side surface of the tooth part SSGt when the tooth part SSGt is extended into the projected end part 71b. The configuration, manufacturing method, and effect of the variation other than the foregoing are similar to those of the above second embodiment.

(Third Embodiment)

Next, a third embodiment is described.

The embodiment is different from the above first embodiment in that both end parts of the slit ST are elongated.

FIG. 33 to FIG. 37 are plan views showing a method for manufacturing a semiconductor memory device according to the embodiment.

Figure 33:
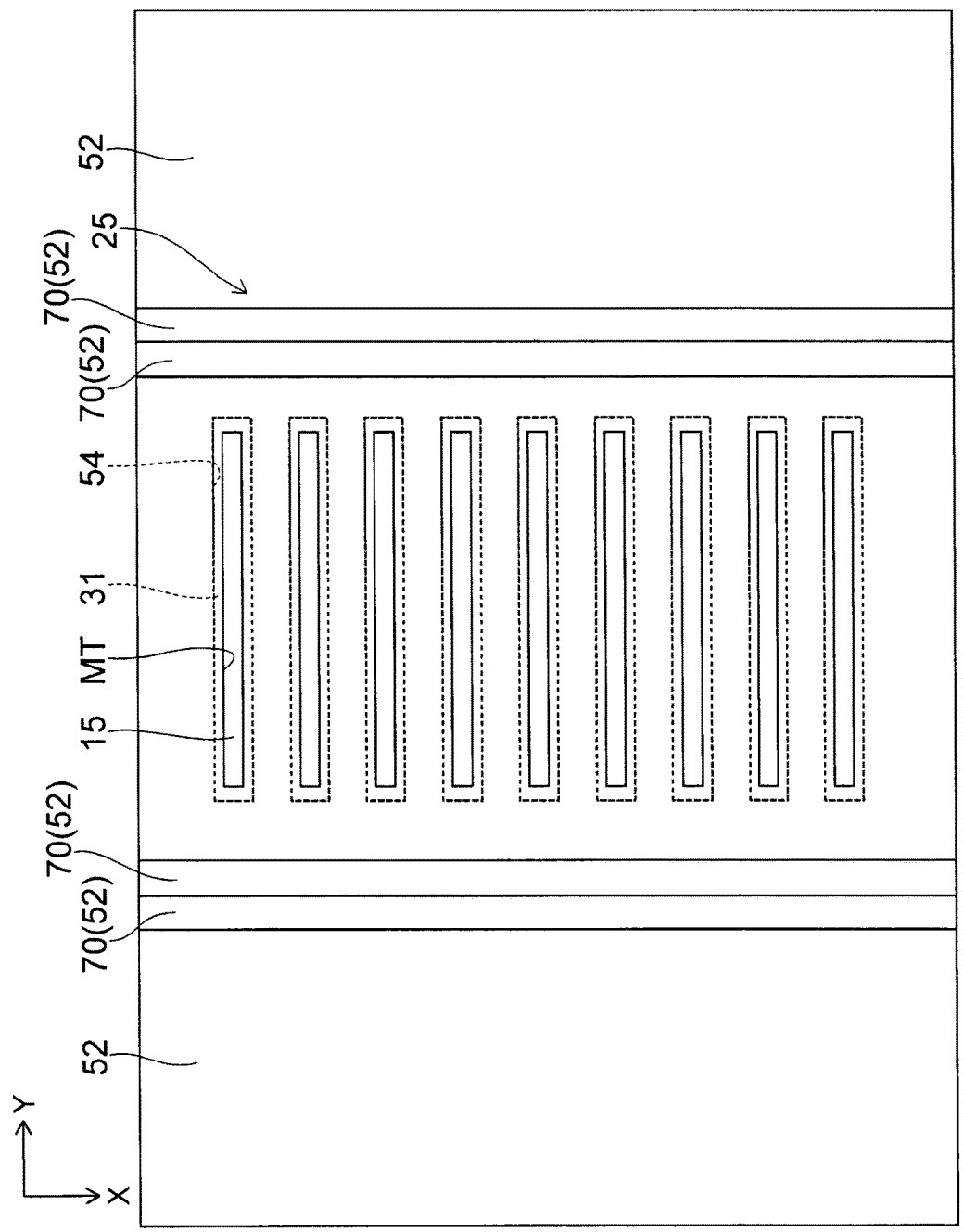
FIG. 33 to FIG. 37 are plan views showing a method for manufacturing a semiconductor memory device according to a third embodiment.

First, as shown in FIG. 33, both Y-direction end parts in the upper part of the multilayer body 25 are processed into a staircase pattern. Then, a plurality of memory trenches MT extending in the Y-direction are formed in the multilayer body 25. Specifically, the process shown in FIG. 5 to FIG. 17 is performed.

Figure 34:
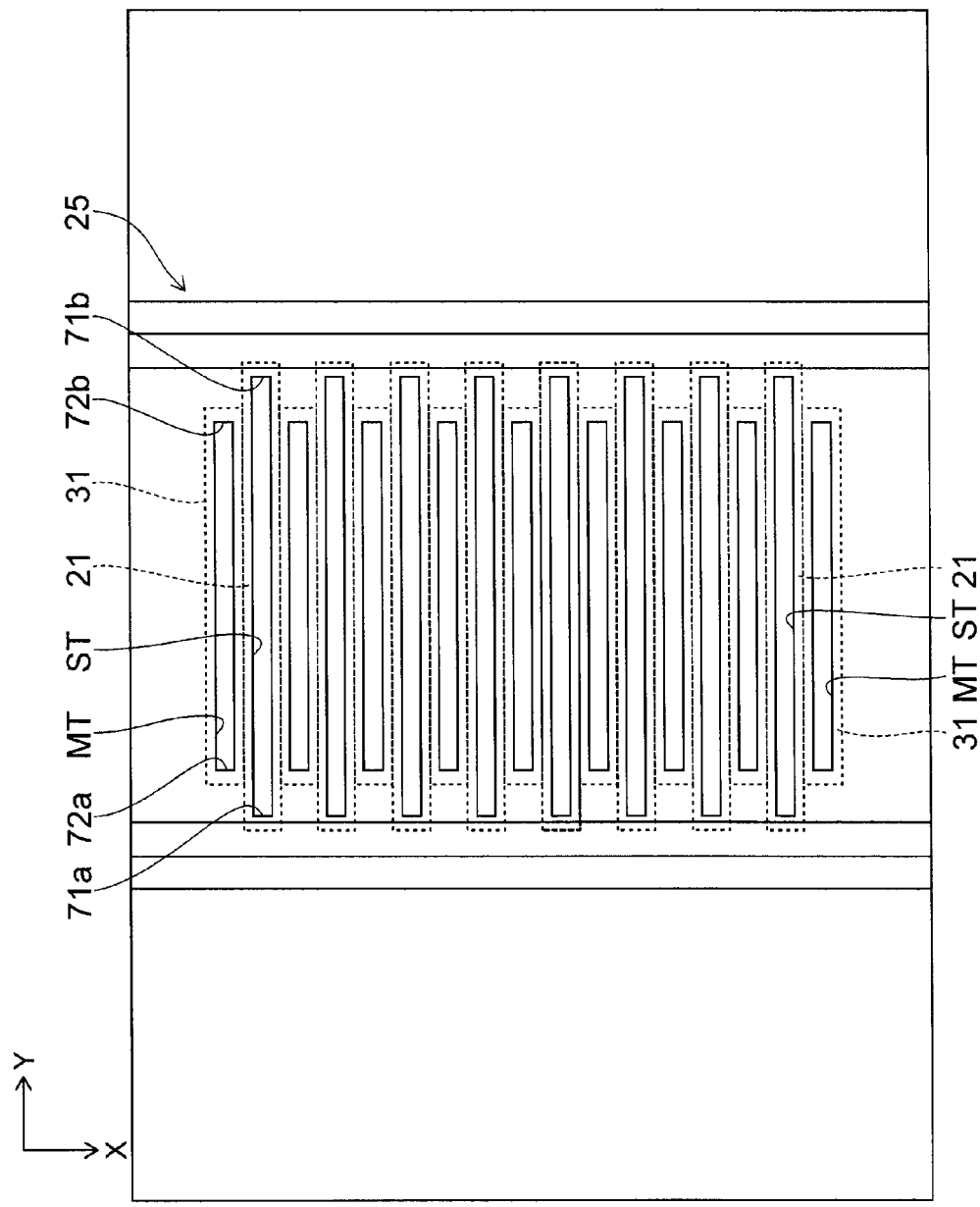

Next, as shown in FIG. 34, a slit ST is formed in the portion of the multilayer body 25 between the memory trenches MT. Specifically, the process shown in FIG. 17 to FIG. 19 is performed. At this time, in the Y-direction, the slit ST is made longer than the memory trench MT. Both end parts 71a and 71b of the slit ST are projected relative to both end parts 72a and 72b of the memory trench MT.

Figure 35:
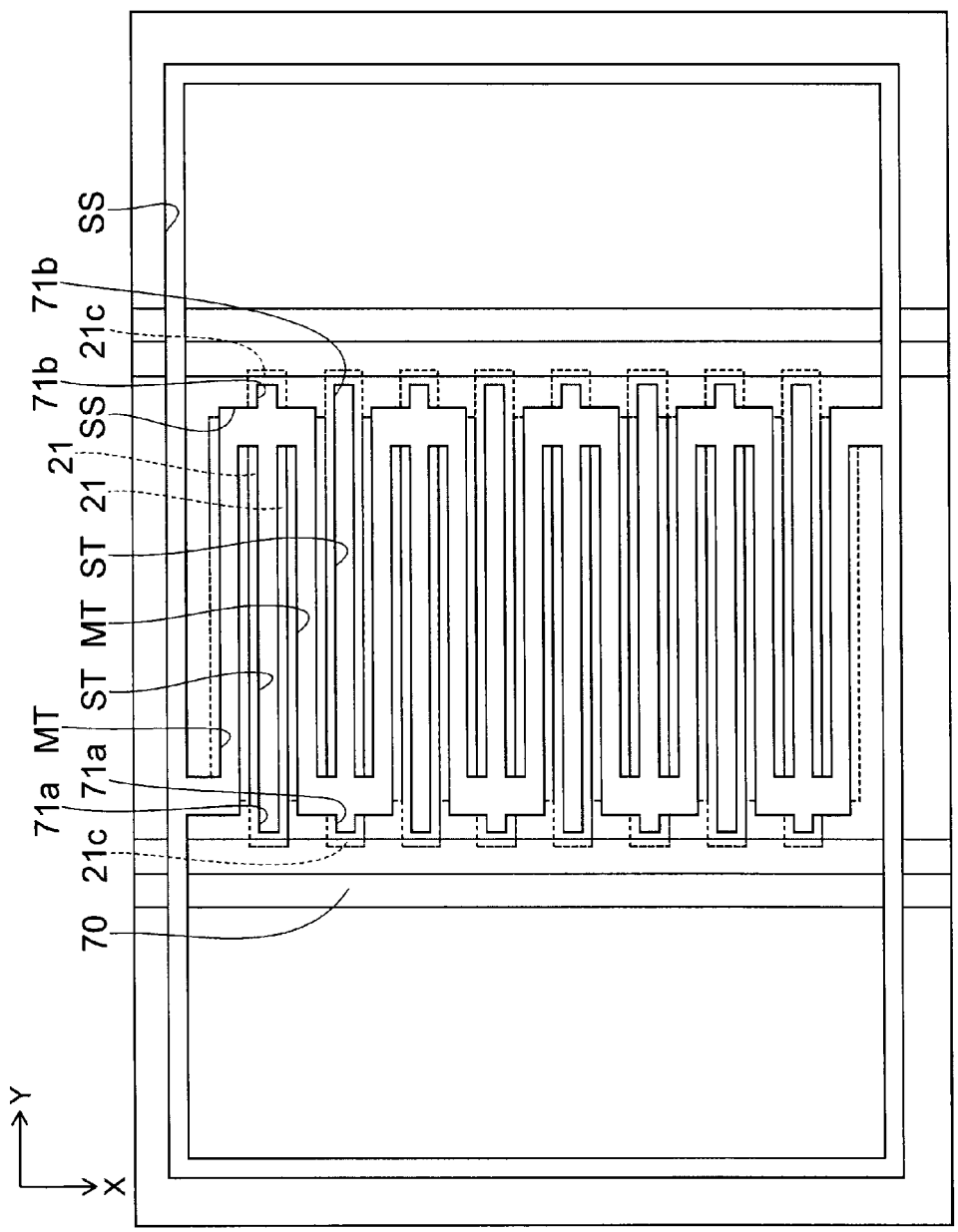

Next, as shown in FIG. 35, a slit SS is formed in the multilayer body 25. At this time, the slit SS is caused to alternately traverse the portion on the central part side of both end parts of the slit ST. That is, one slit ST is traversed near the end part 71a, whereas its adjacent slit ST is traversed near the end part 71b. Thus, the control gate electrode film 21 formed like a loop along the side surface of the slit ST is cut at one site. At this time, a U-shaped portion 21c is formed in the end part on the cut side of the control gate electrode film 21. The U-shaped portion 21c is opened on the side of the linear portion extending in the Y-direction. Then, an insulating material is embedded in the slit SS.

Figure 36:
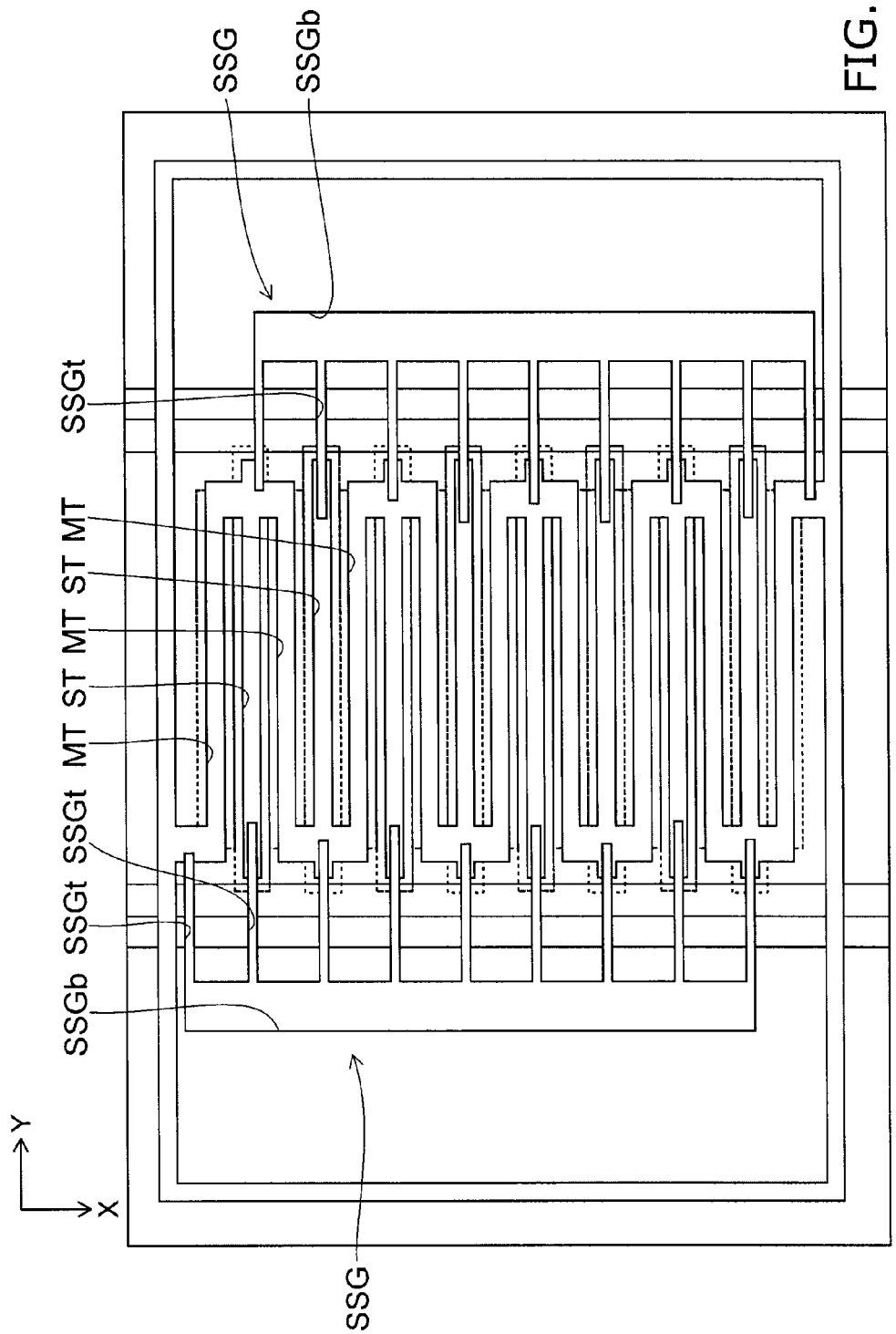

Next, as shown in FIG. 36, a slit SSG is formed in the upper part of the multilayer body 25. At this time, a tooth part SSGt of the slit SSG is formed for each of both end parts of the slit ST. The tooth parts SSGt are extended into both end parts of the slit ST. Then, an insulating material is embedded in the slit SSG.

Figure 37:
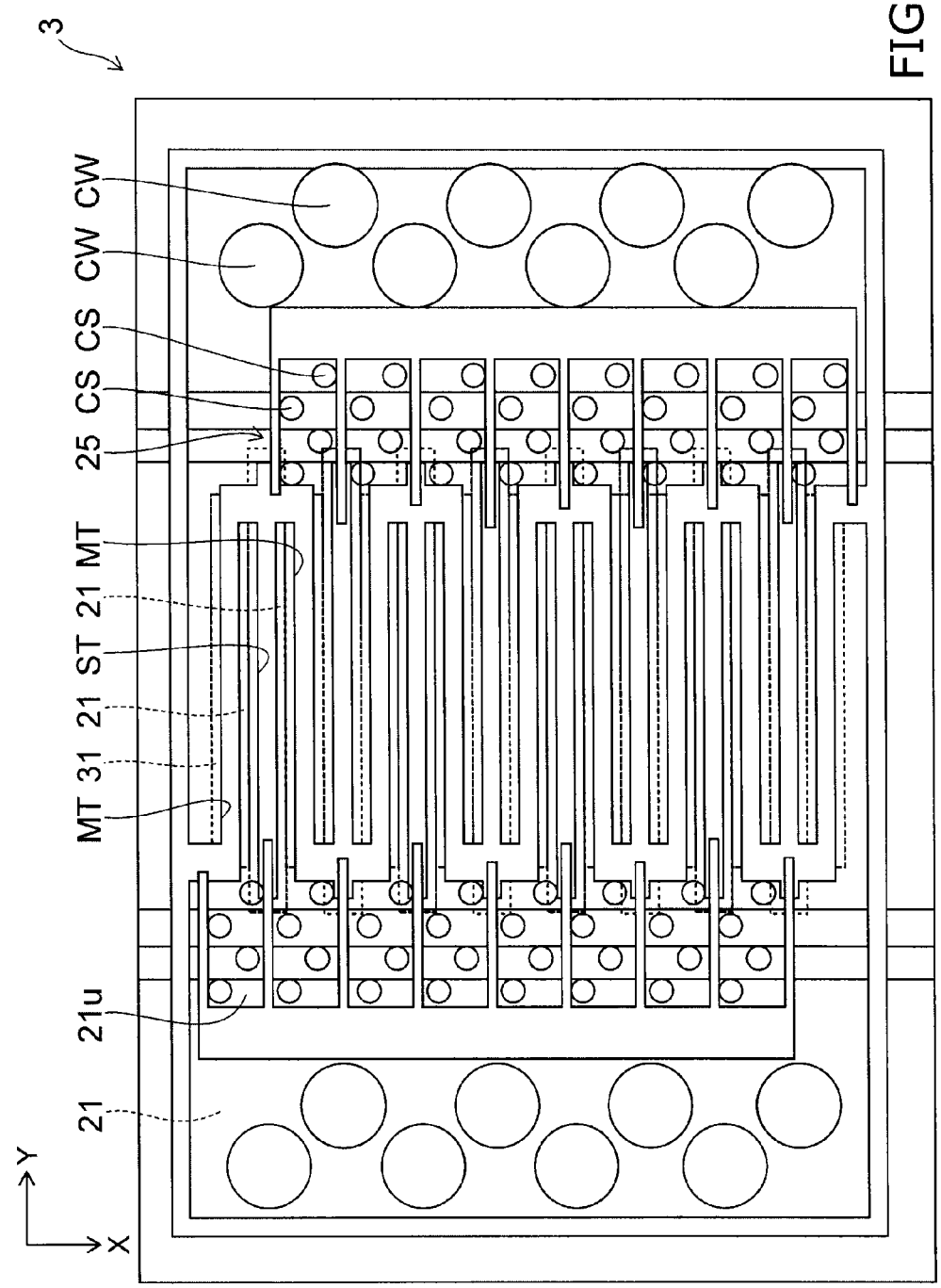

Next, as shown in FIG. 37, both Y-direction end parts of the portion except the upper part of the multilayer body 25 are processed into a staircase pattern. Then, an upper select contact CS is formed and connected to the upper select gate 21u. A word line contact CW is formed and connected to each control gate electrode film 21 other than the upper select gate 21u.

The subsequent manufacturing method is similar to that of the above first embodiment. That is, as shown in FIG. 1, word lines 39 and bit lines 29 are formed. Thus, the semiconductor memory device 3 according to the embodiment is manufactured.

The configuration, manufacturing method, and effect of the embodiment other than the foregoing are similar to those of the above first embodiment.

(Fourth Embodiment)

Next, a fourth embodiment is described.

The embodiment is different from the above first embodiment in that the slit SS is formed before the slit ST.

FIG. 38 to FIG. 41 are plan views showing a method for manufacturing a semiconductor memory device according to the embodiment.

Figure 38:
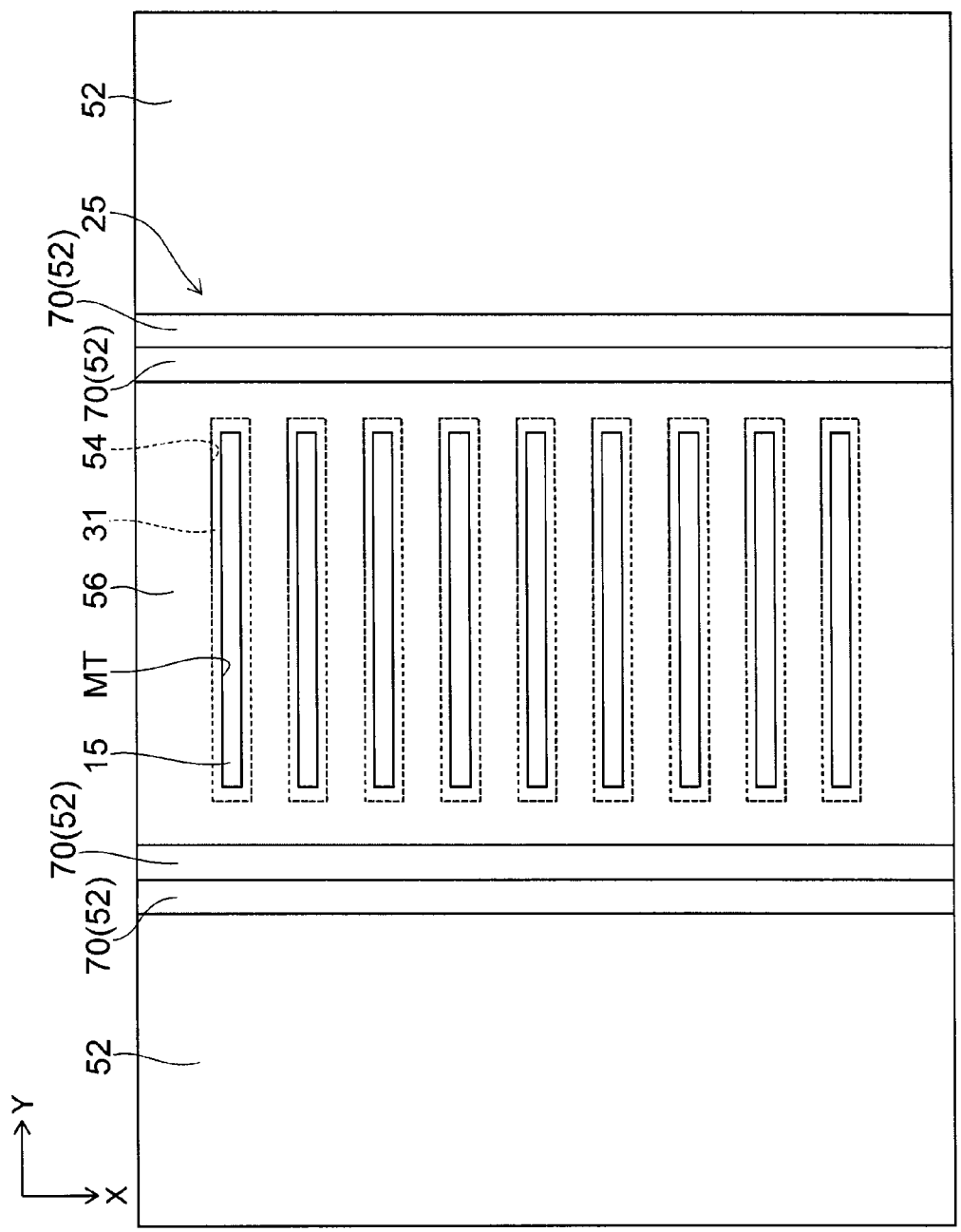
FIG. 38 to FIG. 41 are plan views showing a method for manufacturing a semiconductor memory device according to a fourth embodiment.

First, as shown in FIG. 38, both Y-direction end parts in the upper part of the multilayer body 25 are processed into a staircase pattern. Then, a plurality of memory trenches MT are formed in the multilayer body 25. The longitudinal direction of the memory trench MT is the Y-direction. Then, an insulating material is embedded in the memory trench MT.

Figure 39:
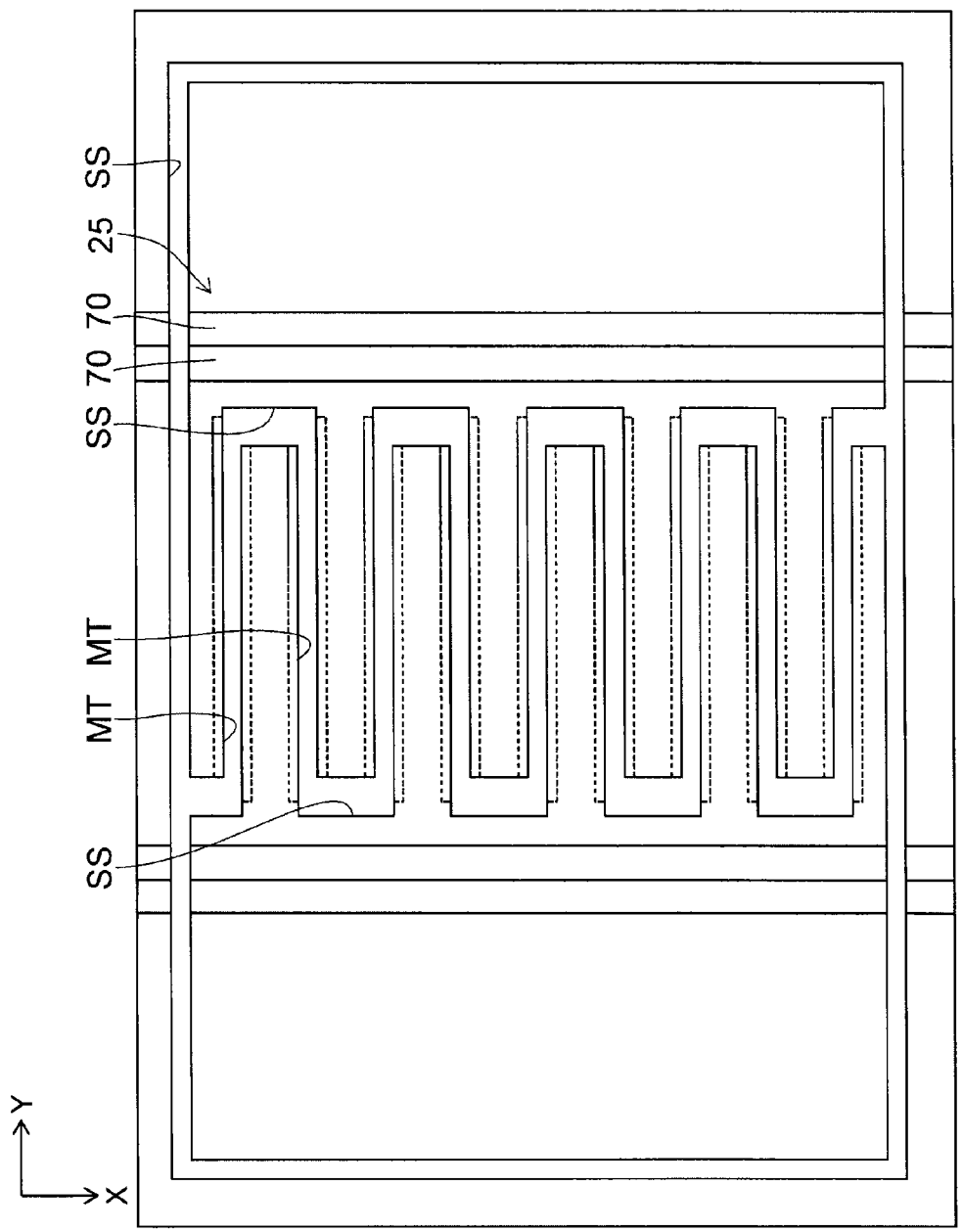

Next, as shown in FIG. 39, a slit SS is formed in the multilayer body 25. The slit SS links the end parts of adjacent memory trenches MT with each other. At this time, for three memory trenches MT arranged consecutively, the first memory trench MT and the second memory trench MT are linked with each other on one end part side, whereas the second memory trench MT and the third memory trench MT are linked with each other on the other end part side. Then, an insulating material is embedded in the slit SS.

Figure 40:
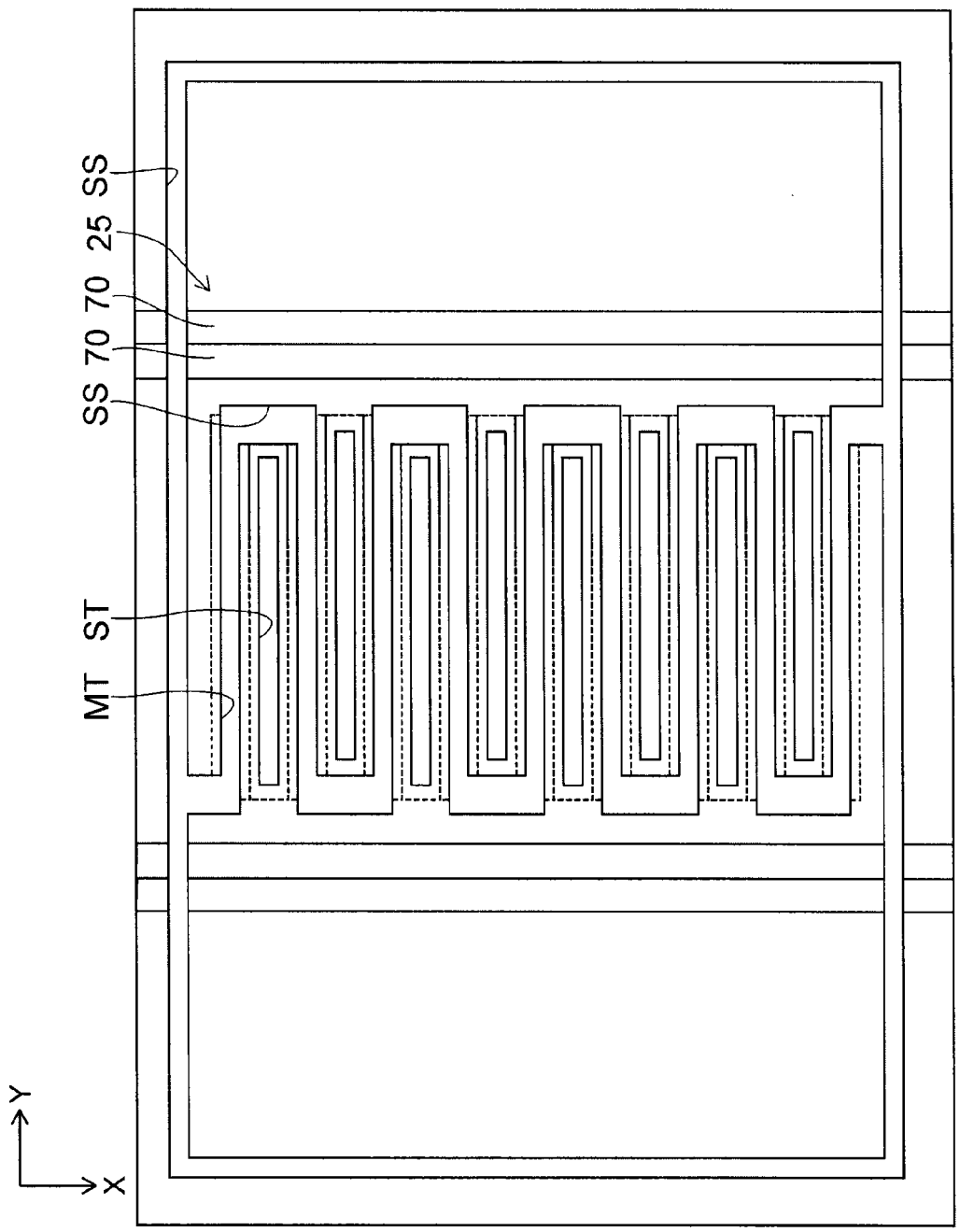

Next, as shown in FIG. 40, a slit ST is formed in the portion of the multilayer body 25 surrounded on three sides with two memory trenches MT and one slit SS. The longitudinal direction of the slit ST is the Y-direction. At this time, the end part of the slit ST is configured so as not to be projected relative to the end part of the memory trench MT in the Y-direction. Then, an insulating material is embedded in the slit ST.

Figure 41:
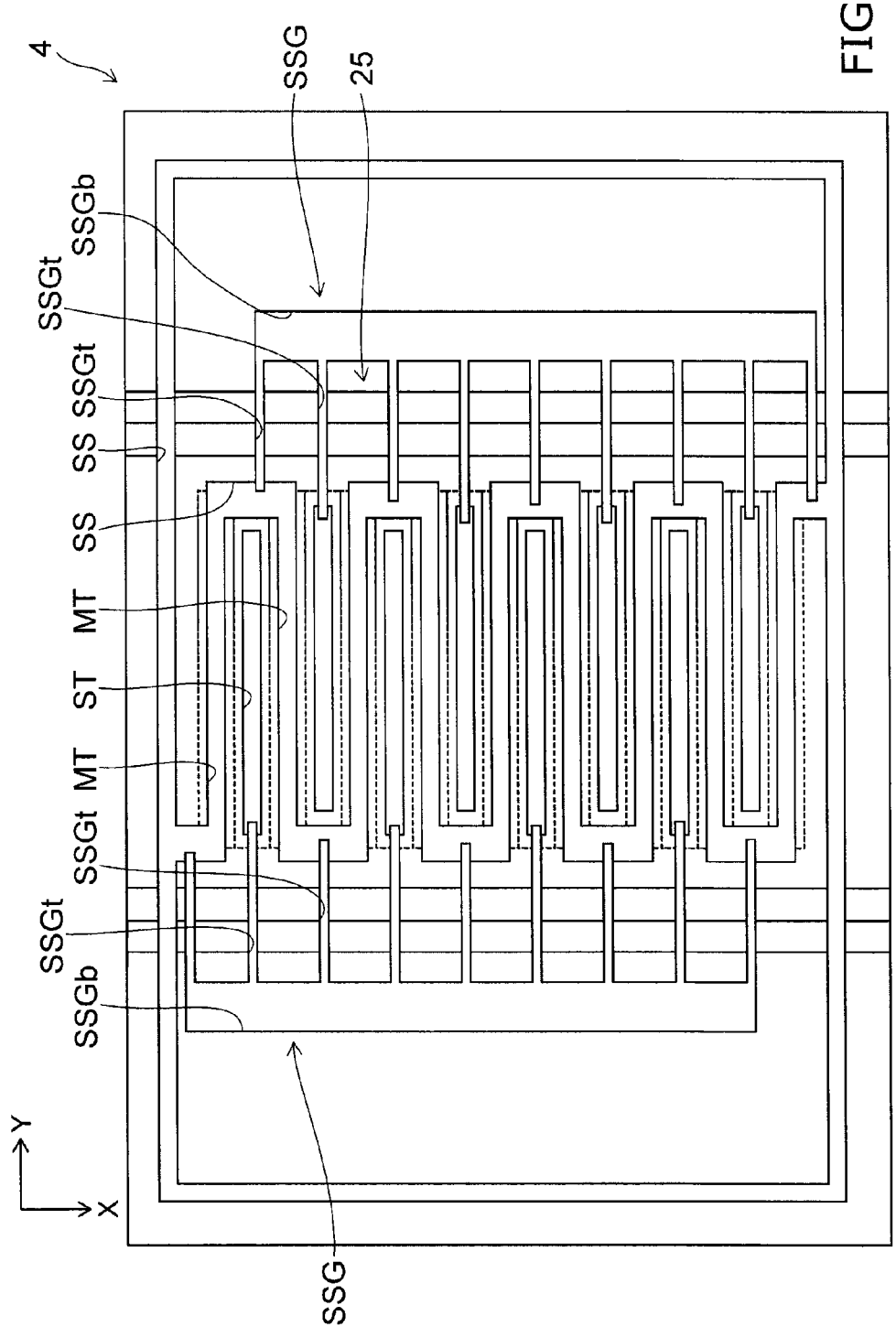

Next, as shown in FIG. 41, a slit SSG is formed in the upper part of the multilayer body 25. At this time, a tooth part SSGt of the slit SSG is formed for each of both end parts of the slit ST. The tooth parts SSGt are extended into both end parts of the slit ST. Then, an insulating material is embedded in the slit SSG.

The subsequent manufacturing method is similar to that of the above first embodiment. That is, both Y-direction end parts of the portion of the multilayer body 25 other than the upper part are processed into a staircase pattern. An upper select contact CS and a word line contact CW are formed. Word lines 39 and bit lines 29 are formed. Thus, the semiconductor memory device 4 according to the embodiment is manufactured.

The configuration, manufacturing method, and effect of the embodiment other than the foregoing are similar to those of the above first embodiment.

(Fifth Embodiment)

Next, a fifth embodiment is described.

The embodiment is different from the above fourth embodiment in that one end part of the slit ST is elongated.

Figure 42:
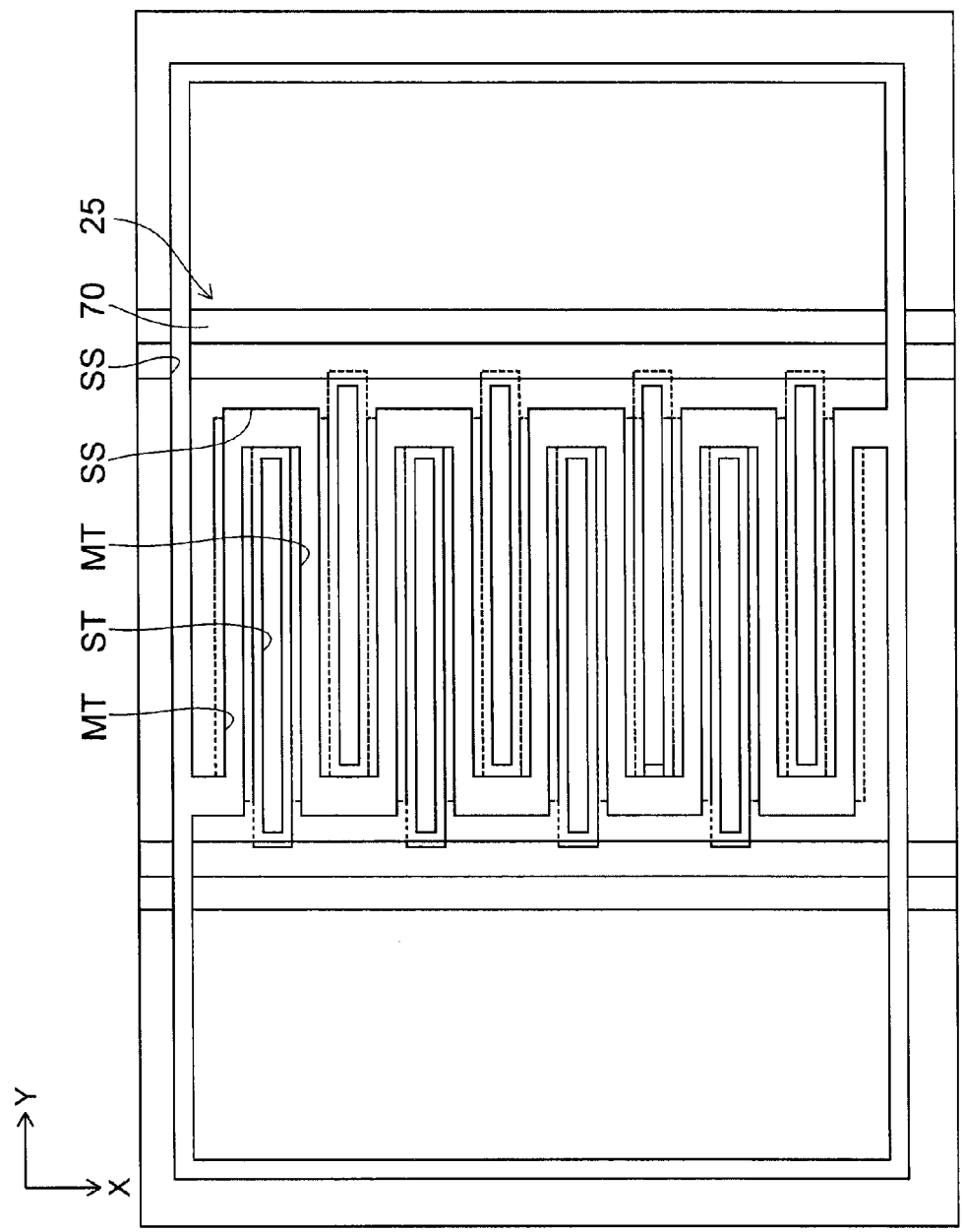
FIG. 42 is a plan view showing a method for manufacturing a semiconductor memory device according to a fifth embodiment.

FIG. 42 is a plan view showing a method for manufacturing a semiconductor memory device according to the embodiment.

First, as shown in FIG. 38 and FIG. 39, a multilayer body 25 is formed. Both Y-direction end parts in the upper part of the multilayer body 25 are processed into a staircase pattern. Next, a memory trench MT and a slit SS are formed in the multilayer body 25.

Next, as shown in FIG. 42, a slit ST is formed in the multilayer body 25. At this time, the slit ST is made longer than the memory trench MT. From the portion surrounded on three sides with two memory trenches MT and one slit SS, the slit ST is extended out to the side in the Y-direction where the slit SS does not exist.

Next, as shown in FIG. 41, a slit SSG is formed in the multilayer body 25.

The subsequent manufacturing method is similar to that of the above fourth embodiment. Thus, the semiconductor memory device according to the embodiment is manufactured. The configuration, manufacturing method, and effect of the embodiment other than the foregoing are similar to those of the above first embodiment.

(Sixth Embodiment)

Next, a sixth embodiment is described.

The embodiment is different from the above first embodiment in that the slit SS is formed before the memory trench MT.

FIG. 43 to FIG. 47 are plan views showing a method for manufacturing a semiconductor memory device according to the embodiment.

Figures 48A, 48B:
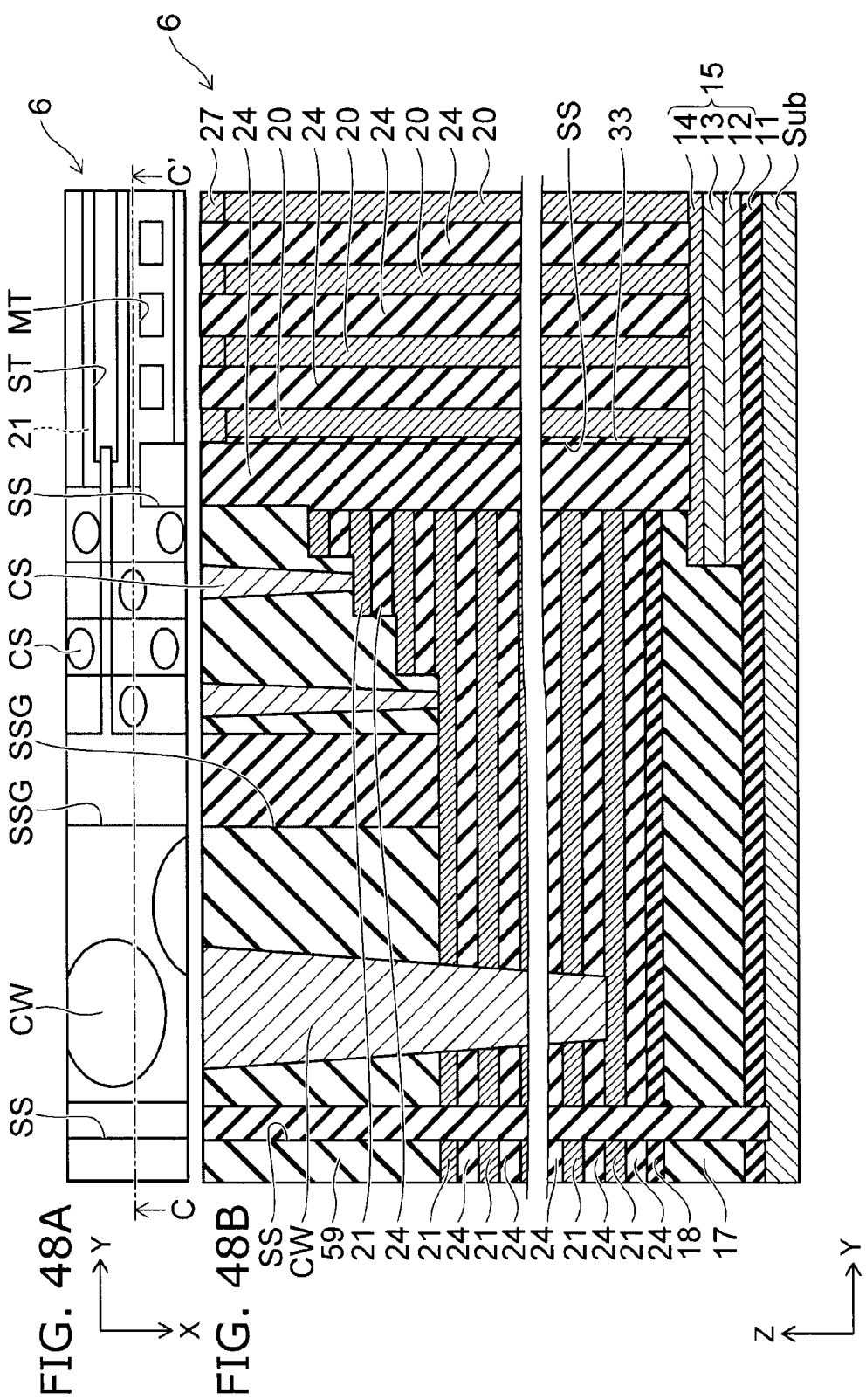
FIG. 48A is a plan view showing a semiconductor memory device according to the sixth embodiment.
FIG. 48B is a sectional view taken along line C-C' shown in FIG. 48A.

FIG. 48A is a plan view showing a semiconductor memory device according to the embodiment. FIG. 48B is a sectional view taken along line C-C' shown in FIG. 48A.

FIG. 49A is a plan view showing the semiconductor memory device according to the embodiment. FIG. 49B is a sectional view taken along line D-D' shown in FIG. 49A.

FIG. 50A is a plan view showing the semiconductor memory device according to the embodiment. FIG. 50B is a sectional view taken along line E-E' shown in FIG. 50A.

The aforementioned plan views and sectional views show corresponding positions. However, the positions are not exactly matched.

First, as shown in FIG. 5, a multilayer body 25 is formed on a silicon substrate Sub. Next, both Y-direction end parts in the upper part of the multilayer body 25 are processed into a staircase pattern.

Figure 43:
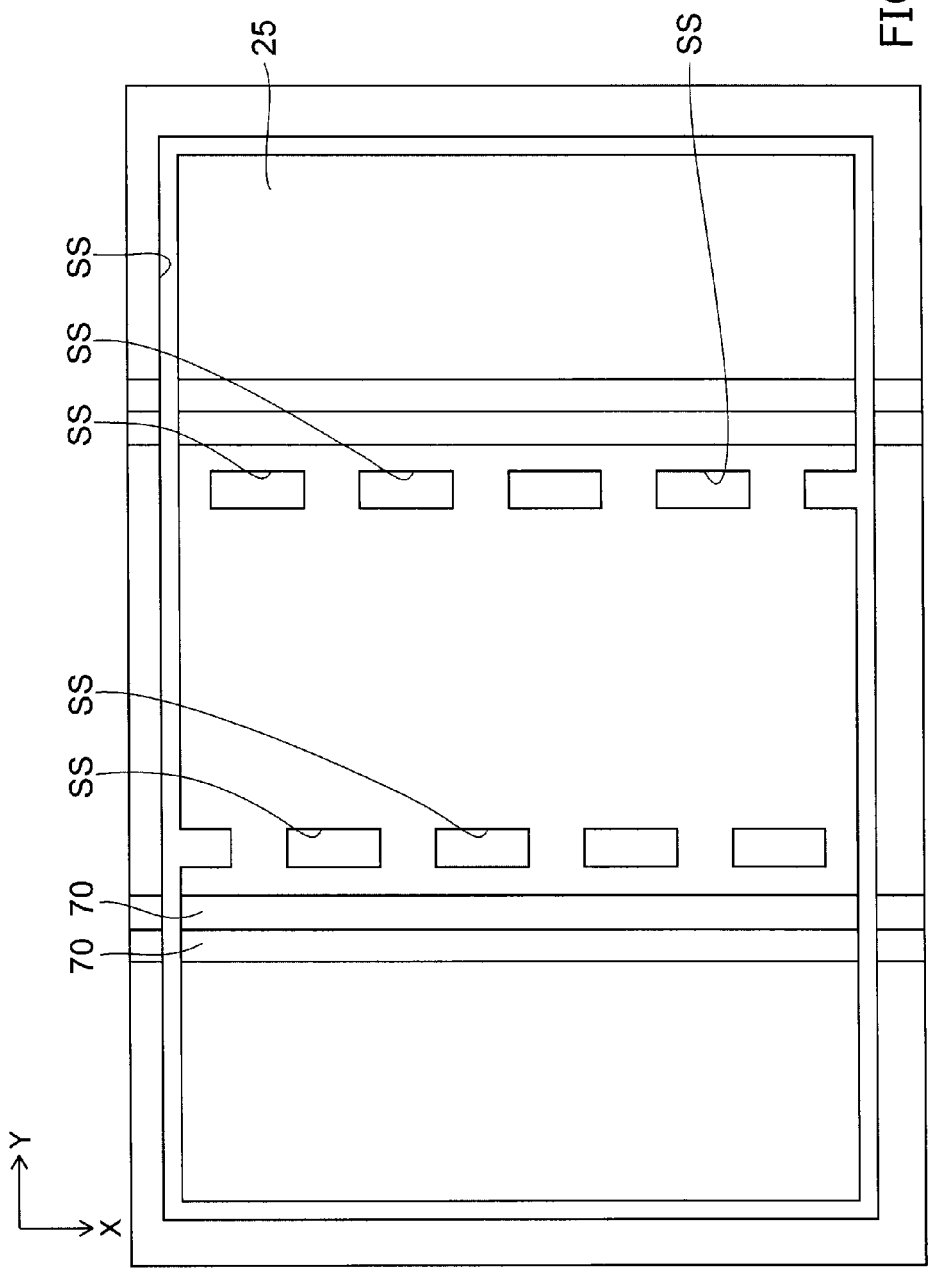
FIG. 43 to FIG. 47 are plan views showing a method for manufacturing a semiconductor memory device according to a sixth embodiment.

Next, as shown in FIG. 43, a plurality of slits SS are formed in the multilayer body 25. Each slit SS is shaped like a rectangle with the longitudinal direction being the X-direction. Two rows of slits SS are formed with spacing in the Y-direction. The row includes a plurality of slits SS periodically arranged along the X-direction. Between the rows, the phase of the arrangement of slits SS is shifted by half the period. Then, silicon oxide is embedded in the slit SS.

Figure 44:
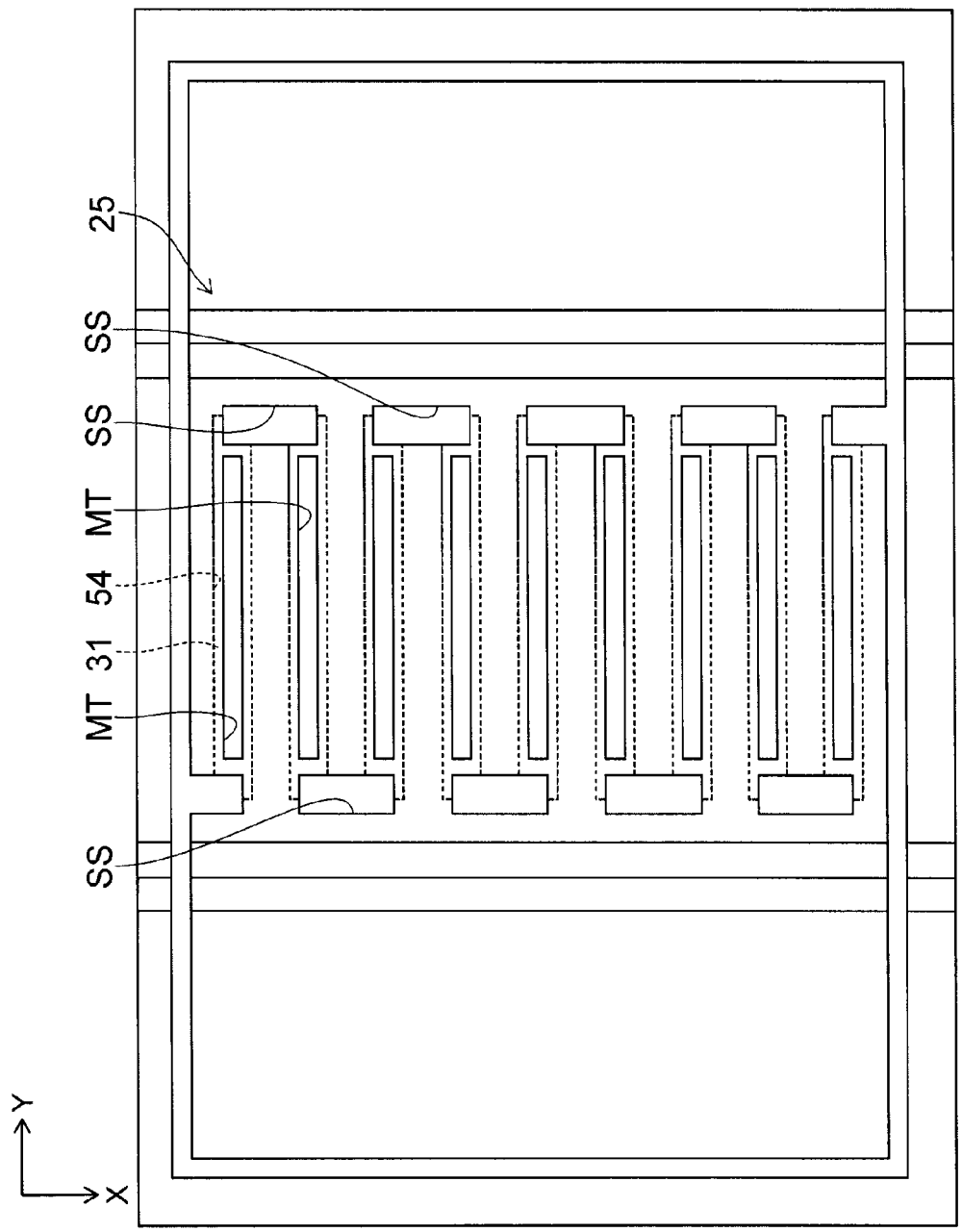

Next, as shown in FIG. 44 and FIG. 6, a plurality of memory trenches MT extending in the Y-direction are formed in the multilayer body 25. At this time, both end parts of the memory trench MT are disposed near the slit SS, but not linked with the slit SS.

Next, as shown in FIG. 44 and FIG. 8, the polysilicon film 52 is recessed through the memory trench MT by wet etching to form a depression 54. At this time, the silicon oxide embedded in the slit SS is used as a stopper. Next, the process shown in FIG. 9 to FIG. 16 is performed to form silicon pillars 20 and the like.

Figure 45:
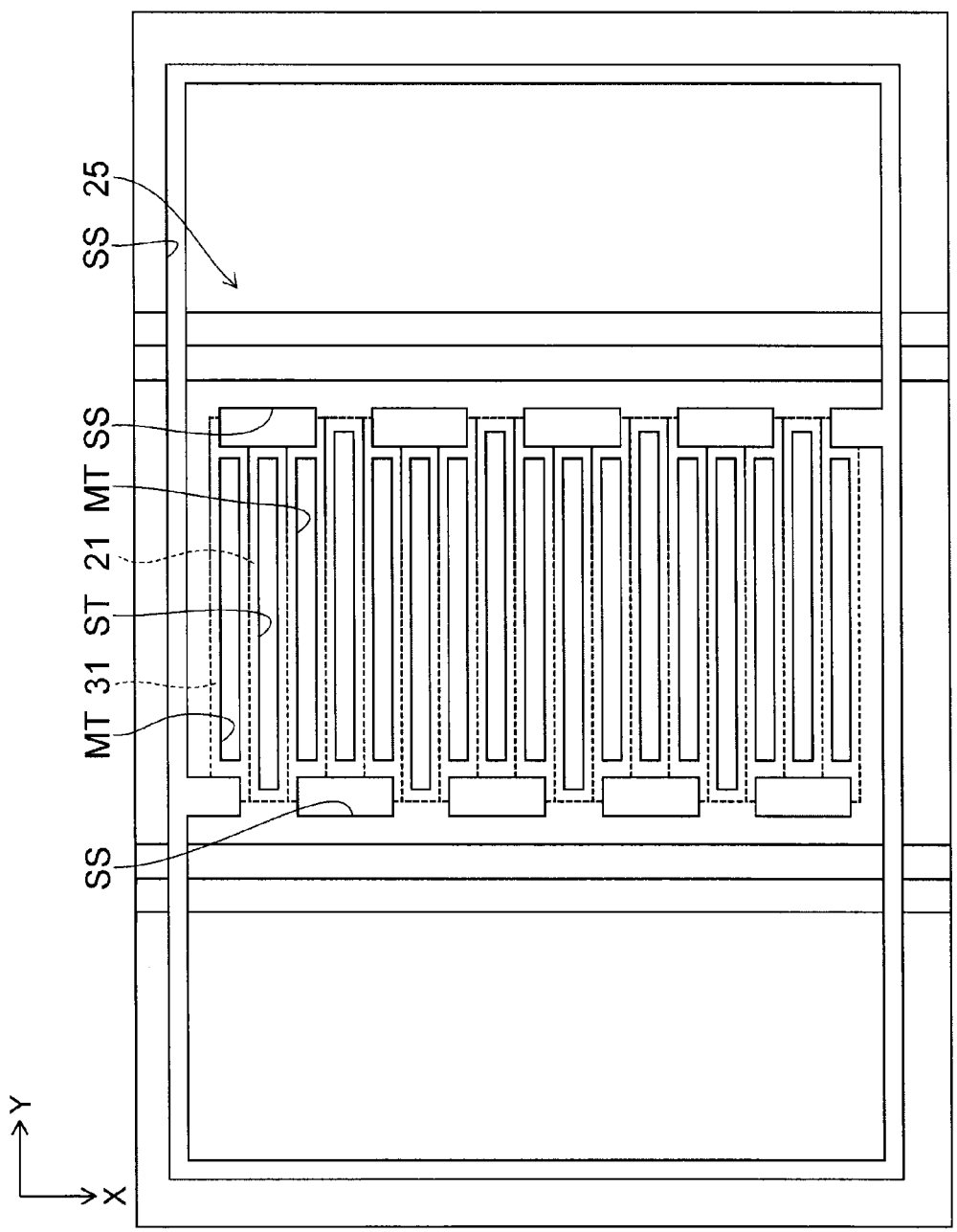

Next, as shown in FIG. 45, a slit ST is formed in the portion of the multilayer body 25 surrounded on three sides with two memory trenches MT and one slit SS. At this time, the end part of the slit ST is configured so as not to be projected relative to the end part of the memory trench MT in the Y-direction. Then, an insulating material is embedded in the slit ST.

Figure 46:
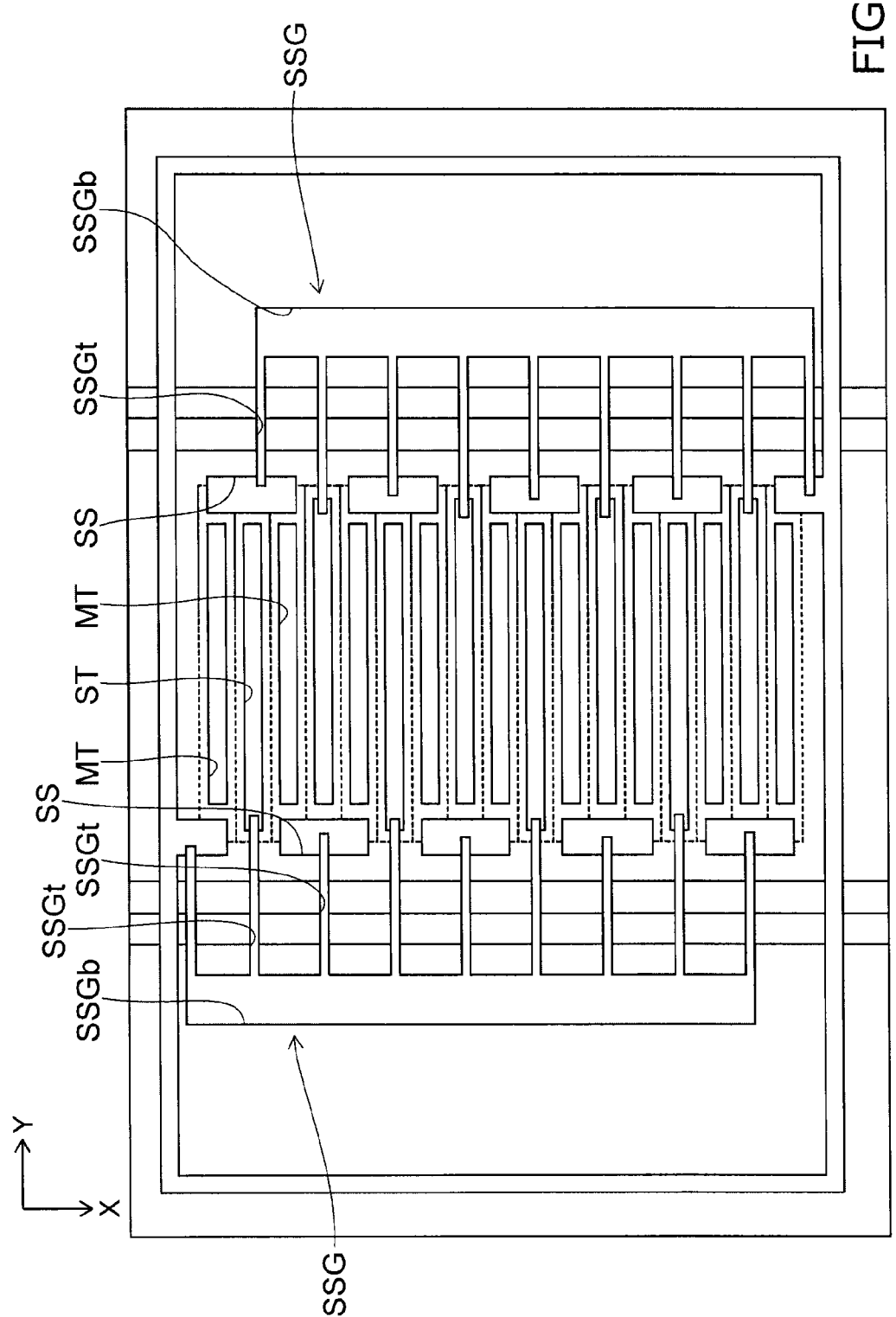

Next, as shown in FIG. 46, a slit SSG is formed in the upper part of the multilayer body 25. At this time, a tooth part SSGt of the slit SSG is formed for each of both end parts of the slit ST. The tooth parts SSGt are extended into both end parts of the slit ST. Then, an insulating material is embedded in the slit SSG.

Figure 47:
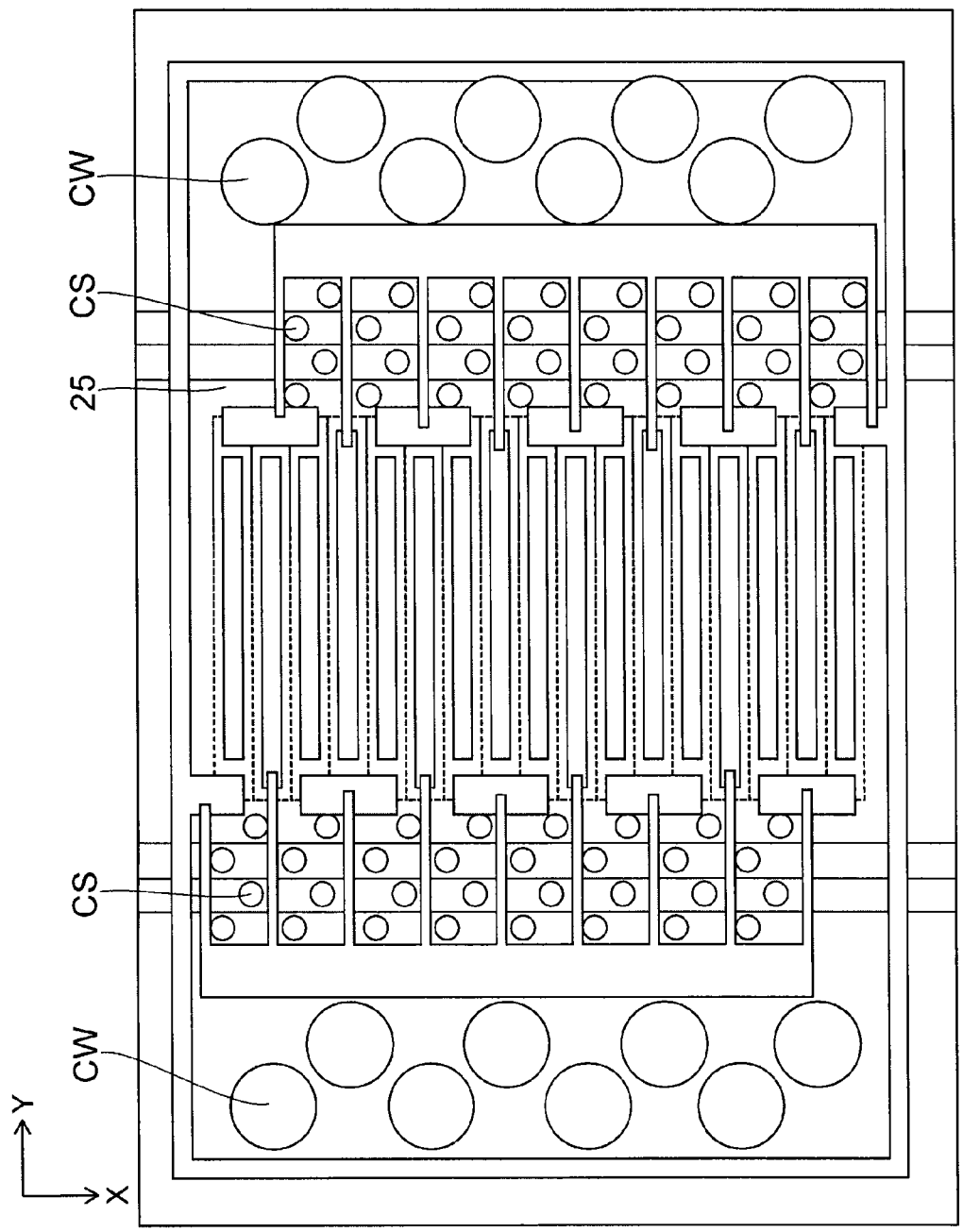

Next, as shown in FIG. 47, both Y-direction end parts of the portion of the multilayer body 25 other than the upper part are processed into a staircase pattern. An upper select contact CS and a word line contact CW are formed.

Next, contacts 38, word lines 39, and bit lines 29 (see FIG. 1) are formed.

Thus, as shown in FIG. 48A and FIG. 48B, FIG. 49A and FIG. 49B, and FIG. 50A and FIG. 50B, in the semiconductor memory device 6 according to the embodiment, the control gate electrode film 21 formed in the slit ST is pulled out to the end part of the multilayer body 25 and connected to the upper select contact CS or the word line contact CW. In the embodiment, the silicon pillar 20 is divided only in the longitudinal direction (Y-direction) of the memory trench MT. The silicon pillar 20 is not divided in the width direction (X-direction), but provided over the entire length in the width direction.

The configuration, manufacturing method, and effect of the embodiment other than the foregoing are similar to those of the above first embodiment.

(Seventh Embodiment)

Next, a seventh embodiment is described.

The embodiment is different from the above sixth embodiment in that one end part of the slit ST is elongated.

Figure 51:
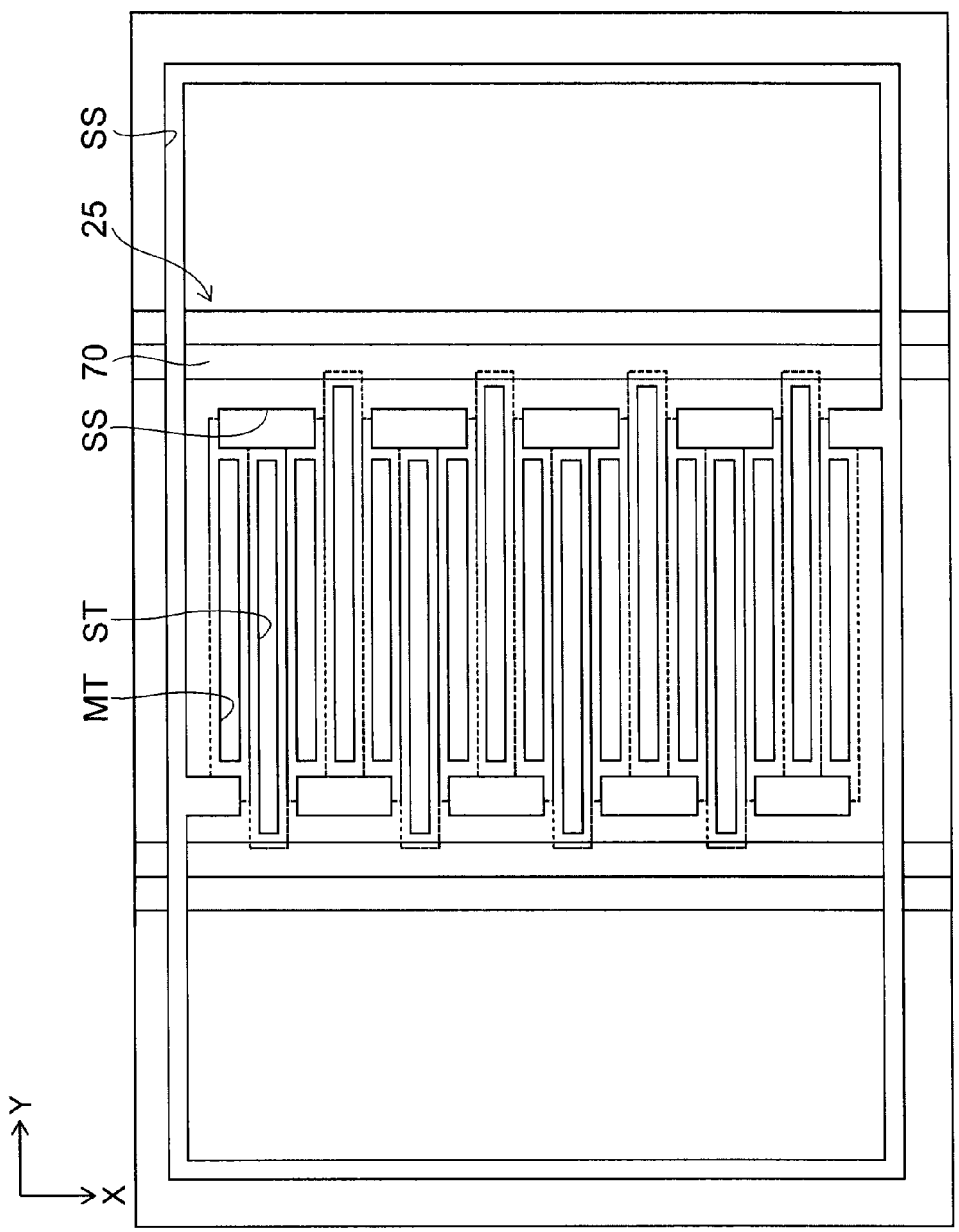
FIG. 51 is a plan view showing a method for manufacturing a semiconductor memory device according to a seventh embodiment.

FIG. 51 is a plan view showing a method for manufacturing a semiconductor memory device according to the embodiment.

First, as in the above sixth embodiment, as shown in FIG. 43 and FIG. 44, a slit SS and a memory trench MT are formed in the multilayer body 25.

Next, as shown in FIG. 51, a slit ST is formed in the multilayer body 25. At this time, the slit ST is made longer than the memory trench MT. From the portion surrounded on three sides with two memory trenches MT and one slit SS, one end part of the slit ST is extended out to the side in the Y-direction where the slit SS does not exist.

The subsequent manufacturing method is similar to that of the above sixth embodiment. Thus, the semiconductor memory device according to the embodiment is manufactured.

The configuration, manufacturing method, and effect of the embodiment other than the foregoing are similar to those of the above sixth embodiment.

(Eighth Embodiment)

Next, an eighth embodiment is described.

In the embodiment, a memory trench MT is formed in the region in which the memory trench MT and the slit SS are formed in the above sixth embodiment (see FIG. 44). That is, the memory trench MT is configured to double as a slit SS.

FIG. 52 to FIG. 55 are plan views showing a method for manufacturing a semiconductor memory device according to the embodiment.

Figure 52:
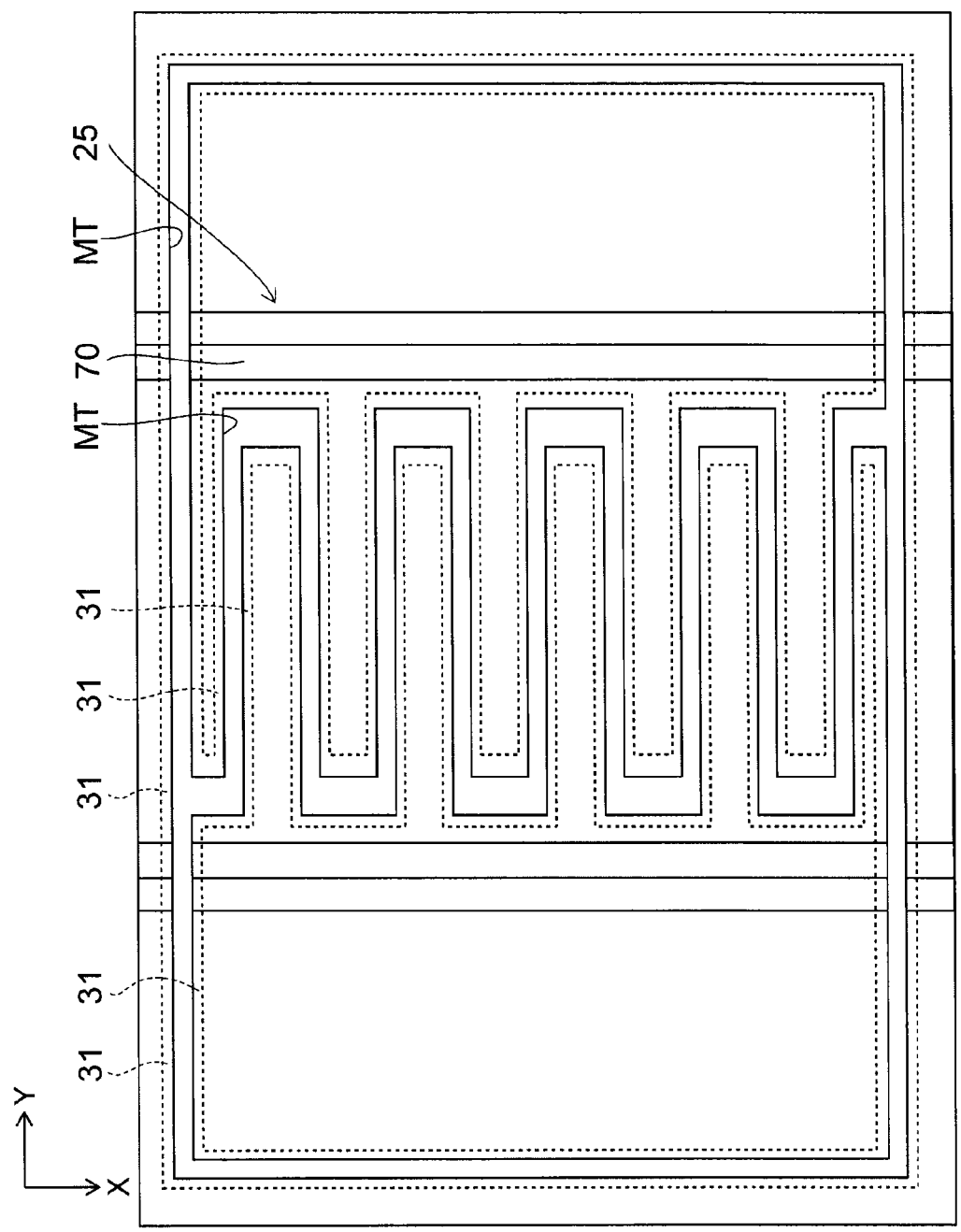
FIG. 52 to FIG. 55 are plan views showing a method for manufacturing a semiconductor memory device according to an eighth embodiment.

As shown in FIG. 52, the upper part of the multilayer body 25 is processed into a staircase pattern. Then, a memory trench MT is formed in the multilayer body 25. The memory trench MT includes a frame portion and a corrugated portion. The frame portion is formed so as to partition one block. The corrugated portion is formed inside the frame portion so as to extend in the X-direction while reciprocating along the Y-direction. Next, silicon pillars 20 and the like are formed along the side surface of the memory trench MT. Silicon oxide is embedded in the memory trench MT.

Figure 53:
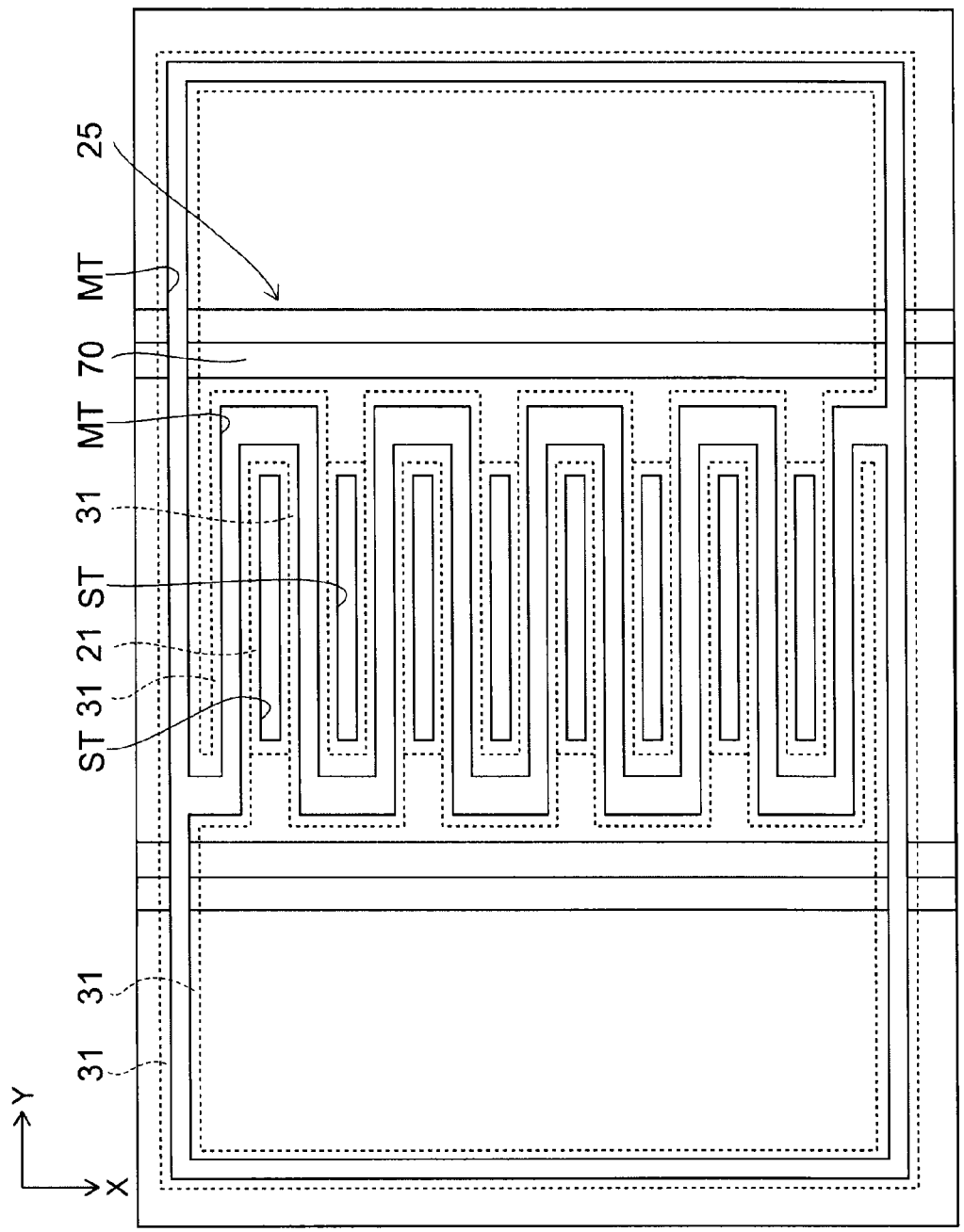

Next, as shown in FIG. 53, a slit ST is formed in the portion of the multilayer body 25 surrounded on three sides with the memory trench MT. At this time, in the Y-direction, the length of the slit ST is made equal to the length of the linear portion of the memory trench MT. Then, an insulating material is embedded in the slit ST.

Figure 54:
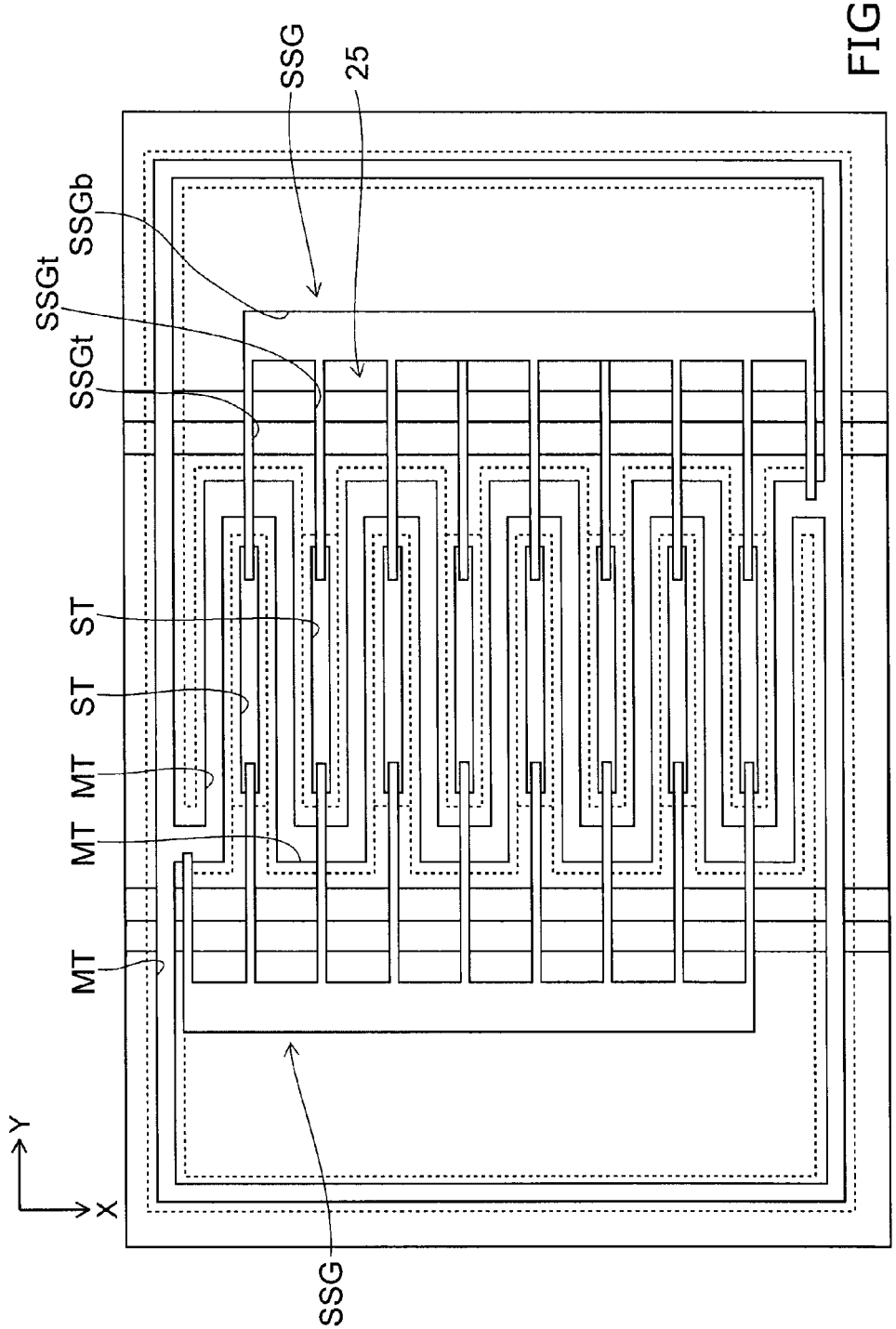

Next, as shown in FIG. 54, a slit SSG is formed in the upper part of the multilayer body 25. At this time, a tooth part SSGt of the slit SSG is formed for each of both end parts of the slit ST. The tooth parts SSGt are extended into both end parts of the slit ST. Then, an insulating material is embedded in the slit SSG.

Figure 55:
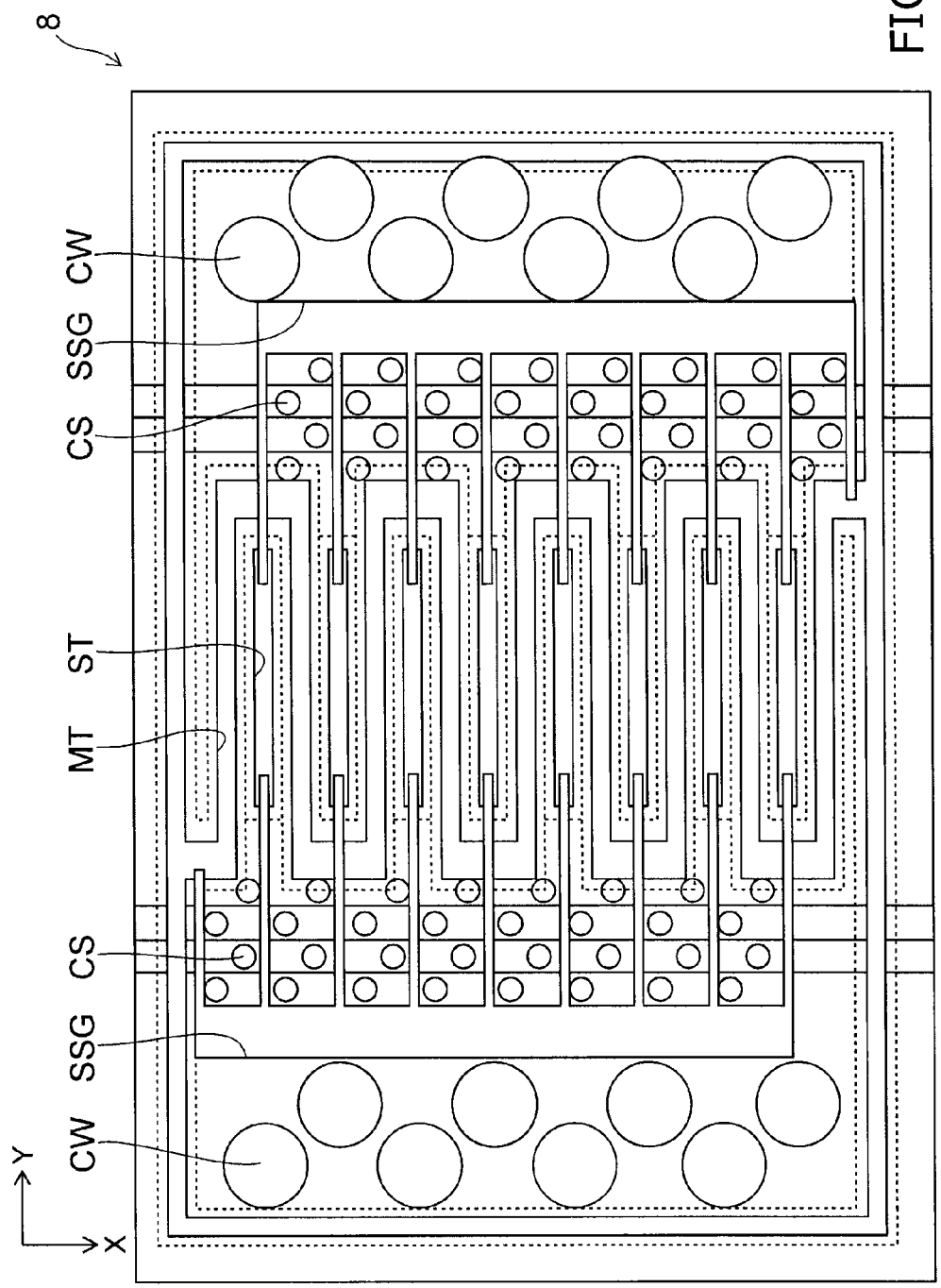

Next, as shown in FIG. 55, both Y-direction end parts of the portion of the multilayer body 25 other than the upper part are processed into a staircase pattern. An upper select contact CS and a word line contact CW are formed.

Next, word lines 39 and bit lines 29 (see FIG. 1) are formed. Thus, the semiconductor memory device 8 according to the embodiment is manufactured.

The configuration, manufacturing method, and effect of the embodiment other than the foregoing are similar to those of the above first embodiment.

(Ninth Embodiment)

Next, a ninth embodiment is described.

The embodiment is different from the above eighth embodiment in that one end part of the slit ST is elongated.

Figure 56:
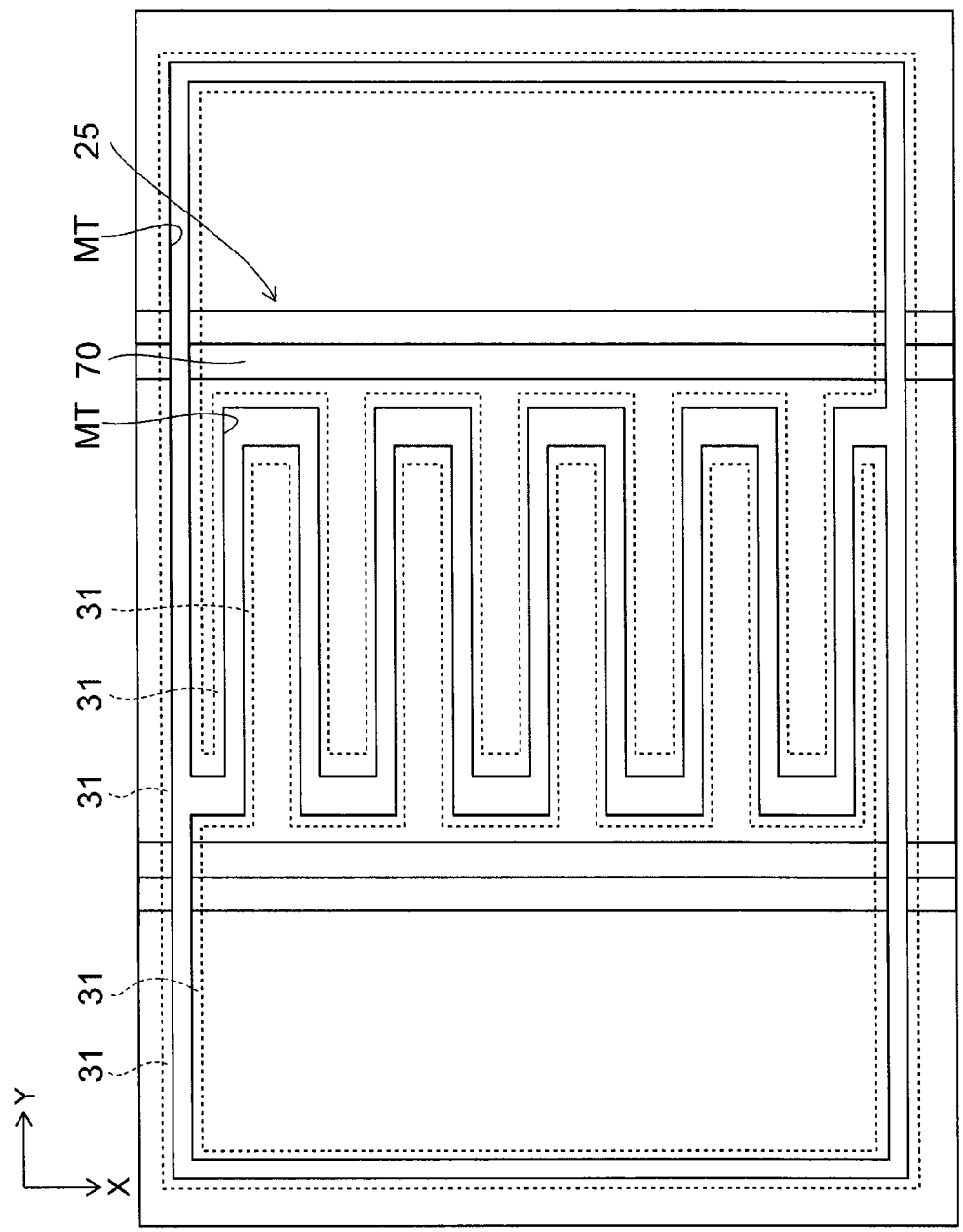
FIG. 56 to FIG. 58 are plan views showing a method for manufacturing a semiconductor memory device according to a ninth embodiment.
Figure 57:
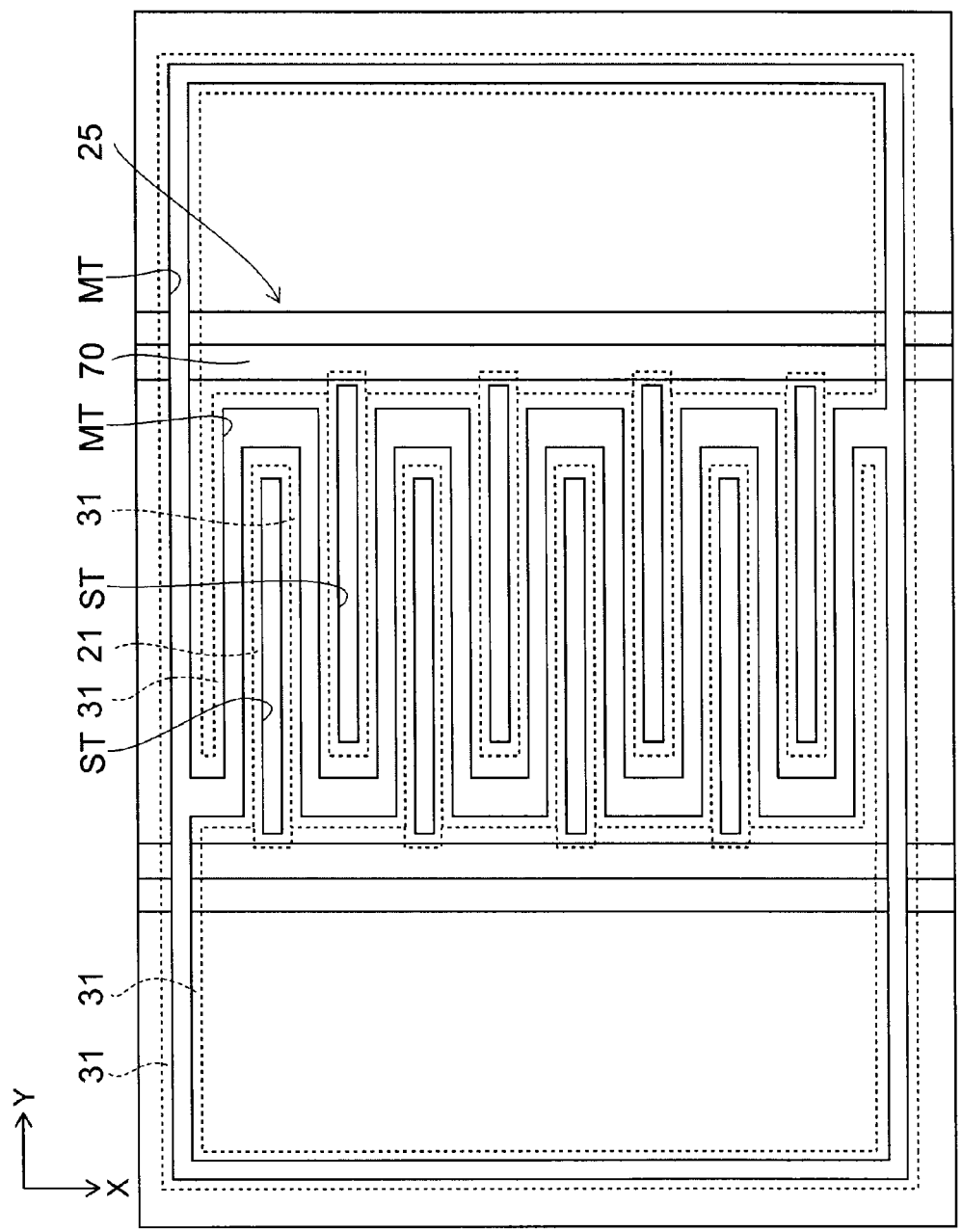
Figure 58:
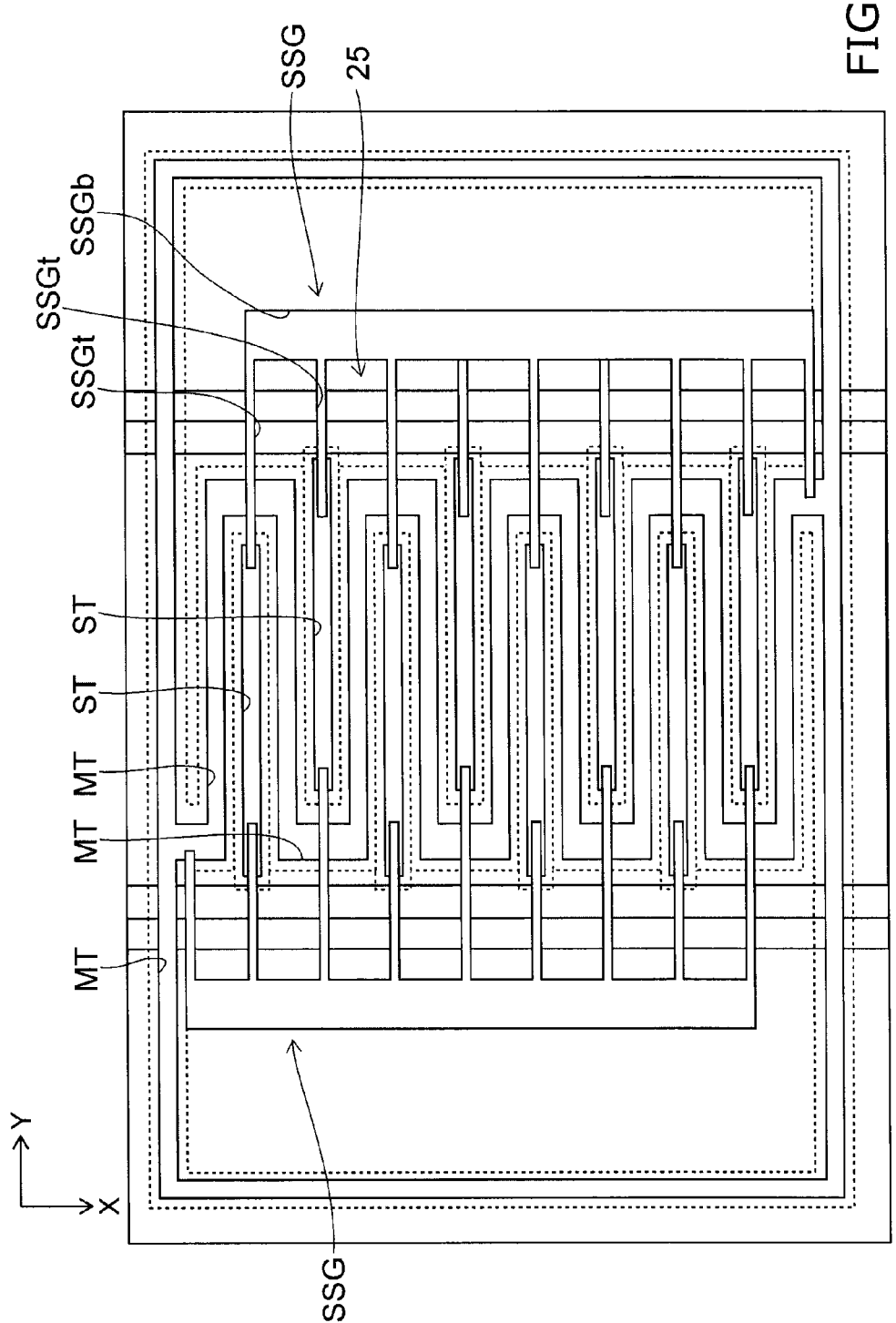

FIG. 56 to FIG. 58 are plan views showing a method for manufacturing a semiconductor memory device according to the embodiment.

First, as in the above eighth embodiment, as shown in FIG. 56, a memory trench MT is formed in the multilayer body 25. The memory trench MT includes a frame portion and a corrugated portion.

Next, as shown in FIG. 57, a slit ST is formed in the multilayer body 25. At this time, the slit ST is made longer than the memory trench MT. From the portion surrounded on three sides with the corrugated portion of the memory trenches MT, one end part of the slit ST is extended out to the side in the Y-direction where the memory trench MT does not exist.

Next, as shown in FIG. 58, a slit SSG is formed in the upper part of the multilayer body 25.

The subsequent manufacturing method is similar to that of the above eighth embodiment. Thus, the semiconductor memory device 9 according to the embodiment is manufactured.

The configuration, manufacturing method, and effect of the embodiment other than the foregoing are similar to those of the above sixth embodiment.

In the embodiment, as in the above variation (see FIG. 32) of the second embodiment, the extended portion of the slit ST may be formed thicker than the other portion. This can provide a larger margin for alignment when the slit SSG is formed.

(Tenth Embodiment)

Next, a tenth embodiment is described.

The embodiment is different from the above first embodiment in that two control gate electrode films 21 disposed on both sides of the memory trench MT are short-circuited.

FIG. 59 to FIG. 63 are plan views showing a method for manufacturing a semiconductor memory device according to the embodiment.

Figure 64A:
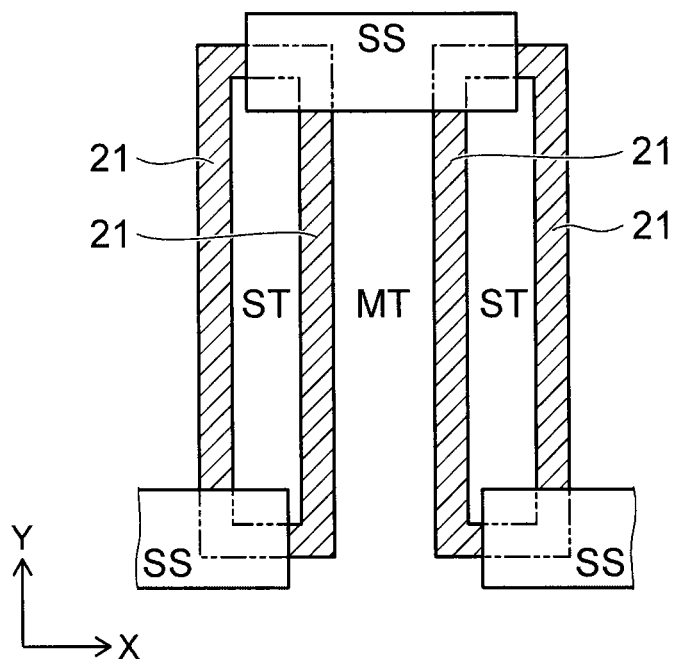
FIG. 64A is a plan view showing the relationship between the control gate electrode film and the slit in the tenth embodiment.
Figure 64B:
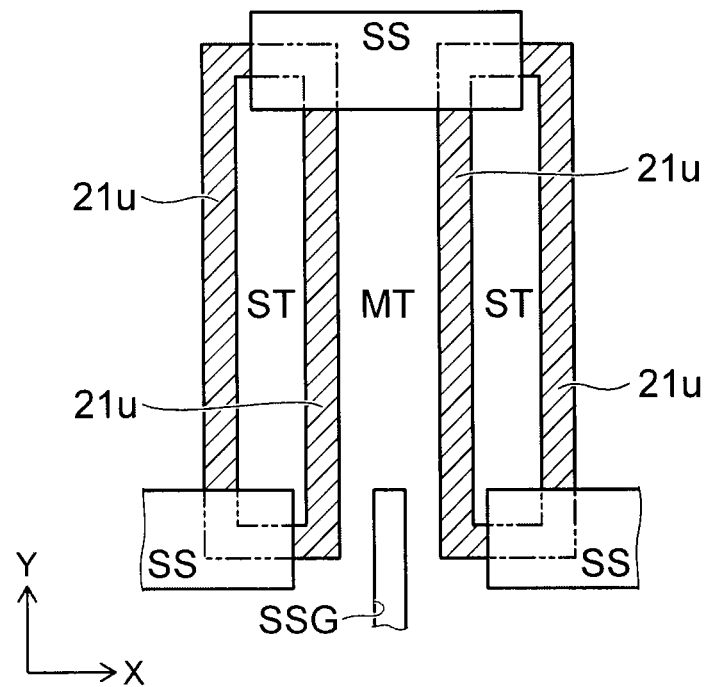
FIG. 64B is a plan view showing the relationship between the upper select gate 21u and the slit.

FIG. 64A is a plan view showing the relationship between the control gate electrode film and the slit in the embodiment. FIG. 64B is a plan view showing the relationship between the upper select gate 21u and the slit.

In FIG. 64A and FIG. 64B, for clarity of illustration, the control gate electrode film 21 and the upper select gate 21u are hatched.

Figure 59:
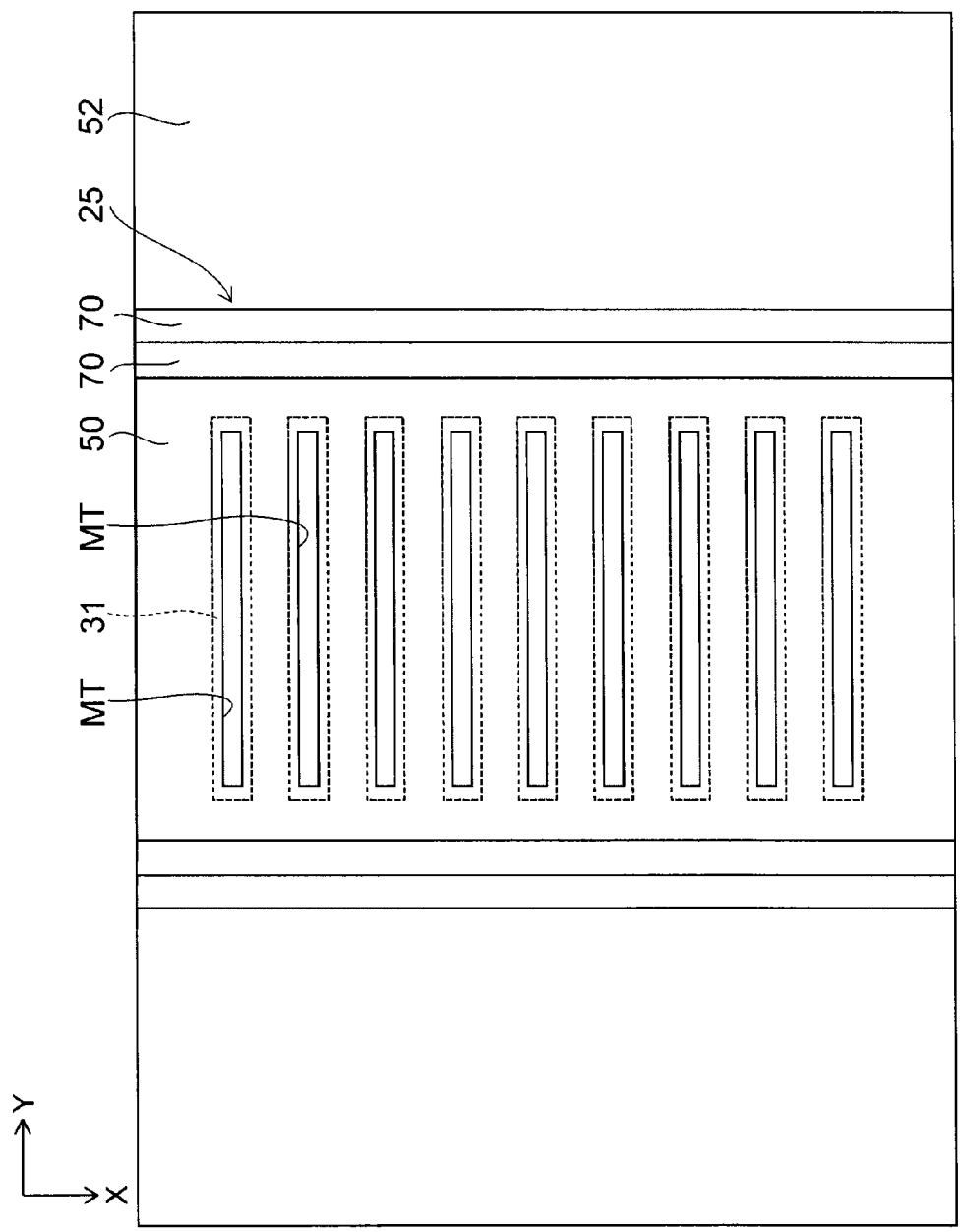
FIG. 59 to FIG. 63 are plan views showing a method for manufacturing a semiconductor memory device according to a tenth embodiment.

First, as shown in FIG. 59, a plurality of memory trenches MT extending in the Y-direction are formed in the multilayer body 25.

Figure 60:
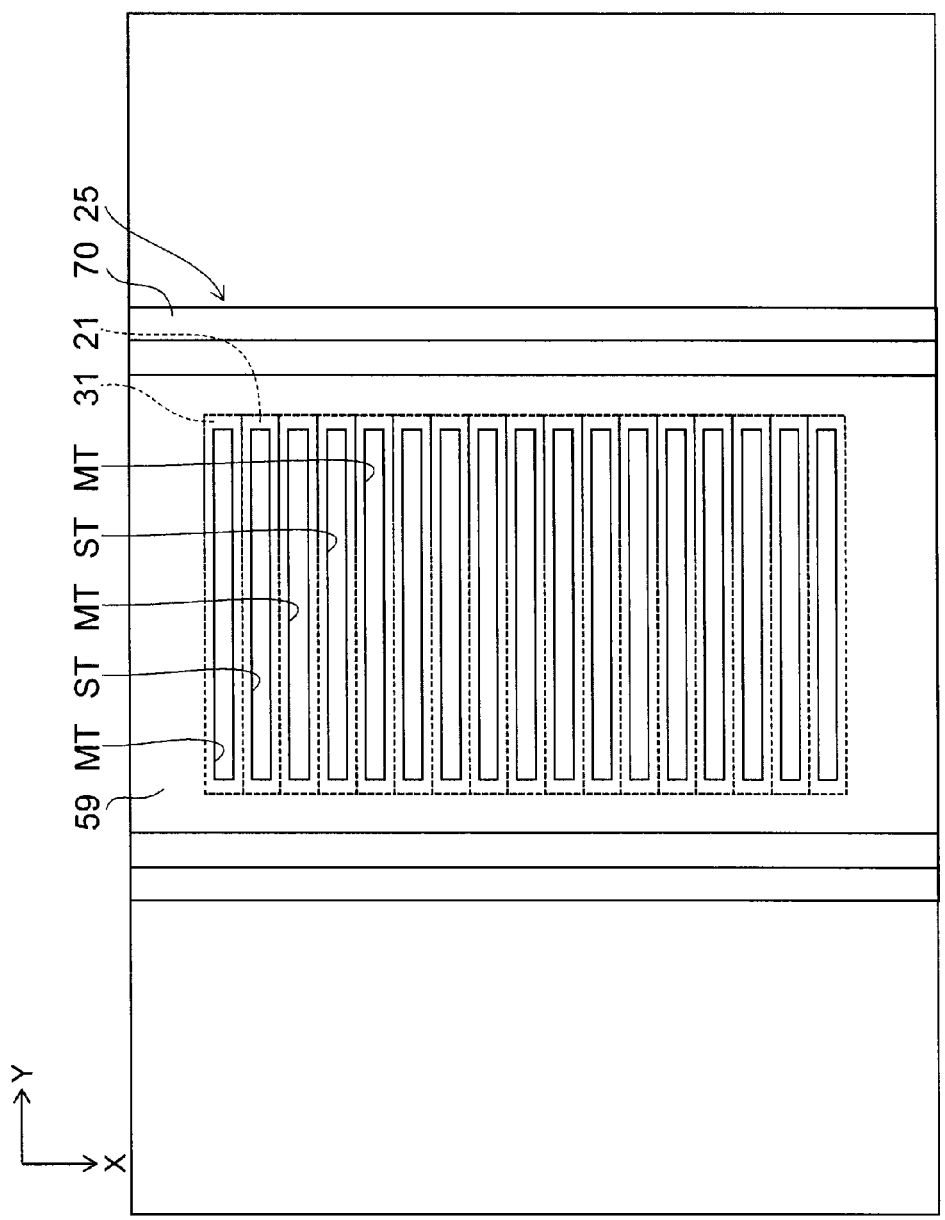

Next, as shown in FIG. 60, a slit ST extending in the Y-direction is formed in the portion of the multilayer body 25 between the memory trenches MT. In the Y-direction, the length of the slit ST is made equal to the length of the memory trench MT. Both end parts of the slit ST are located at the same position as both end parts of the memory trench MT. So far, the embodiment is similar to the above first embodiment.

Figure 61:
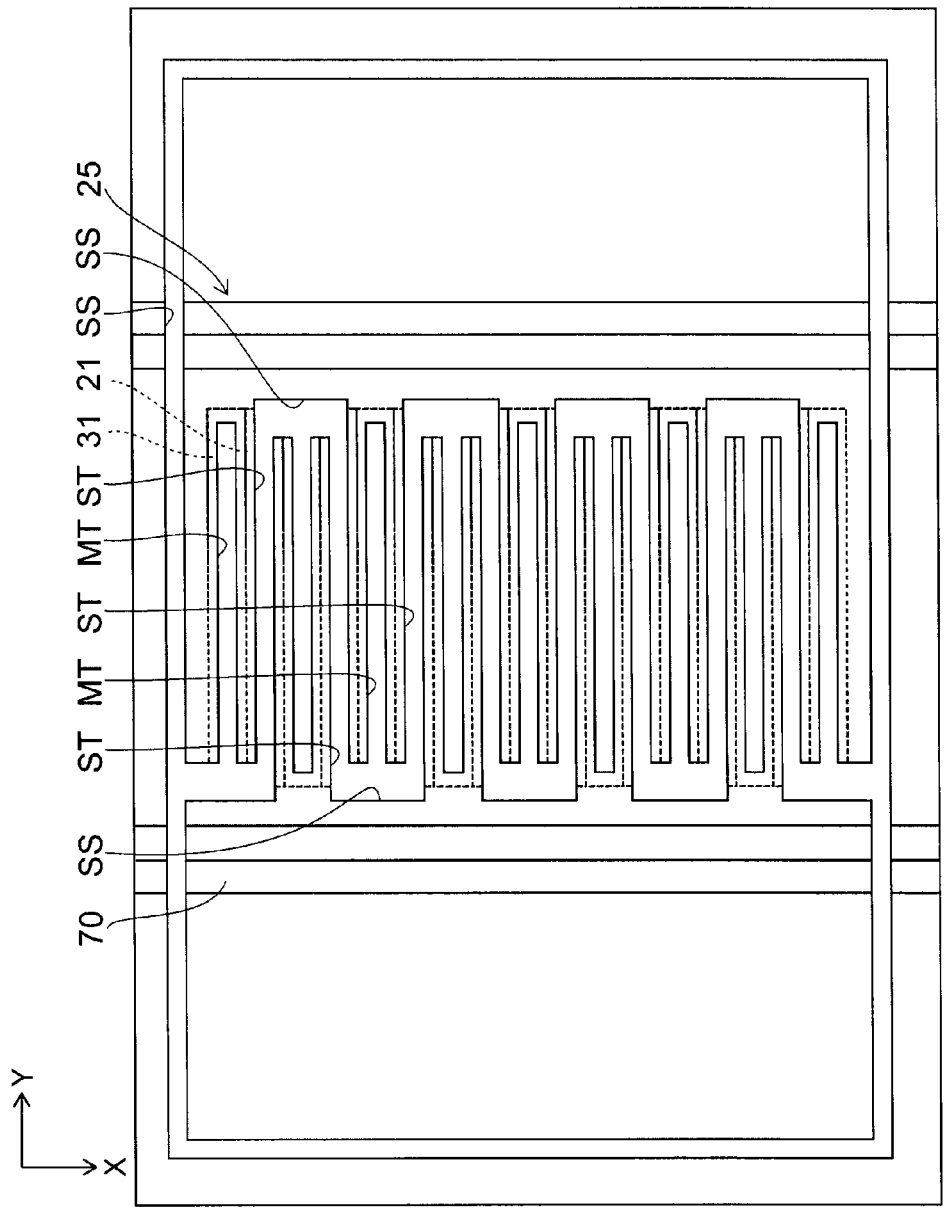

Next, as shown in FIG. 61, a plurality of slits SS are formed in the multilayer body 25. The slit SS includes a plurality of rectangular portions and a frame portion. The longitudinal direction of the rectangular portion is the X-direction. The frame portion surrounds each block. At this time, in contrast to the first embodiment, the rectangular portion of the slit SS is formed so as to link two adjacent slits ST with each other on one end part side in the Y-direction. In this case, the longitudinal central part of each rectangular portion is linked also with one Y-direction end part of the memory trench MT. Thus, the control gate electrode film 21 shaped like a loop surrounding the slit ST is cut in both Y-direction end parts. Accordingly, the loop of the control gate electrode film 21 surrounding the slit ST is cut at two sites and divided into two linear portions. On the other hand, two control gate electrode films 21 sandwiching the memory trench MT are short-circuited with each other by a polysilicon member processed simultaneously with the silicon pillar 20. Then, an insulating material such as silicon oxide is embedded in the slit SS.

Figure 62:
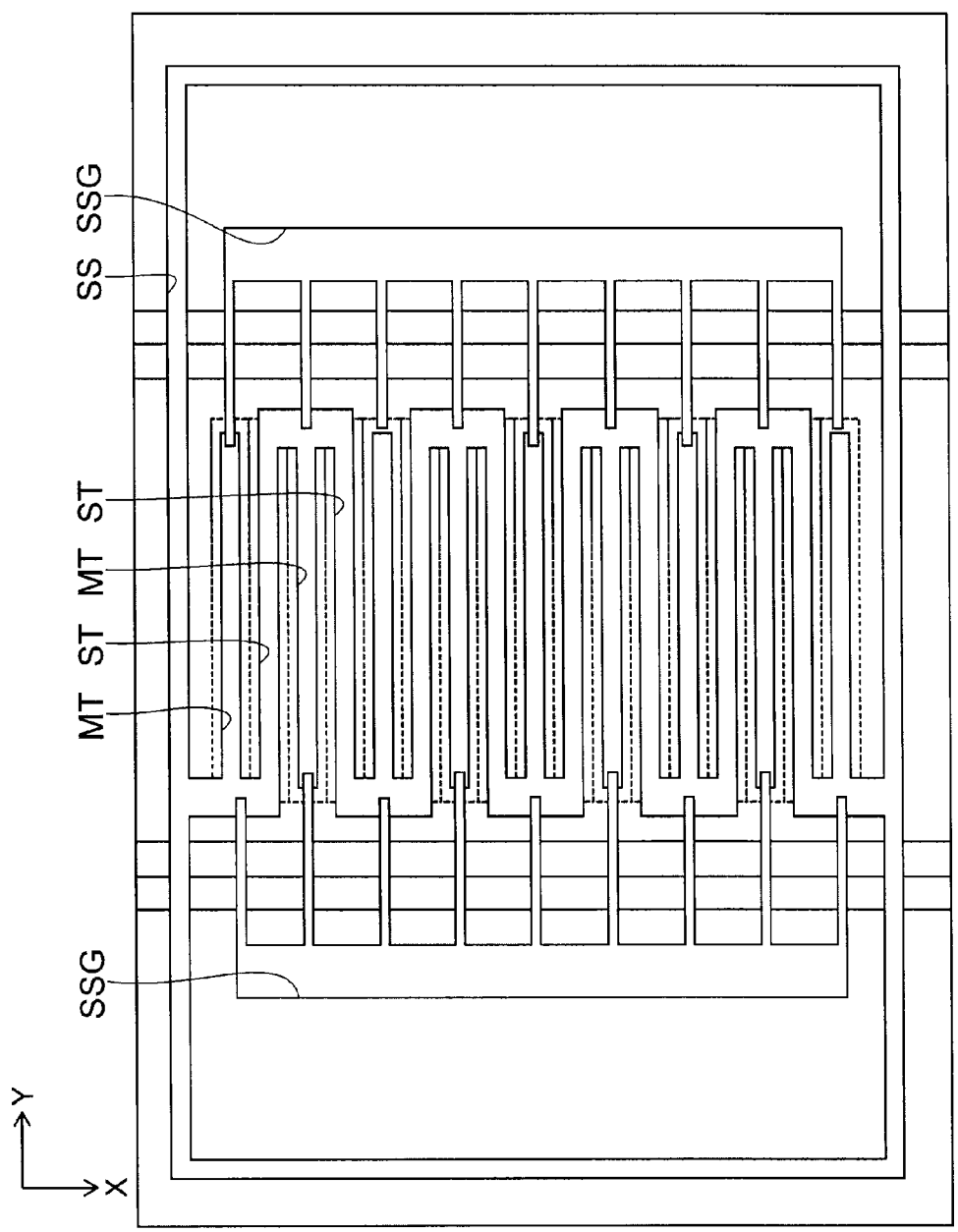

Next, as shown in FIG. 62, a slit SSG is formed in the upper part of the multilayer body 25. At this time, in contrast to the first embodiment, the tooth part SSGt of the slit SSG is extended into both end parts of the memory trench MT, rather than the slit ST. Then, an insulating material is embedded in the slit SSG.

Figure 63:
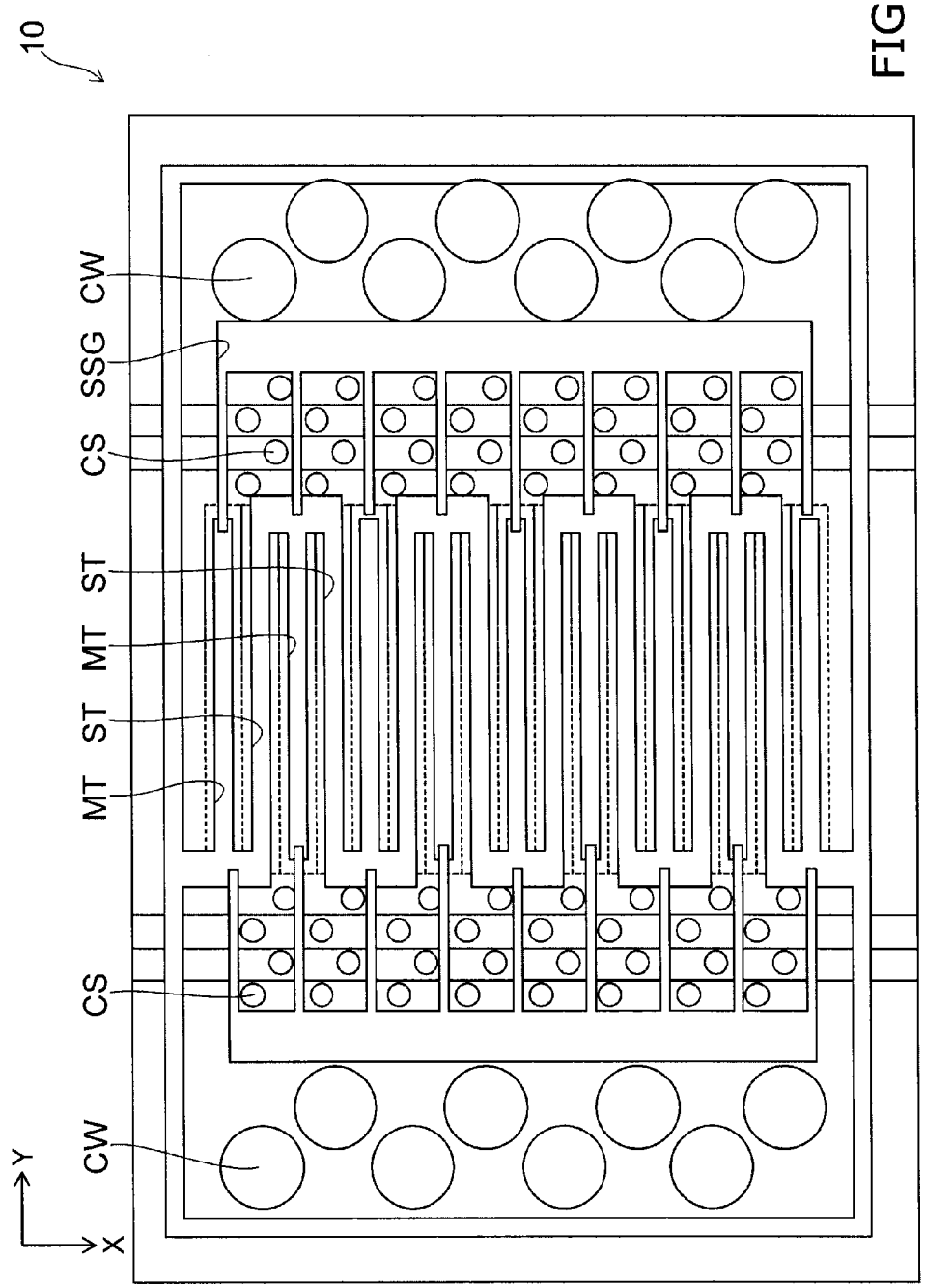

Next, as shown in FIG. 63, both Y-direction end parts of the portion of the multilayer body 25 other than the upper part are processed into a staircase pattern. An upper select contact CS and a word line contact CW are formed.

Next, word lines 39 and bit lines 29 (see FIG. 1) are formed.

Thus, the semiconductor memory device 10 according to the embodiment is manufactured.

As shown in FIG. 64A, after the control gate electrode film 21 is formed around the slit ST, both longitudinal (Y-direction) end parts of the slit ST are removed by the slit SS. Thus, two control gate electrode films 21 sandwiching the slit ST are isolated from each other. Two control gate electrode films 21 sandwiching the memory trench MT are short-circuited with each other.

As shown in FIG. 64B, the upper select gate 21u formed in the upper part of the multilayer body 25 is further cut by the slit SSG at the position of the memory trench MT. Thus, the upper select gate 21u is divided into line-shaped portions extending in the Y-direction.

In the semiconductor memory device 10, two control gate electrode films 21 disposed at the position sandwiching the memory trench MT are short-circuited. However, the upper select gate 21u is divided for each portion sandwiched by the memory trench MT and the slit ST.

The configuration, manufacturing method, and effect of the embodiment other than the foregoing are similar to those of the above first embodiment.

(Eleventh Embodiment)

Next, an eleventh embodiment is described.

The embodiment is a combination of the tenth embodiment and the second embodiment described above.

FIG. 65 to FIG. 69 are plan views showing a method for manufacturing a semiconductor memory device according to the embodiment.

Figure 65:
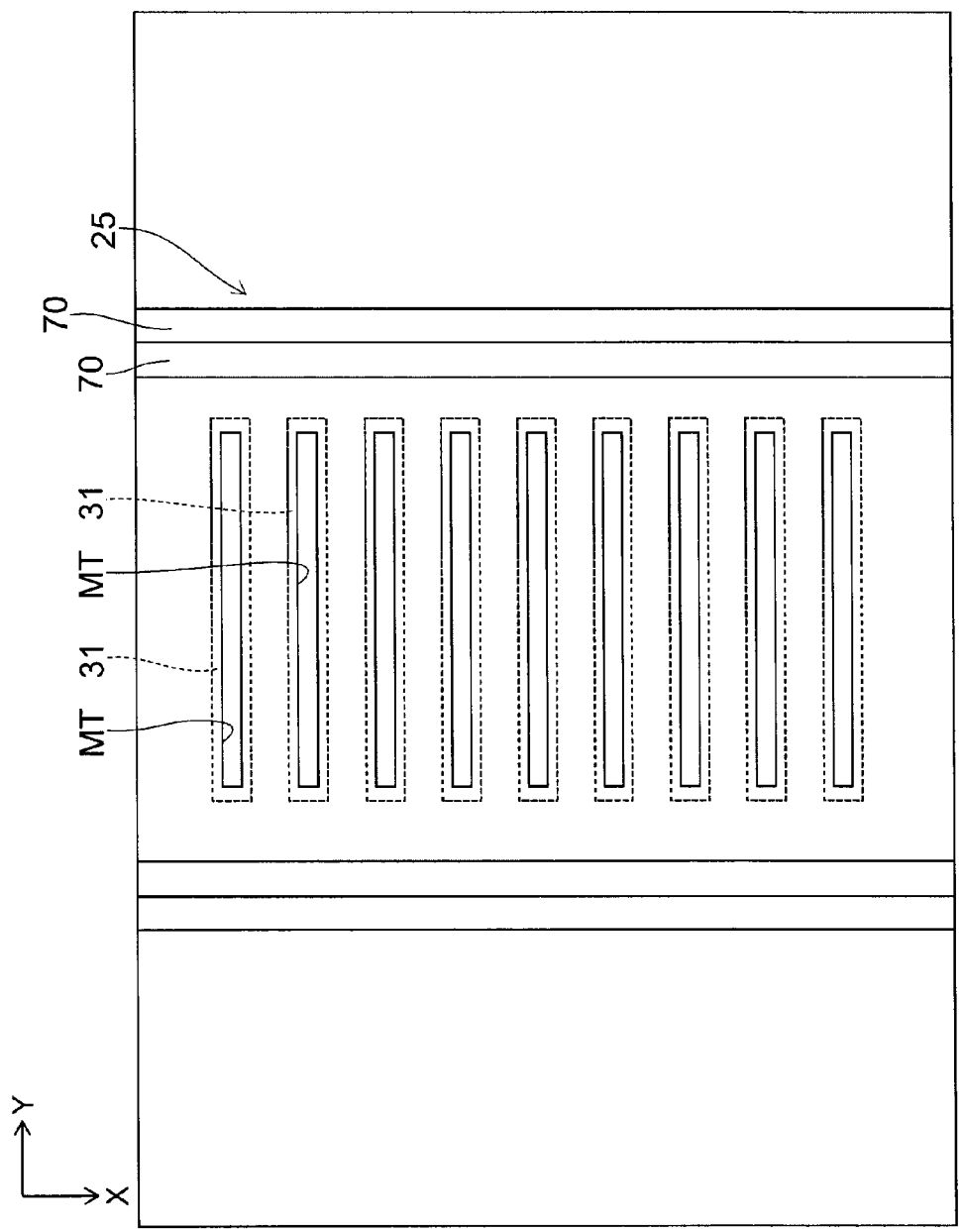
FIG. 65 to FIG. 69 are plan views showing a method for manufacturing a semiconductor memory device according to an eleventh embodiment.

First, as shown in FIG. 65, both Y-direction end parts of the upper part of the multilayer body 25 are processed into a staircase pattern. Then, a plurality of memory trenches MT extending in the Y-direction are formed. Specifically, the process shown in FIG. 7 to FIG. 17 is performed.

Figure 66:
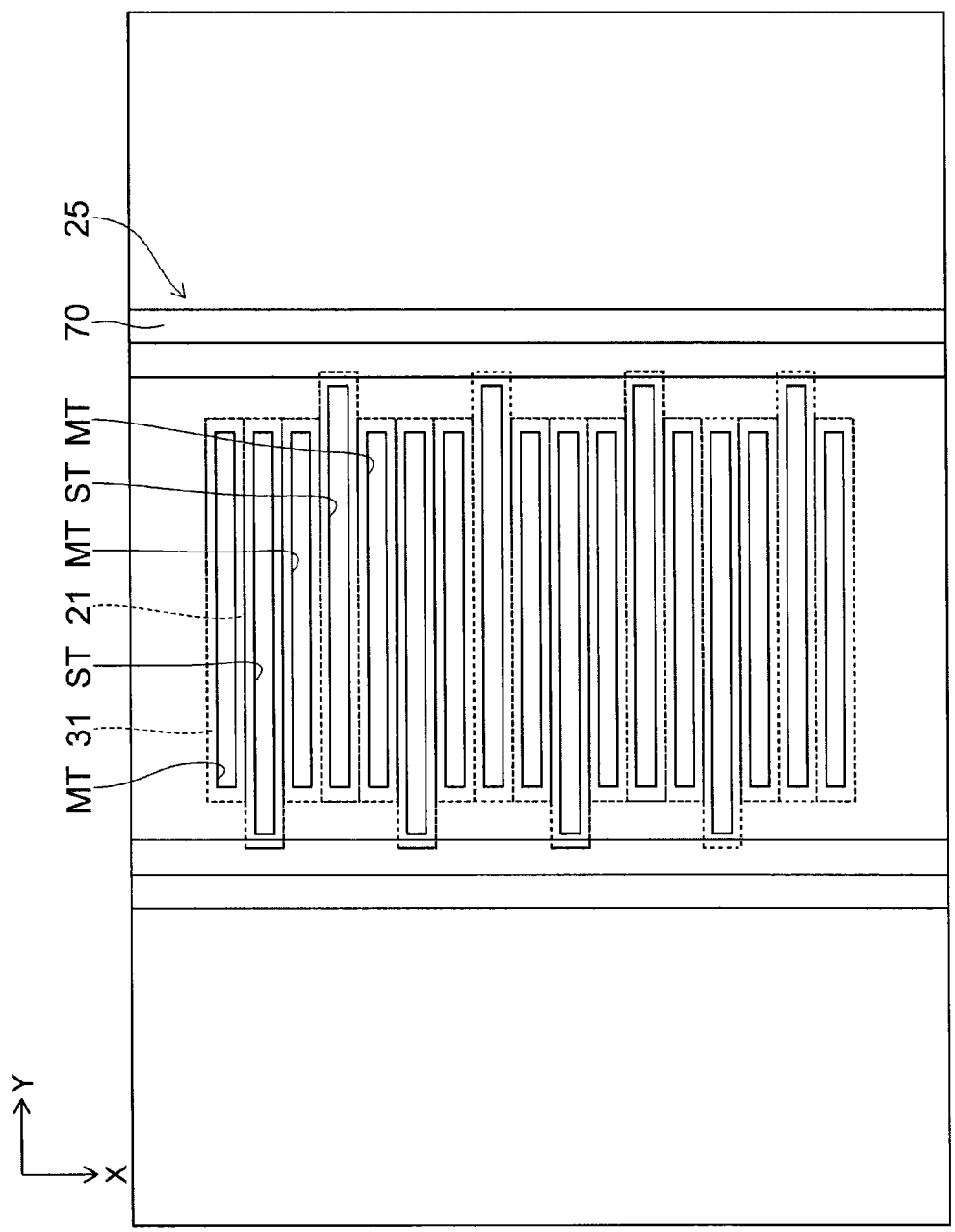

Next, as shown in FIG. 66, a slit ST is formed in the multilayer body 25. Specifically, the process shown in FIG. 18 to FIG. 20 is performed. At this time, the slit ST is made longer than the memory trench MT. One end part of the slit ST is alternately extended out from the region between the adjacent memory trenches MT.

Figure 67:
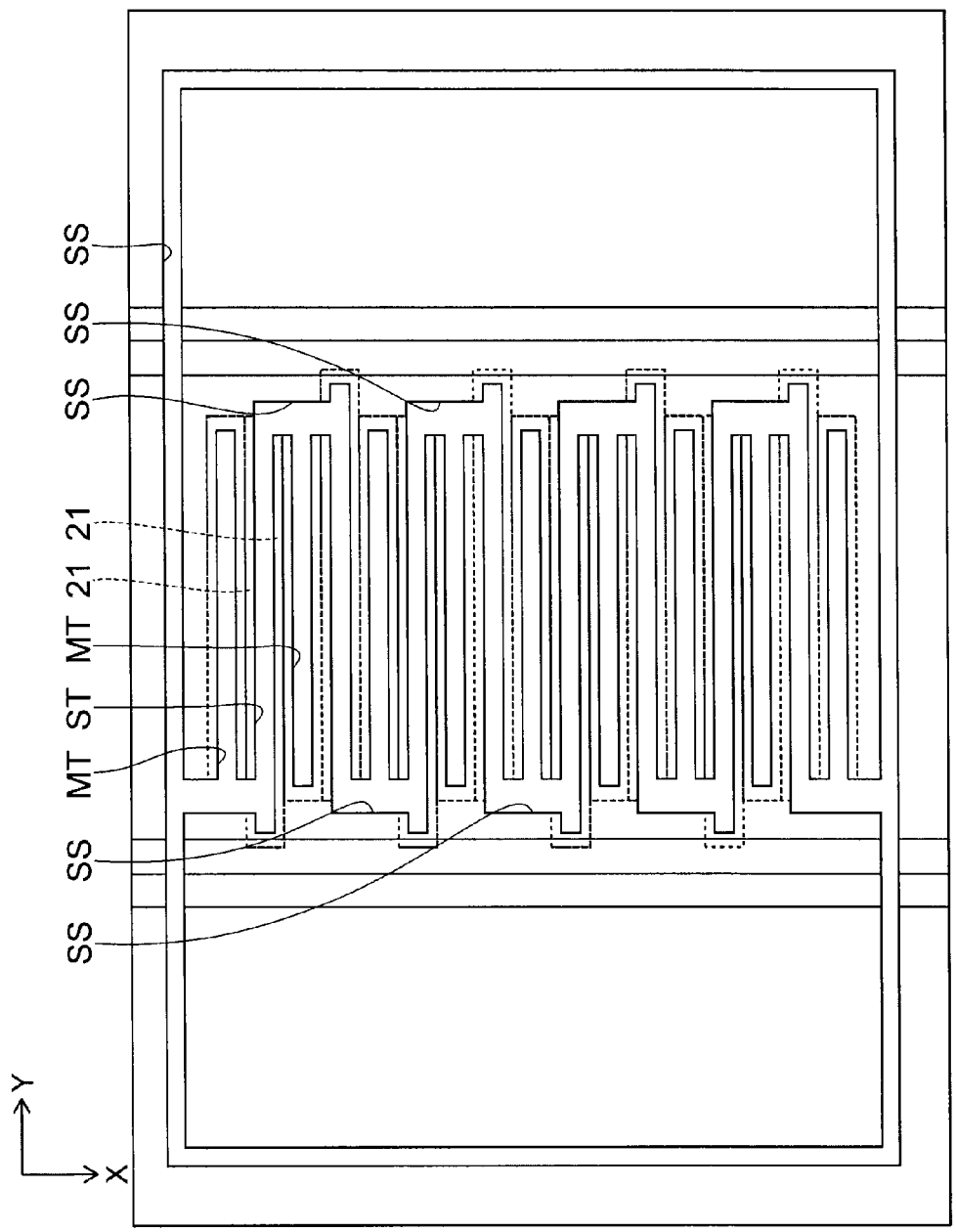

Next, as shown in FIG. 67, a slit SS is formed in the multilayer body 25. The rectangular portion of the slit SS is formed so as to link the slits ST with each other on one end part side. Thus, the control gate electrode film 21 shaped like a loop surrounding each slit ST is split into two.

Figure 68:
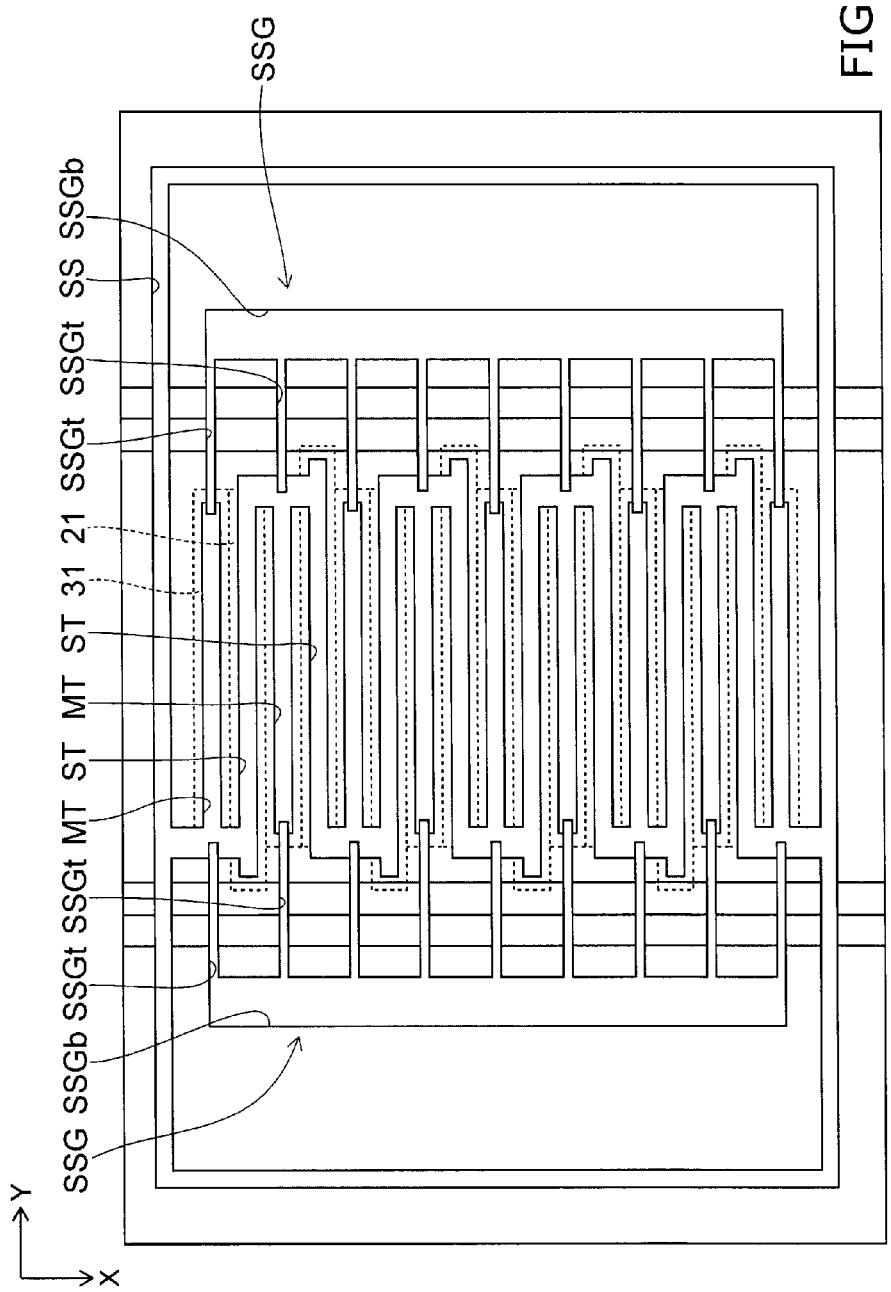

Next, as shown in FIG. 68, a slit SSG is formed in the upper part of the multilayer body 25. The tooth part SSGt of the slit SSG is extended into both end parts of the memory trench MT.

Figure 69:
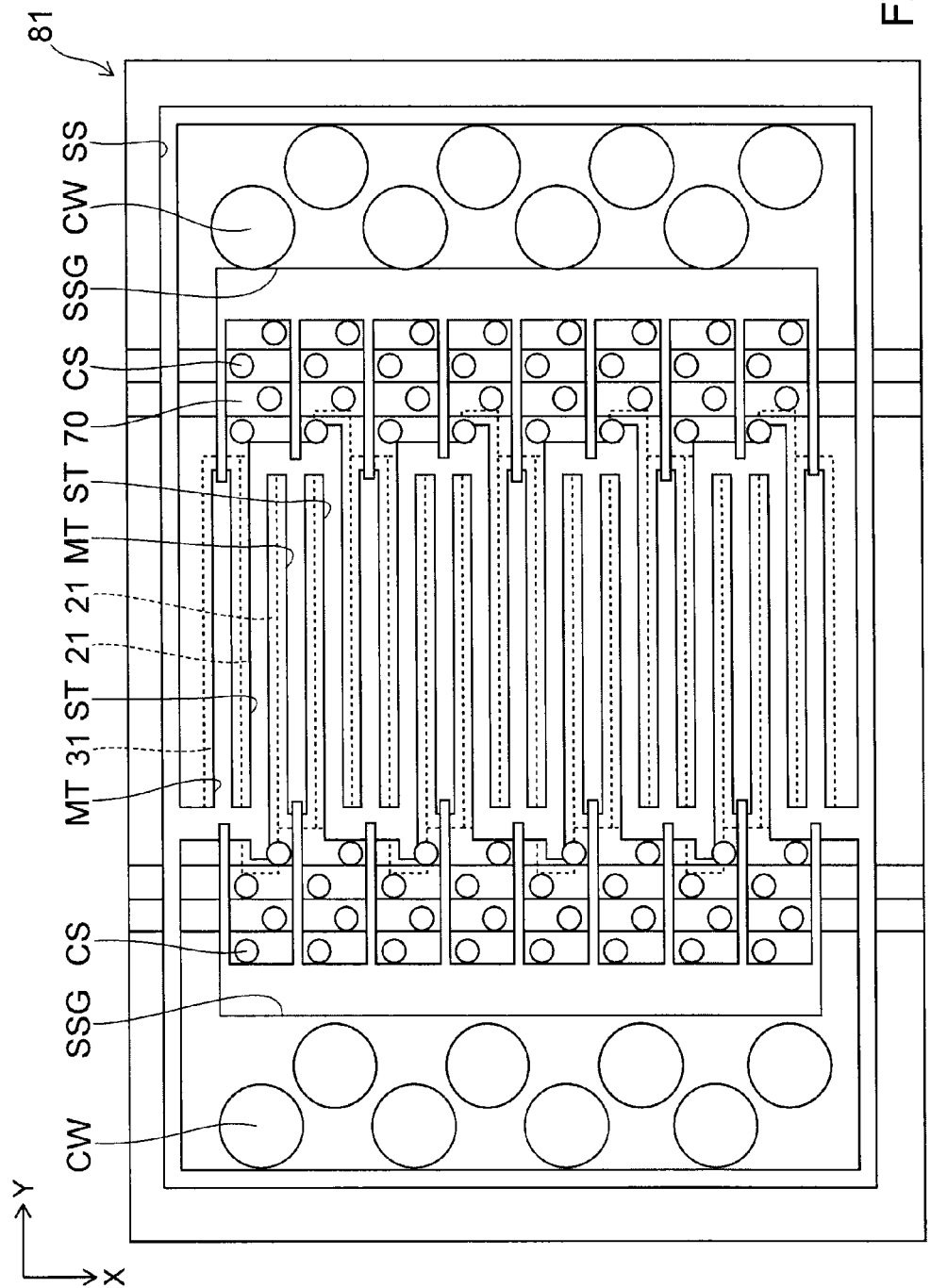

Next, as shown in FIG. 69, both Y-direction end parts of the portion of the multilayer body 25 other than the upper part are processed into a staircase pattern. An upper select contact CS and a word line contact CW are formed. Next, word lines 39 and bit lines 29 (see FIG. 1) are formed. Thus, the semiconductor memory device 81 according to the embodiment is manufactured. As shown in FIG. 67, in the semiconductor memory device 81 according to the embodiment, two control gate electrode films 21 disposed on both sides of the memory trench MT are short-circuited. Furthermore, one end part of the slit ST is elongated.

The configuration, manufacturing method, and effect of the embodiment other than the foregoing are similar to those of the tenth embodiment.

(Twelfth Embodiment)

Next, a twelfth embodiment is described.

The embodiment is a combination of the tenth embodiment and the third embodiment described above.

FIG. 70 to FIG. 74 are plan views showing a method for manufacturing a semiconductor memory device according to the embodiment.

Figure 70:
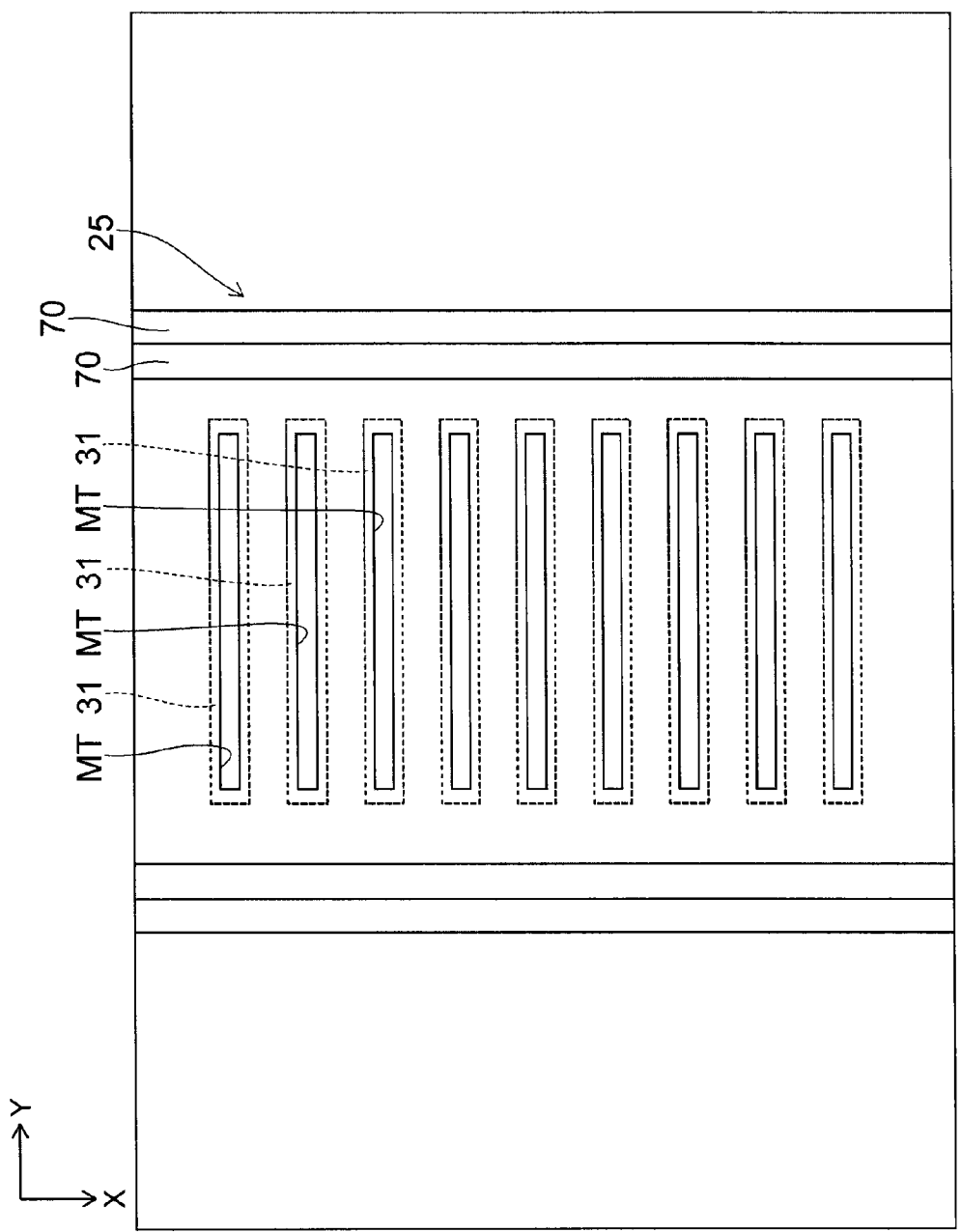
FIG. 70 to FIG. 74 are plan views showing a method for manufacturing a semiconductor memory device according to a twelfth embodiment.

First, as shown in FIG. 70, both Y-direction end parts of the upper part of the multilayer body 25 are processed into a staircase pattern. Then, a plurality of memory trenches MT extending in the Y-direction are formed.

Figure 71:
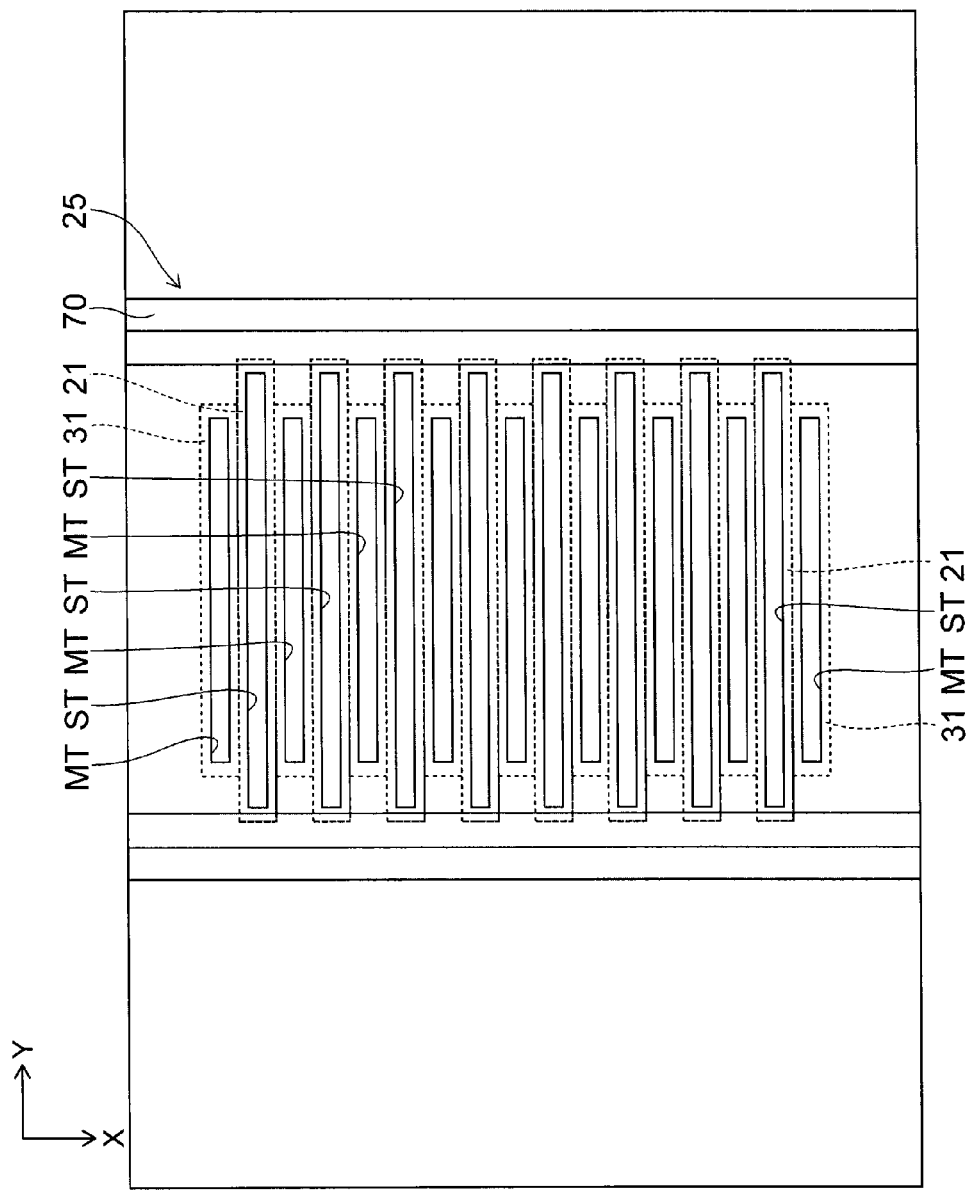

Next, as shown in FIG. 71, a slit ST is formed in the multilayer body 25. At this time, the slit ST is made longer than the memory trench MT. Both end parts of the slit ST are extended out from the region between the adjacent memory trenches MT.

Figure 72:
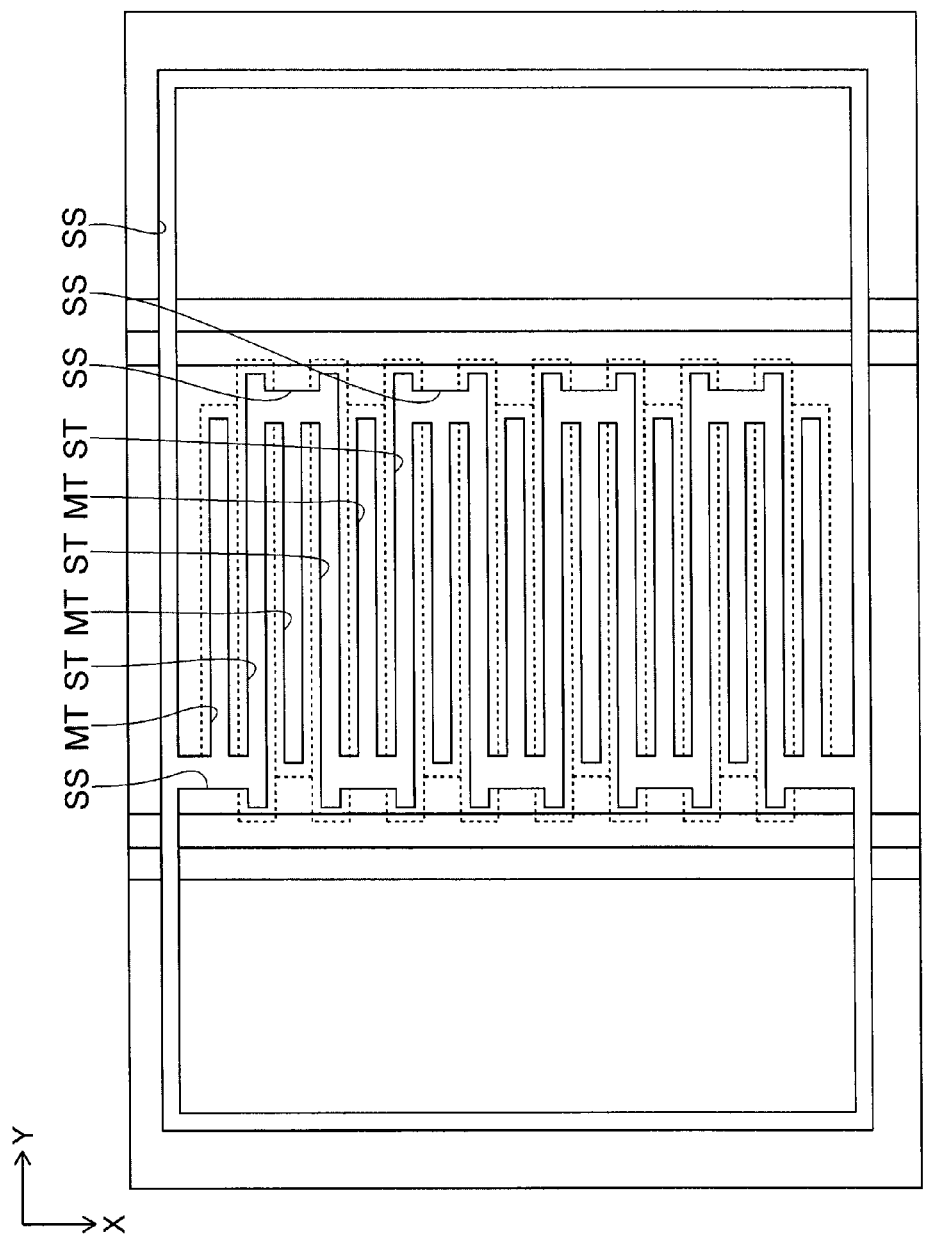

Next, as shown in FIG. 72, a slit SS is formed in the multilayer body 25. The rectangular portion of the slit SS is formed so as to link the slits ST with each other on one end part side. However, the longitudinal central part of the slit SS is superposed on one end part of the memory trench MT. Thus, the control gate electrode film 21 shaped like a loop surrounding each slit ST is split into two.

Figure 73:
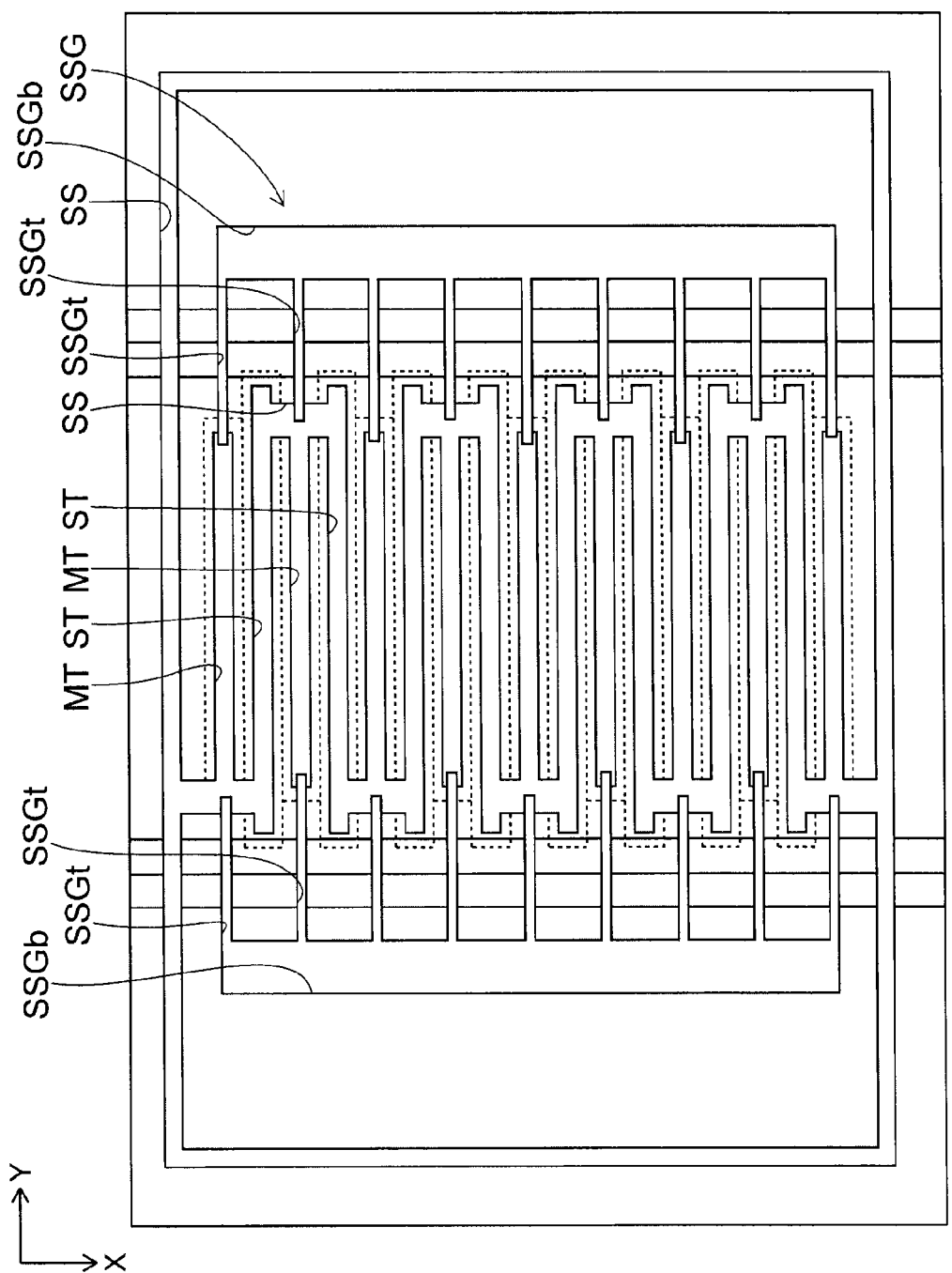

Next, as shown in FIG. 73, a slit SSG is formed in the upper part of the multilayer body 25. The tooth part SSGt of the slit SSG is extended into one end part of the memory trench MT, and into the slit SS disposed on the other end part side of the memory trench MT.

Figure 74:
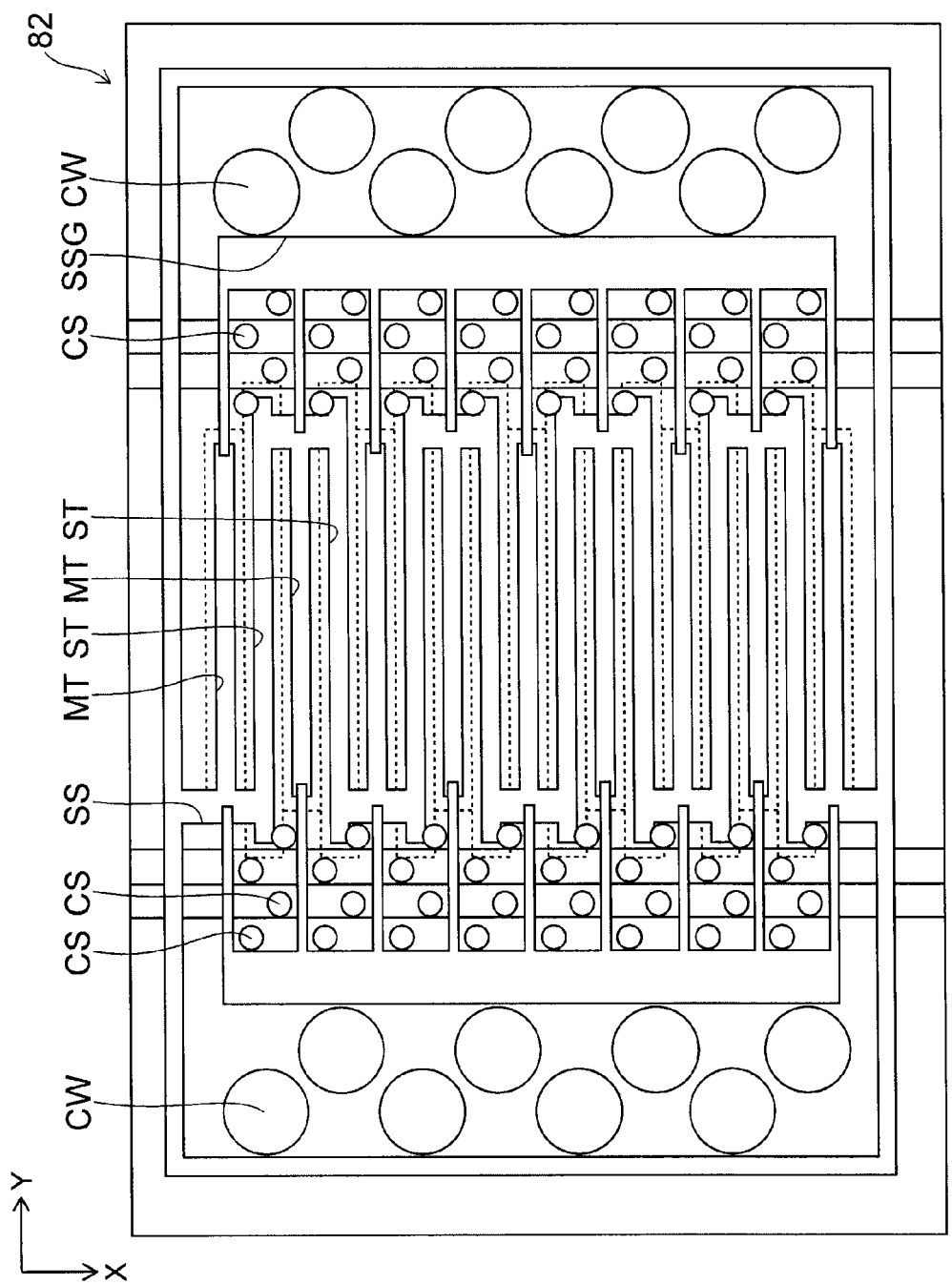

Next, as shown in FIG. 74, both Y-direction end parts of the portion of the multilayer body 25 other than the upper part are processed into a staircase pattern. An upper select contact CS and a word line contact CW are formed. Thus, the semiconductor memory device 82 according to the embodiment is manufactured.

As shown in FIG. 74, in the semiconductor memory device 82 according to the embodiment, two control gate electrode films 21 disposed on both sides of the memory trench MT are short-circuited. Furthermore, both end parts of the slit ST are elongated.

The configuration, manufacturing method, and effect of the embodiment other than the foregoing are similar to those of the tenth embodiment.

(Thirteenth Embodiment)

Next, a thirteenth embodiment is described.

The embodiment is a combination of the tenth embodiment and the fourth embodiment described above. That is, in the embodiment, the slit SS is formed before the slit ST. Furthermore, two control gate electrode films 21 disposed on both sides of the memory trench MT are short-circuited.

FIG. 75 to FIG. 79 are plan views showing a method for manufacturing a semiconductor memory device according to the embodiment.

Figure 75:
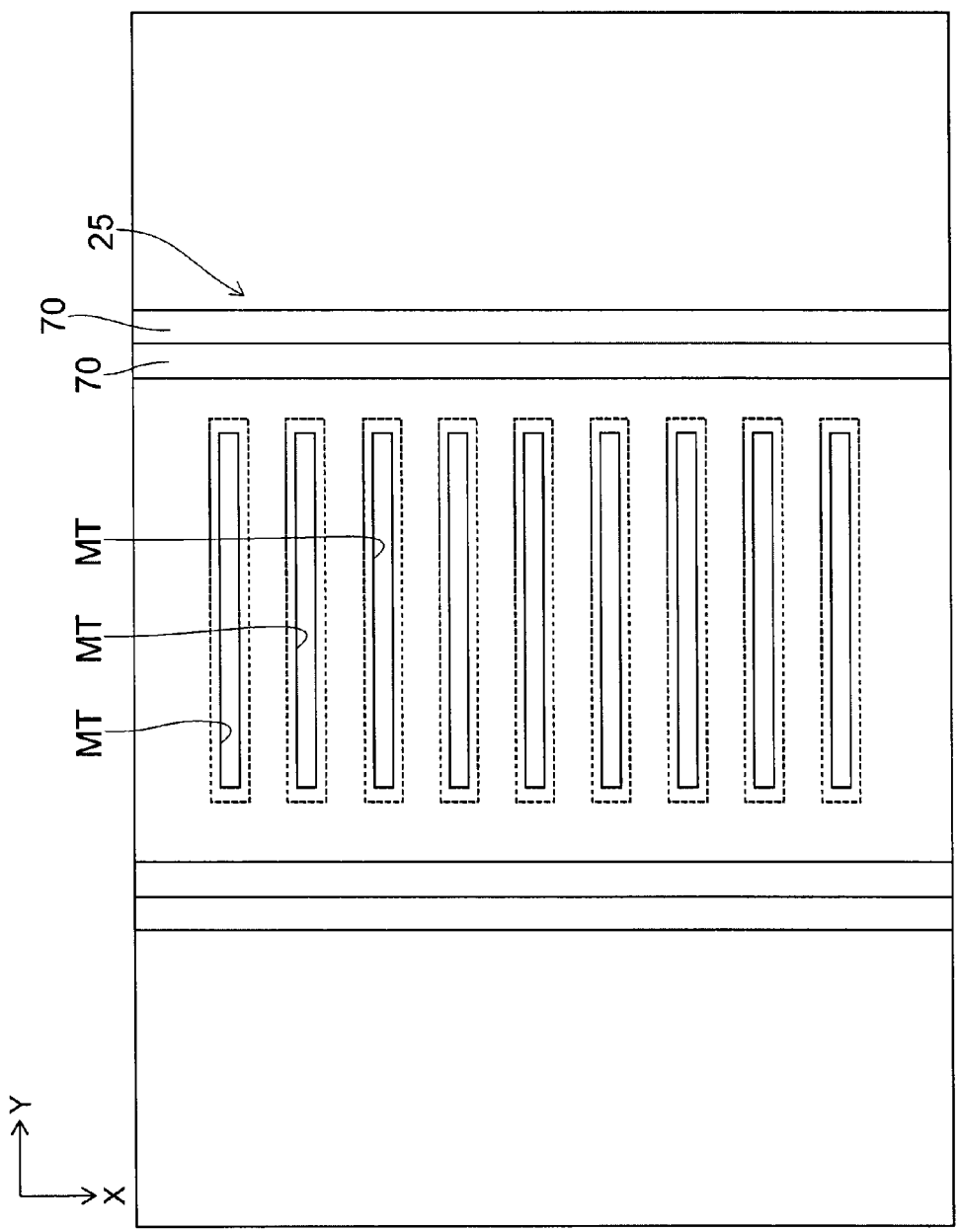
FIG. 75 to FIG. 79 are plan views showing a method for manufacturing a semiconductor memory device according to a thirteenth embodiment.

First, as shown in FIG. 75, both Y-direction end parts of the upper part of the multilayer body 25 are processed into a staircase pattern. Then, a plurality of memory trenches MT extending in the Y-direction are formed.

Figure 76:
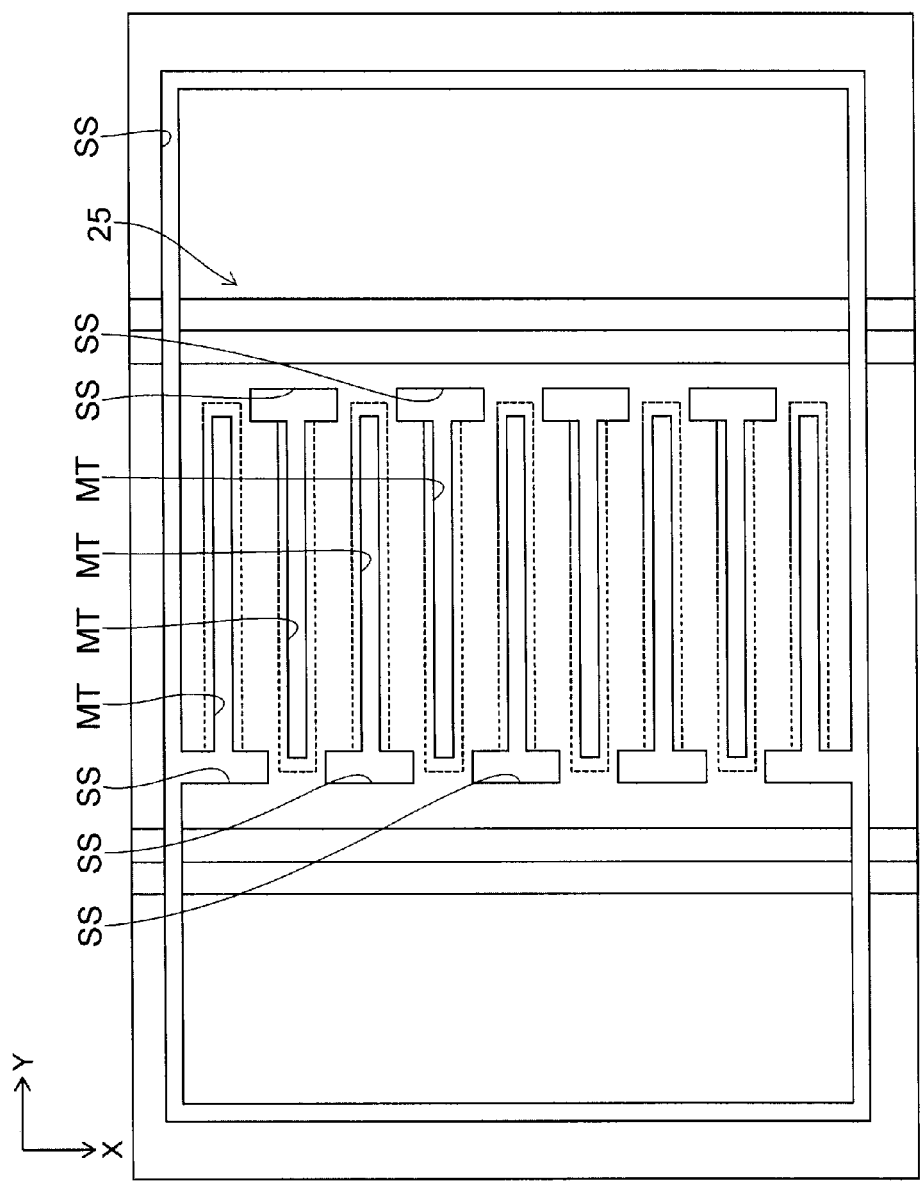

Next, as shown in FIG. 76, a slit SS is formed in the multilayer body 25. The slit SS includes a frame portion and a plurality of rectangular portions. The frame portion partitions the multilayer body 25 into blocks. The rectangular portions are disposed in the frame portion. The longitudinal direction of each rectangular portion is the X-direction. The longitudinal central part of the slit SS is caused to communicate with one end part of the memory trench MT. Next, silicon oxide, for instance, is embedded in the slit SS.

Figure 77:
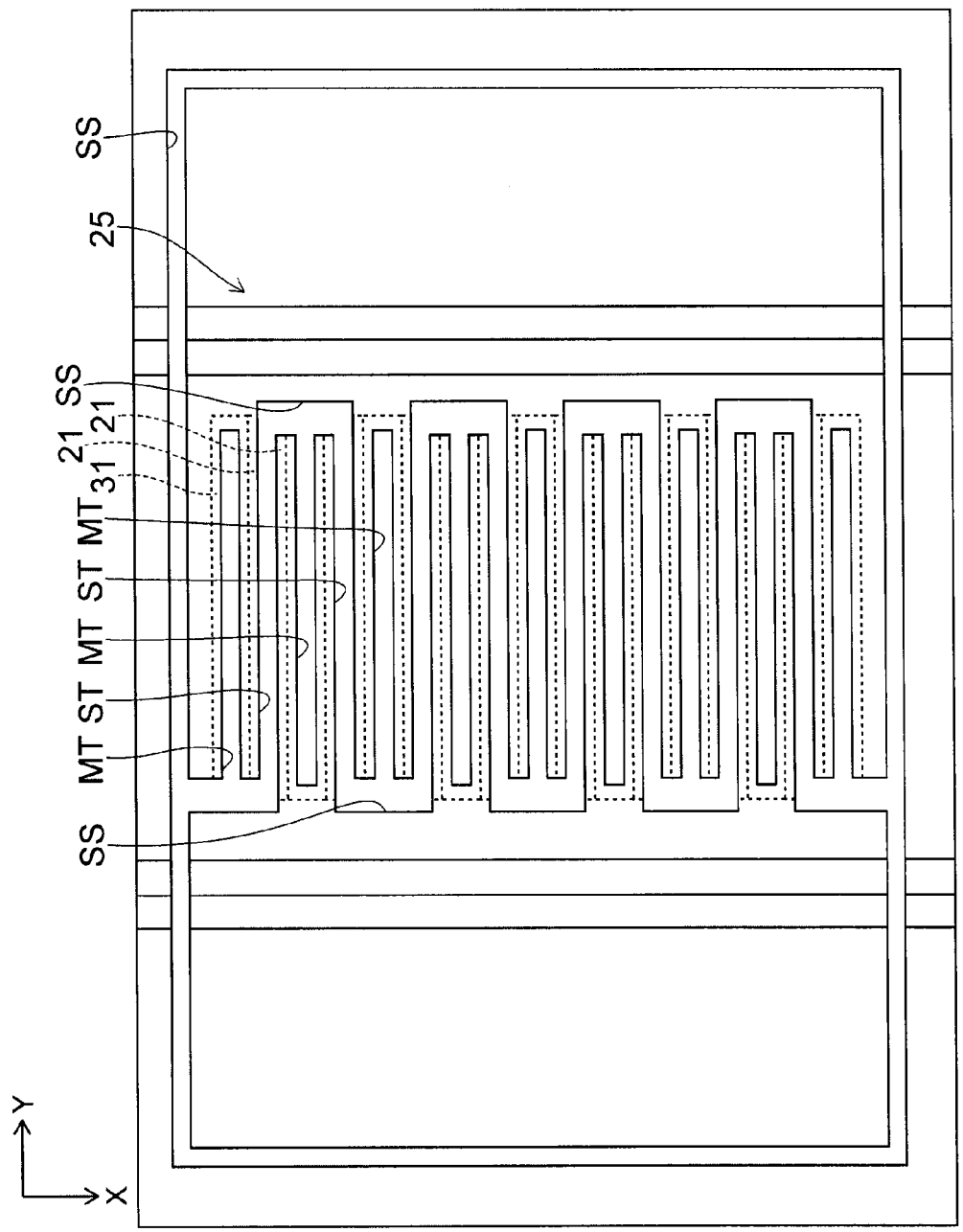

Next, as shown in FIG. 77, a slit ST extending in the Y-direction is formed in the region of the multilayer body 25 between the memory trenches MT. The longitudinal end part of the slit ST is caused to communicate with the longitudinal end part of the slit SS. At this time, silicon oxide has already been embedded in the slit SS, and the polysilicon film 52 does not exist. Thus, no control gate electrode film 21 is formed.

Figure 78:
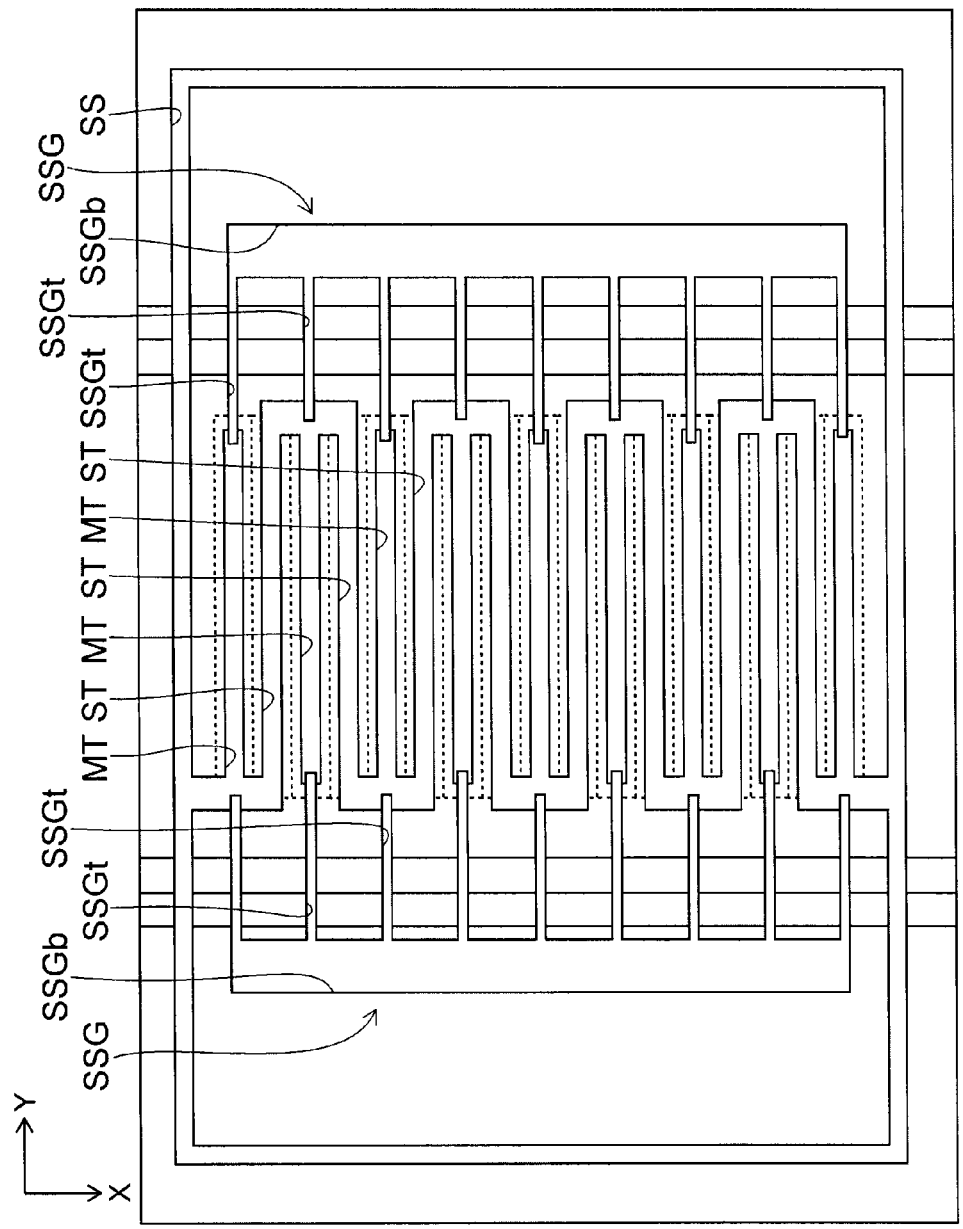

Next, as shown in FIG. 78, a slit SSG is formed in the upper part of the multilayer body 25. The tooth part SSGt of the slit SSG is extended into one end part of the memory trench MT, and into the slit SS disposed on the other end part side of the memory trench MT.

Figure 79:
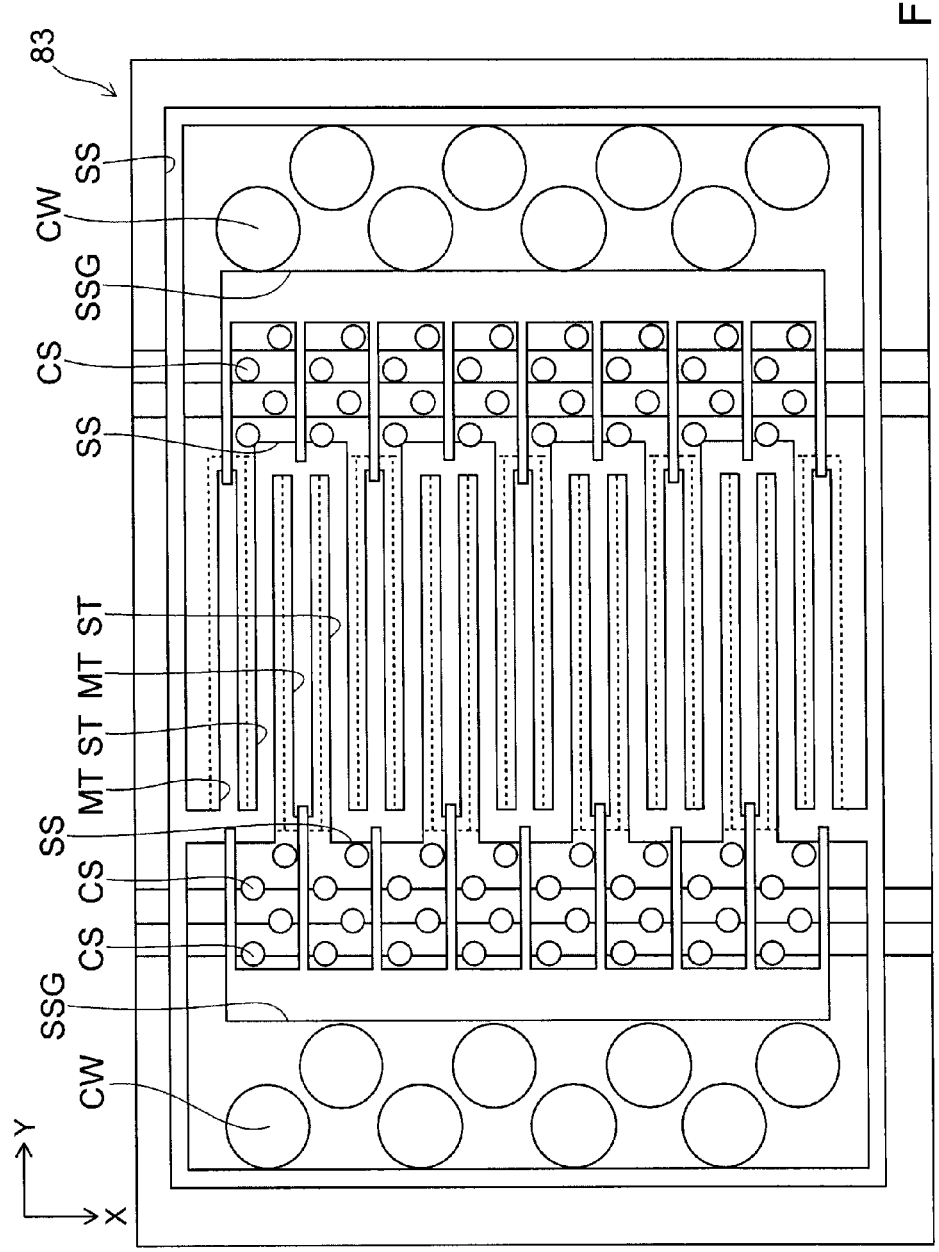

Next, as shown in FIG. 79, both Y-direction end parts of the portion of the multilayer body 25 other than the upper part are processed into a staircase pattern. An upper select contact CS and a word line contact CW are formed. Thus, the semiconductor memory device 83 according to the embodiment is manufactured.

The configuration, manufacturing method, and effect of the embodiment other than the foregoing are similar to those of the tenth embodiment.

(Fourteenth Embodiment)

Next, a fourteenth embodiment is described.

The embodiment is a combination of the tenth embodiment and the fifth embodiment described above. That is, in the embodiment, the slit SS is formed before the slit ST. One end part of the slit ST is elongated. Furthermore, two control gate electrode films 21 disposed on both sides of the memory trench MT are short-circuited.

Figure 80:
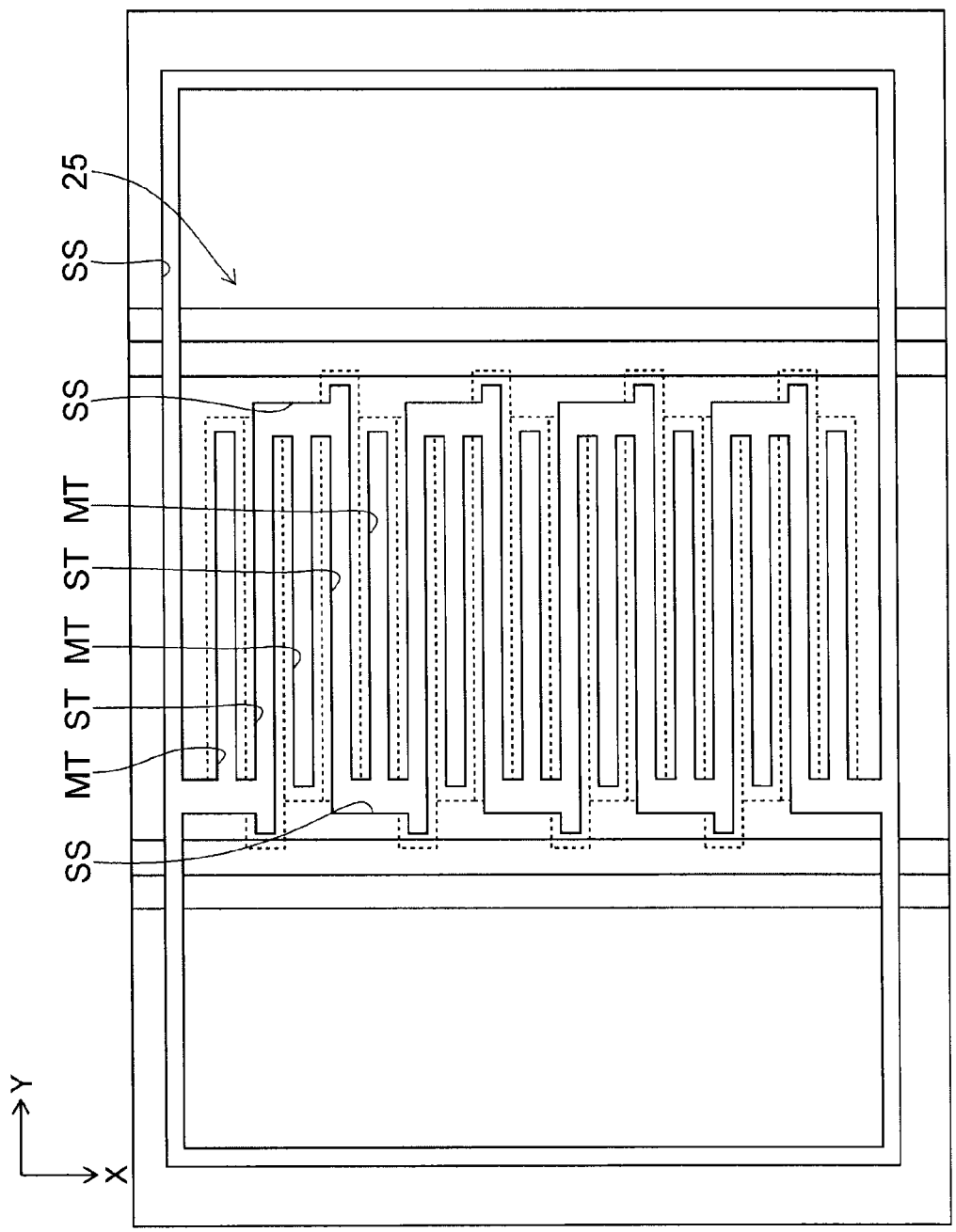
FIG. 80 to FIG. 82 are plan views showing a method for manufacturing a semiconductor memory device according to a fourteenth embodiment.
Figure 81:
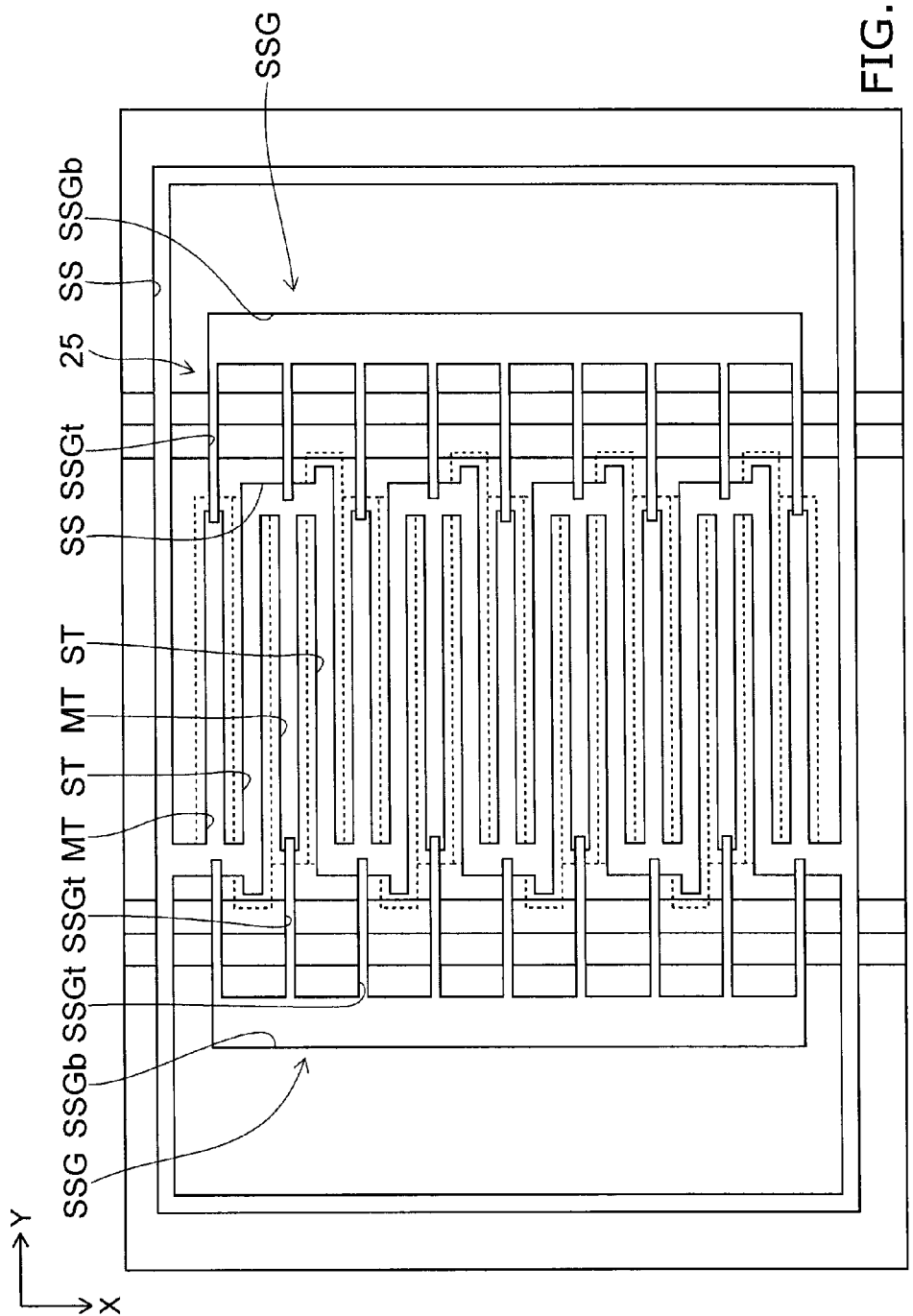
Figure 82:
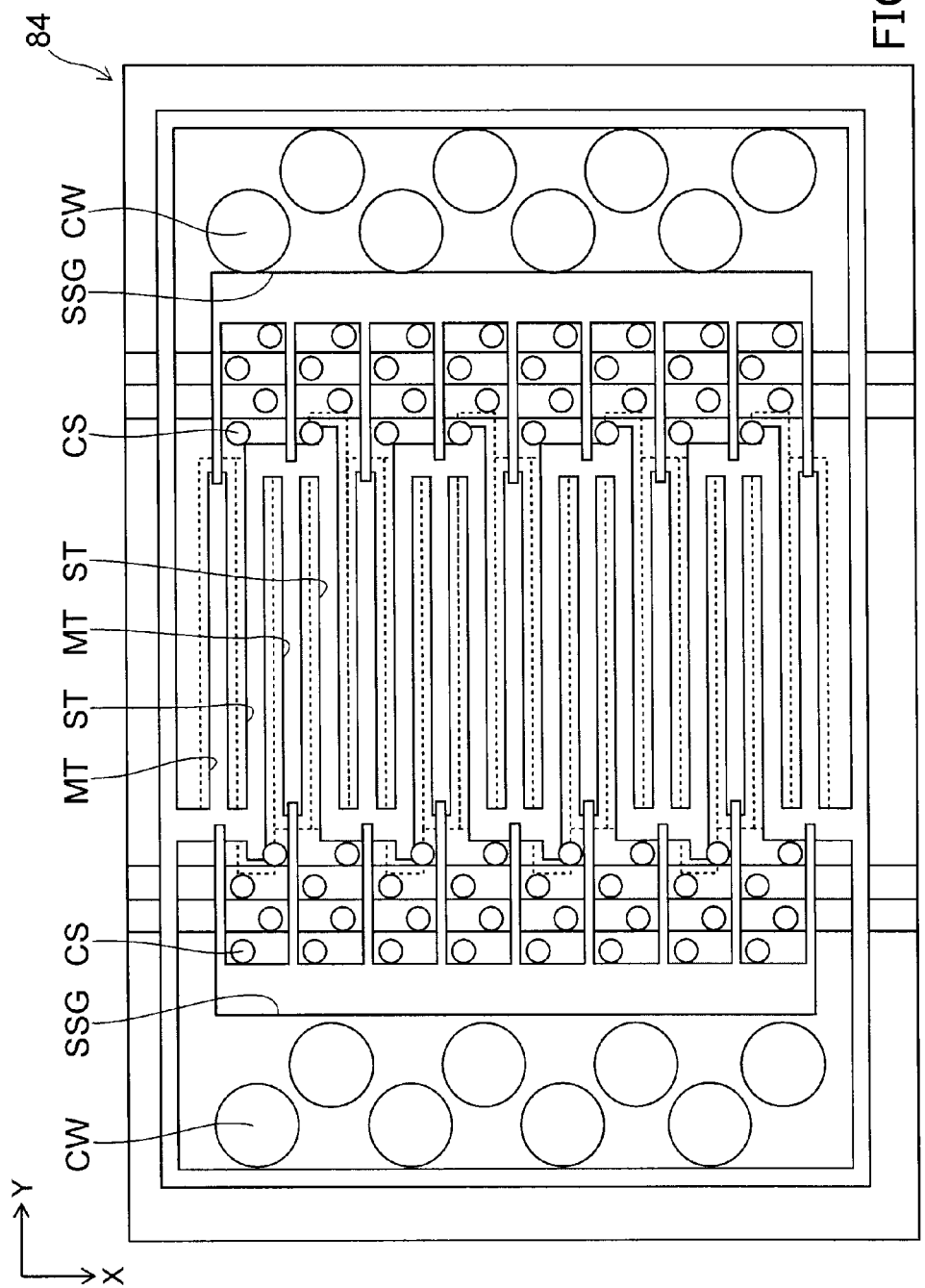

FIG. 80 to FIG. 82 are plan views showing a method for manufacturing a semiconductor memory device according to the embodiment.

First, the process shown in FIG. 75 and FIG. 76 is performed.

Next, as shown in FIG. 80, a slit ST extending in the Y-direction is formed in the multilayer body 25. The longitudinal end part of the slit ST is caused to communicate with the longitudinal end part of the slit SS. At this time, the slit ST is made longer than the memory trench MT. One end part of the slit ST is penetrated through the slit SS and extended out to the other side.

Next, as shown in FIG. 81, a slit SSG is formed in the upper part of the multilayer body 25. The tooth part SSGt of the slit SSG is extended into one end part of the memory trench MT, and into the slit SS disposed on the other end part side of the memory trench MT.

Next, as shown in FIG. 82, both Y-direction end parts of the portion of the multilayer body 25 other than the upper part are processed into a staircase pattern. An upper select contact CS and a word line contact CW are formed. Thus, the semiconductor memory device 84 according to the embodiment is manufactured.

The configuration, manufacturing method, and effect of the embodiment other than the foregoing are similar to those of the tenth embodiment.

(Fifteenth Embodiment)

Next, a fifteenth embodiment is described.

The embodiment is a combination of the tenth embodiment and the sixth embodiment described above. That is, in the embodiment, the slit SS is formed before the memory trench MT. Furthermore, two control gate electrode films 21 disposed on both sides of the memory trench MT are short-circuited.

FIG. 83 to FIG. 87 are plan views showing a method for manufacturing a semiconductor memory device according to the embodiment.

Figure 83:
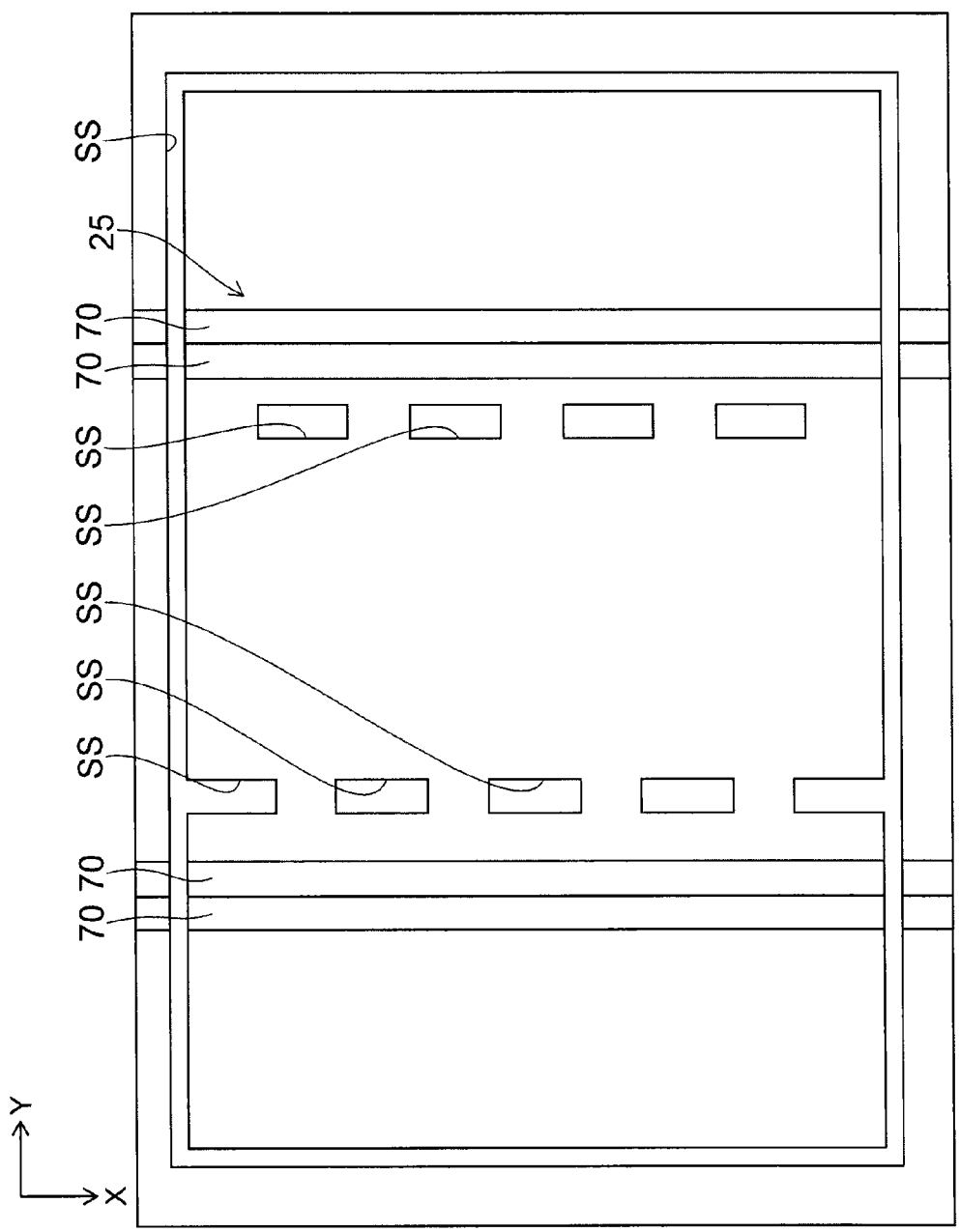
FIG. 83 to FIG. 87 are plan views showing a method for manufacturing a semiconductor memory device according to a fifteenth embodiment.

First, as shown in FIG. 83, both Y-direction end parts of the upper part of the multilayer body 25 are processed into a staircase pattern. Then, a slit SS is formed. The slit SS includes one frame portion and a plurality of rectangular portions staggered inside the frame portion. The longitudinal direction of each rectangular portion is the X-direction. In other words, the rectangular portions are arranged in two rows spaced in the Y-direction. In each row, the rectangular portions are arranged along the X-direction. The arrangement of the rectangular portions is shifted between the rows. Next, silicon oxide is embedded in the slit SS.

Figure 84:
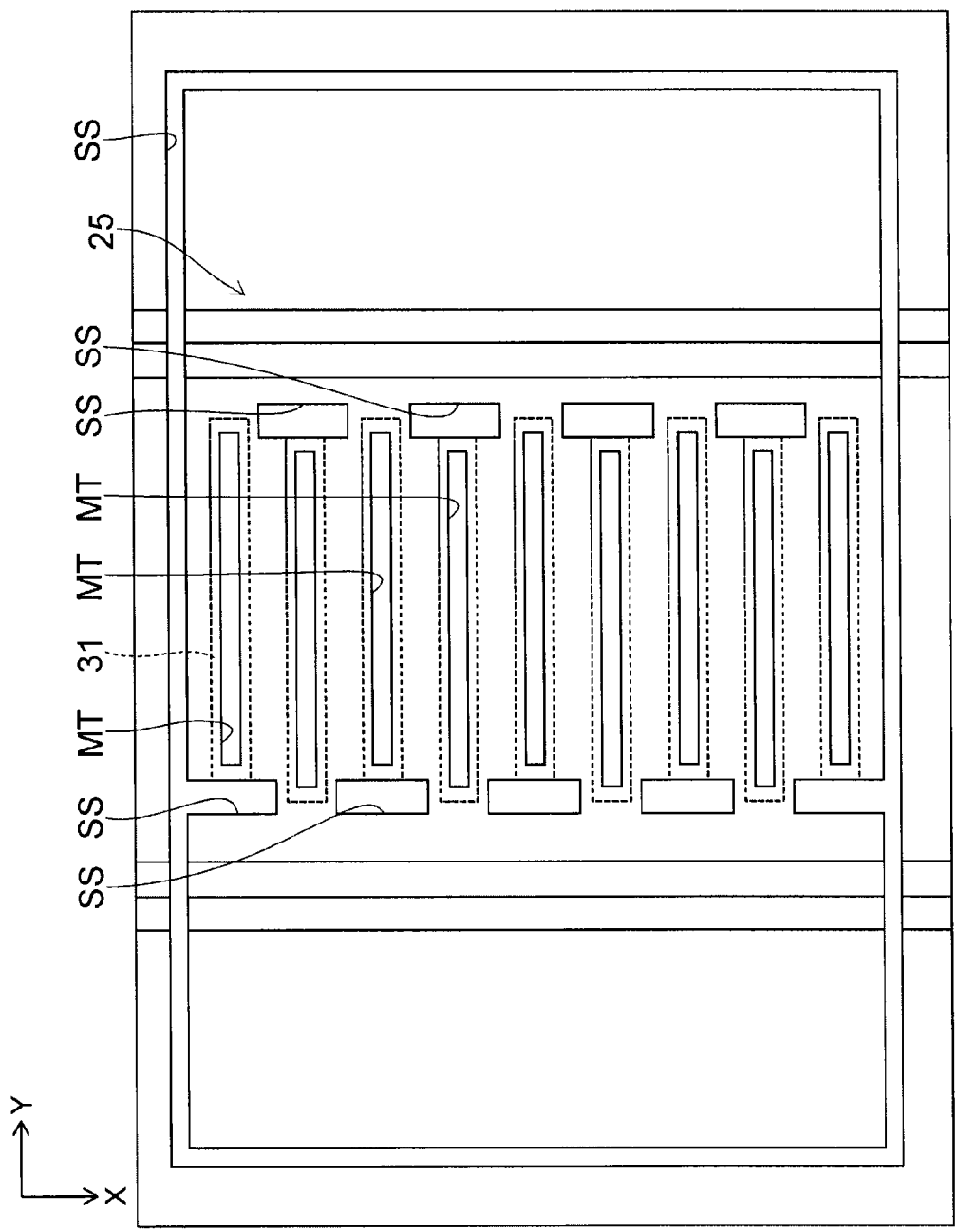

Next, as shown in FIG. 84, a plurality of memory trenches MT extending in the Y-direction are formed in the multilayer body 25. At this time, one longitudinal end part of the memory trench MT is disposed near the longitudinal (X-direction) central part of the slit SS, but not caused to communicate with the slit SS. The other end part of the memory trench MT is disposed between the slits SS adjacent in the X-direction.

Figure 85:
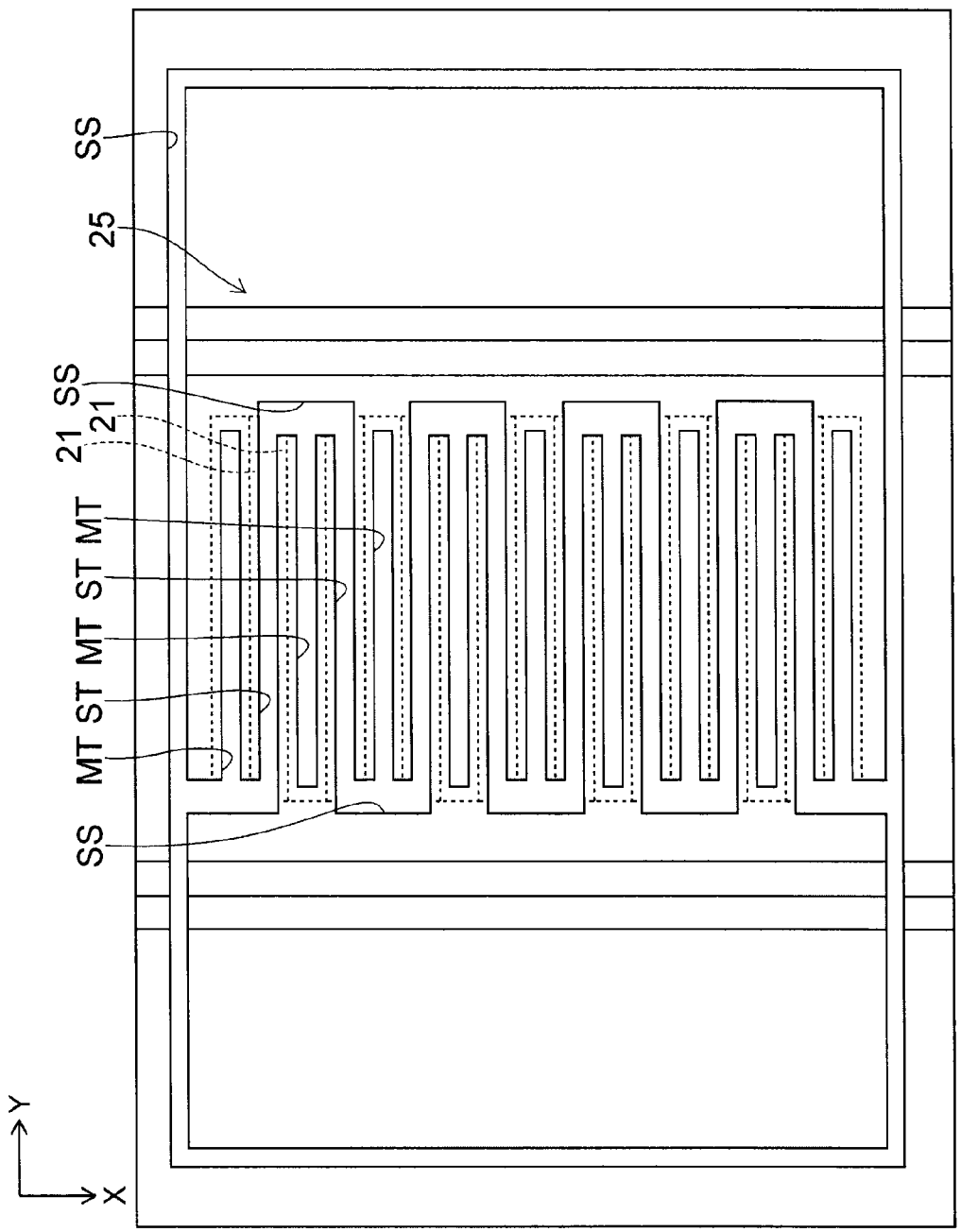

Next, as shown in FIG. 85, a slit ST extending in the Y-direction is formed in the region of the multilayer body 25 between the memory trenches MT. The longitudinal end part of the slit ST is caused to communicate with the longitudinal end part of the slit SS. At this time, silicon oxide has already been embedded in the slit SS, and the polysilicon film 52 does not exist. Thus, no control gate electrode film 21 is formed.

Figure 86:
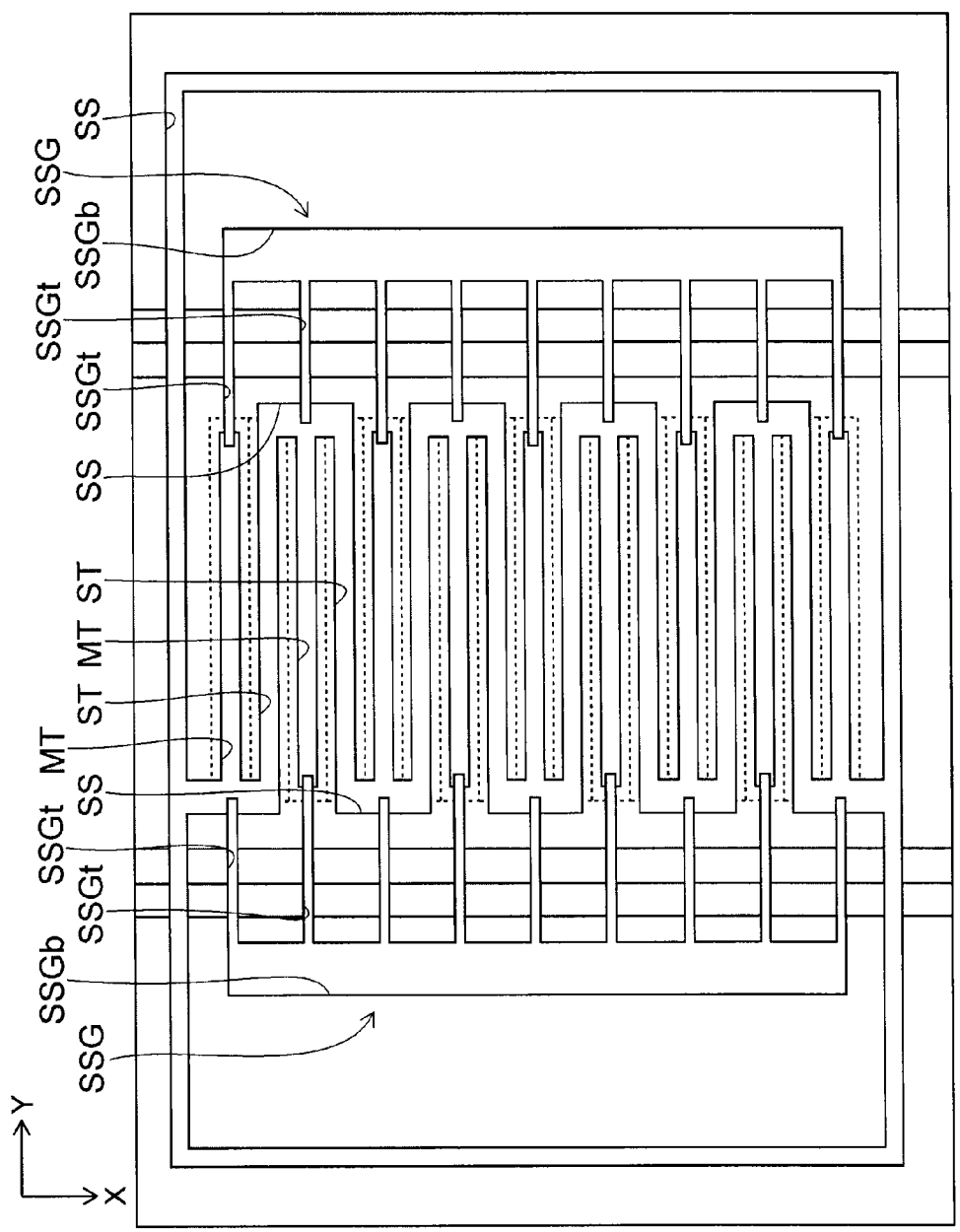

Next, as shown in FIG. 86, a slit SSG is formed in the upper part of the multilayer body 25. The tooth part SSGt of the slit SSG is extended into one end part of the memory trench MT, and into the slit SS disposed on the other end part side of the memory trench MT.

Figure 87:
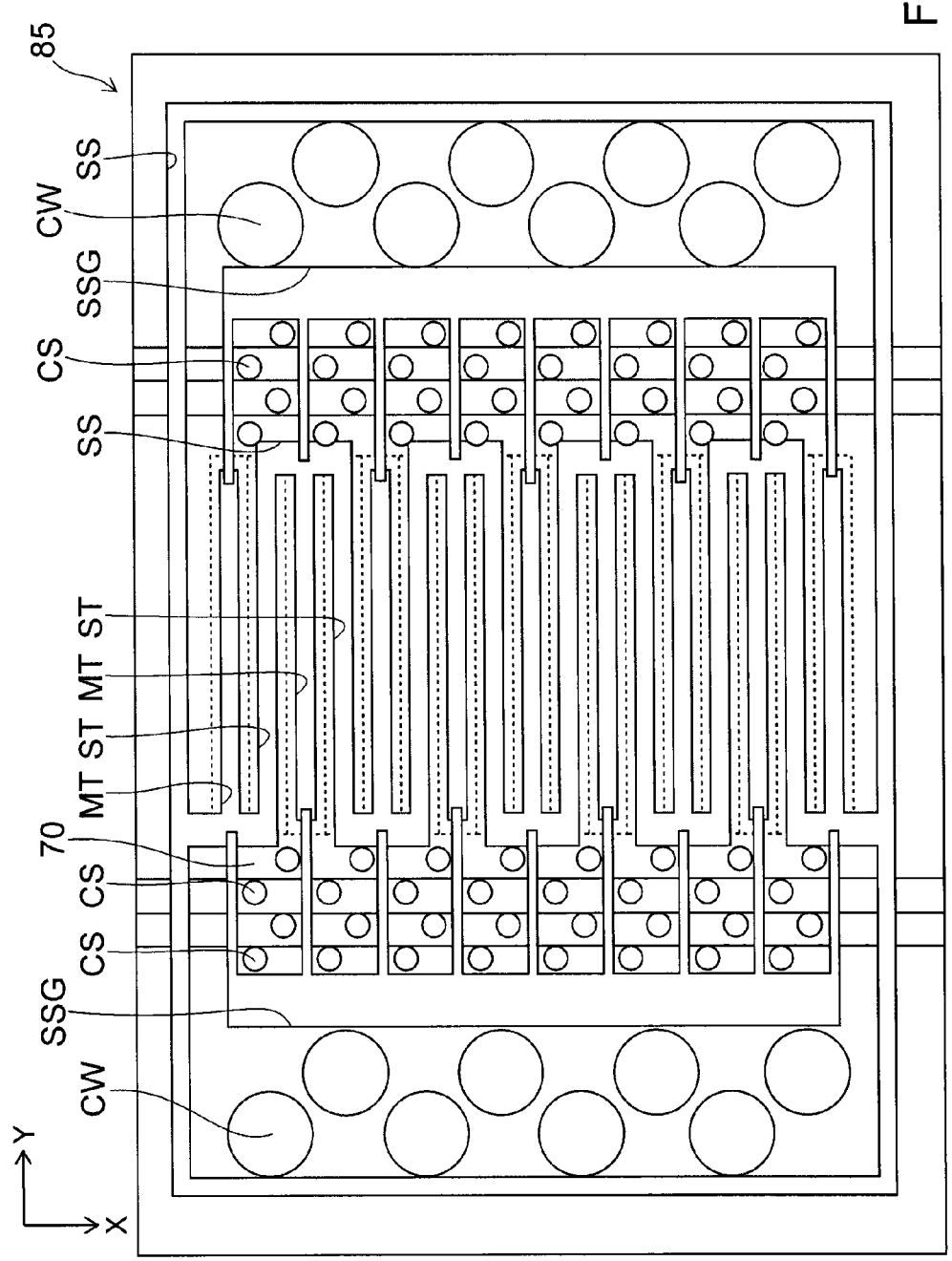

Next, as shown in FIG. 87, both Y-direction end parts of the portion of the multilayer body 25 other than the upper part are processed into a staircase pattern. An upper select contact CS and a word line contact CW are formed. Thus, the semiconductor memory device 85 according to the embodiment is manufactured.

The configuration, manufacturing method, and effect of the embodiment other than the foregoing are similar to those of the tenth embodiment.

(Sixteenth Embodiment0

Next, a sixteenth embodiment is described.

The embodiment is a combination of the tenth embodiment and the seventh embodiment described above. That is, in the embodiment, the slit SS is formed before the memory trench MT. One end part of the slit ST is elongated. Furthermore, two control gate electrode films 21 disposed on both sides of the memory trench MT are short-circuited.

Figure 88:
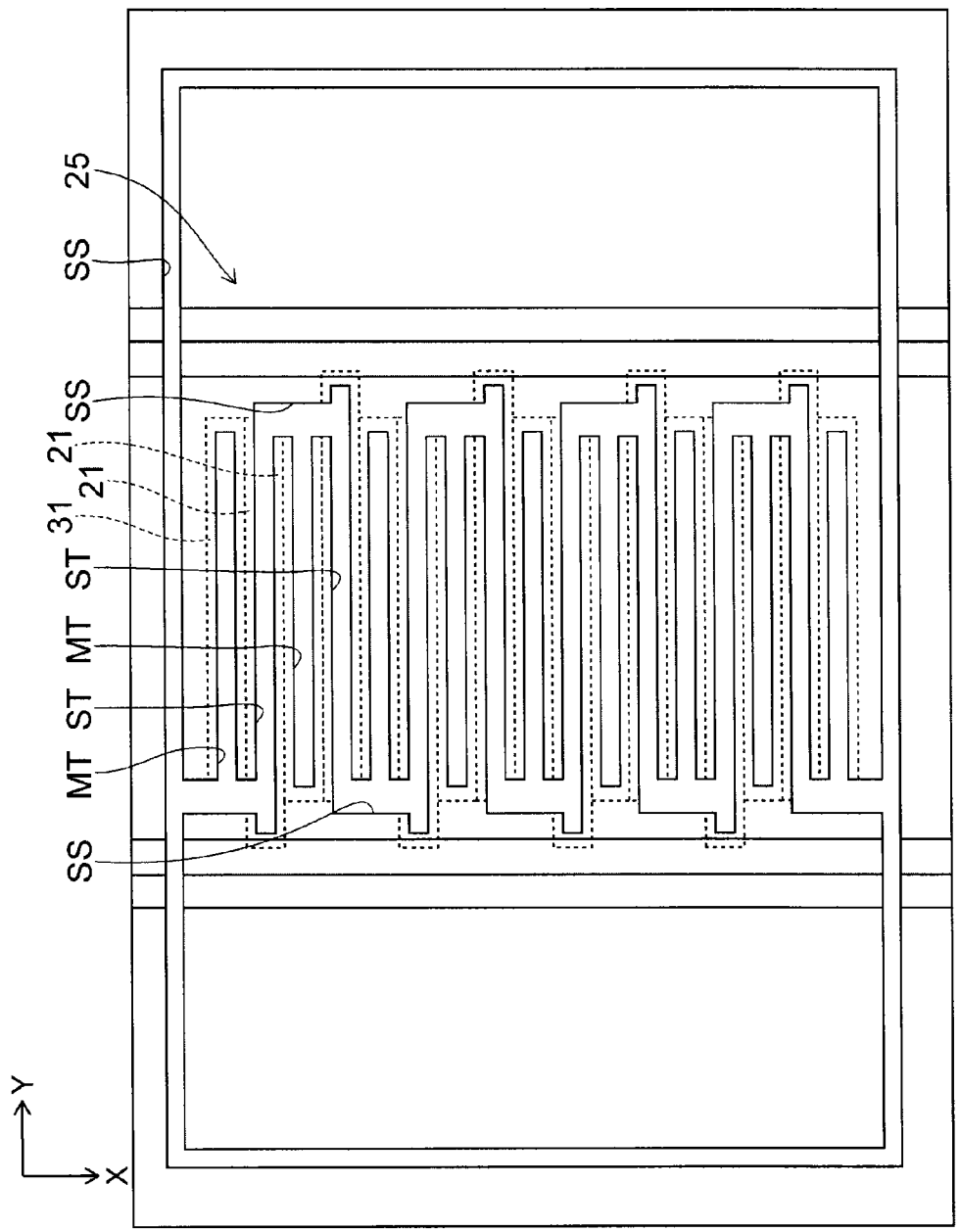
FIG. 88 to FIG. 90 are plan views showing a method for manufacturing a semiconductor memory device according to a sixteenth embodiment.
Figure 89:
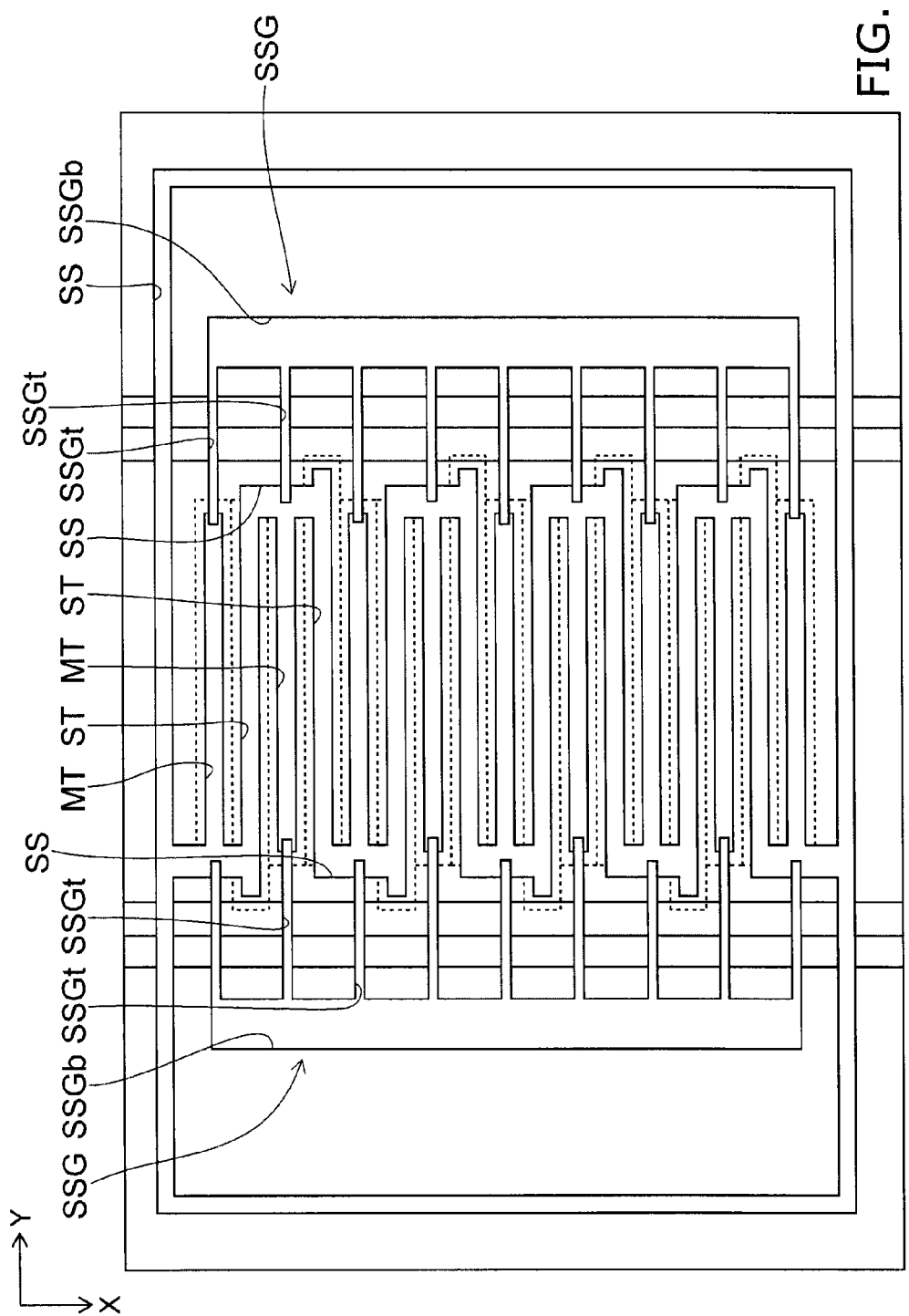
Figure 90:
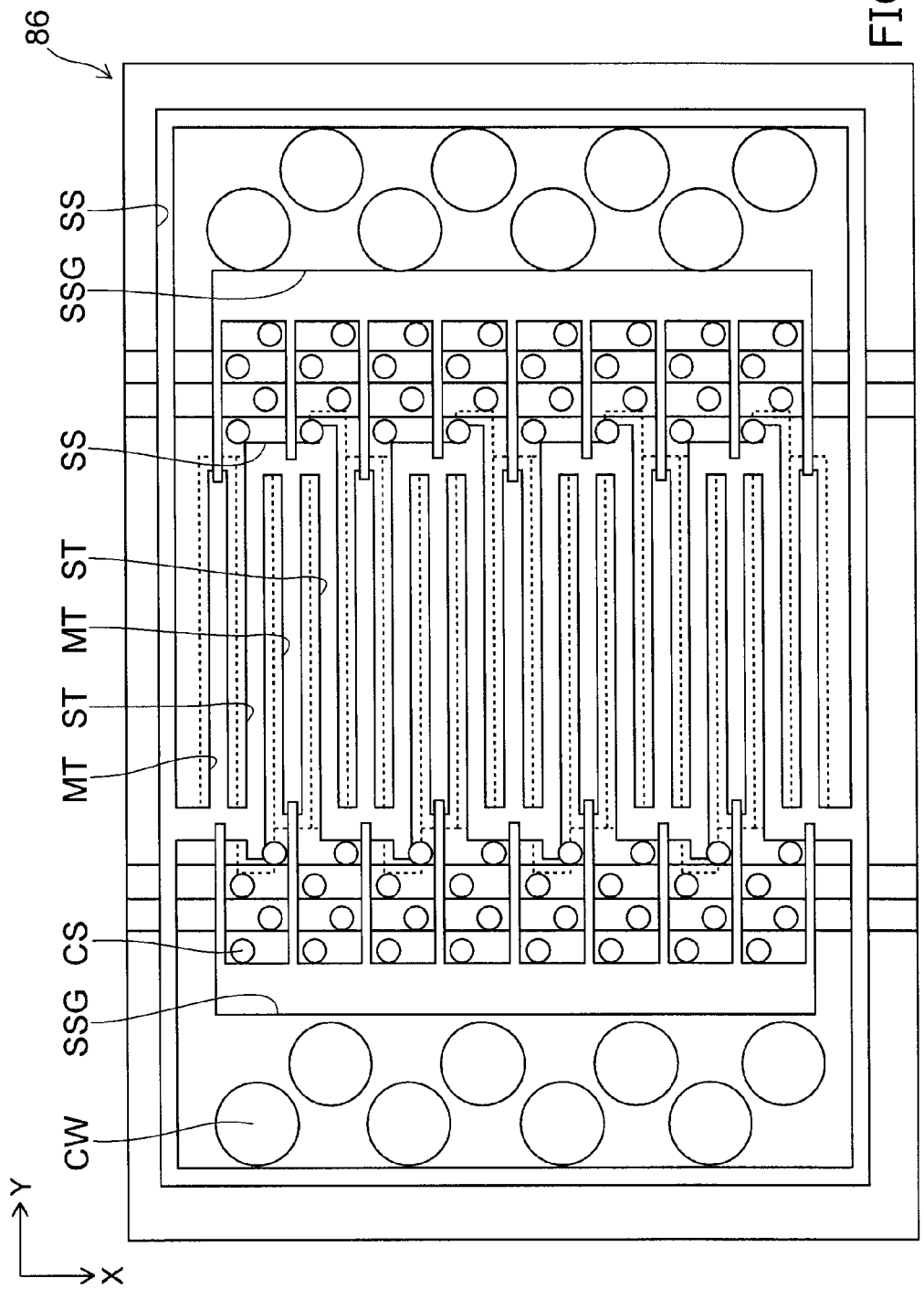

FIG. 88 to FIG. 90 are plan views showing a method for manufacturing a semiconductor memory device according to the embodiment.

First, the process shown in FIG. 83 and FIG. 84 is performed.

Next, as shown in FIG. 88, a slit ST extending in the Y-direction is formed in the region of the multilayer body 25 between the memory trenches MT. The longitudinal end part of the slit ST is caused to communicate with the longitudinal end part of the slit SS. However, one end part of the slit ST is penetrated through the slit SS and extended out to the other side. At this time, the polysilicon film 52 does not exist in the slit SS. Thus, no control gate electrode film 21 is formed.

Next, as shown in FIG. 89, a slit SSG is formed in the upper part of the multilayer body 25. The tooth part SSGt of the slit SSG is extended into one end part of the memory trench MT, and into the slit SS disposed on the other end part side of the memory trench MT.

Next, as shown in FIG. 90, both Y-direction end parts of the portion of the multilayer body 25 other than the upper part are processed into a staircase pattern. An upper select contact CS and a word line contact CW are formed. Thus, the semiconductor memory device 86 according to the embodiment is manufactured.

The configuration, manufacturing method, and effect of the embodiment other than the foregoing are similar to those of the tenth embodiment.

(Seventeenth Embodiment)

Next, a seventeenth embodiment is described.

In the embodiment, the slit ST is configured to double as a slit SS. Furthermore, two control gate electrode films 21 disposed on both sides of the memory trench MT are short-circuited.

FIG. 91 to FIG. 94 are plan views showing a method for manufacturing a semiconductor memory device according to the embodiment.

Figure 91:
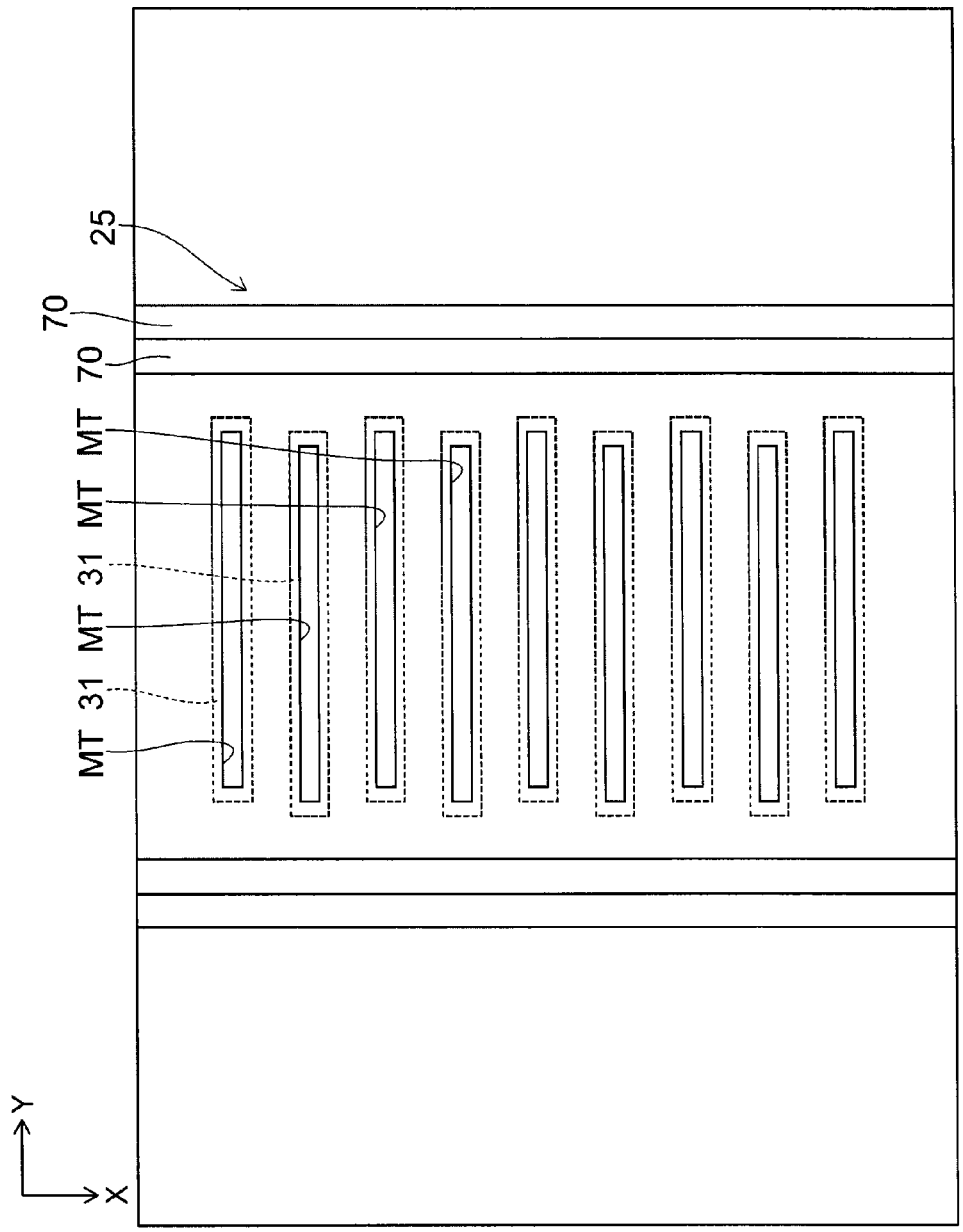
FIG. 91 to FIG. 94 are plan views showing a method for manufacturing a semiconductor memory device according to a seventeenth embodiment.

First, as shown in FIG. 91, both Y-direction end parts of the upper part of the multilayer body 25 are processed into a staircase pattern. Then, a plurality of memory trenches MT extending in the Y-direction are formed in the multilayer body 25. The memory trenches MT are positioned at two levels in the Y-direction. The memory trenches MT are alternately disposed at the positions of these two levels. That is, with reference to one memory trench MT, the Y-direction positions of the memory trenches MT arranged at the odd-numbered places along the X-direction are equal to each other. The Y-direction positions of the memory trenches MT arranged at the even-numbered places are equal to each other, but different from the odd-numbered ones.

Figure 92:
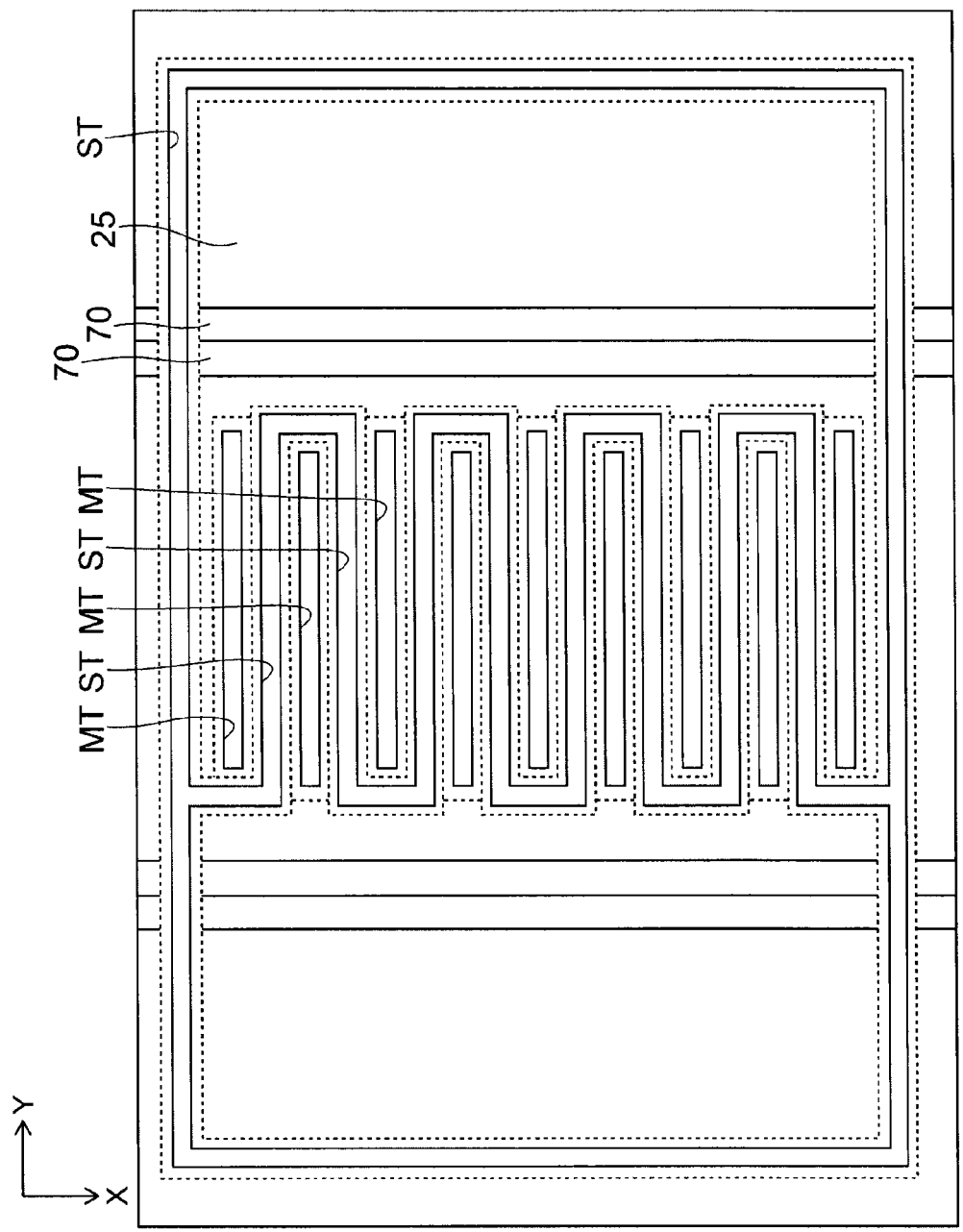

Next, as shown in FIG. 92, a slit ST is formed in the multilayer body 25. The slit ST includes a frame portion and a meandering portion. The frame portion partitions the multilayer body 25 into blocks. The meandering portion extends in the X-direction while reciprocating in the Y-direction inside the frame portion. The meandering portion is disposed so as to pass between the memory trenches MT. Both end parts of the meandering portion is caused to communicate with the frame portion.

Figure 93:
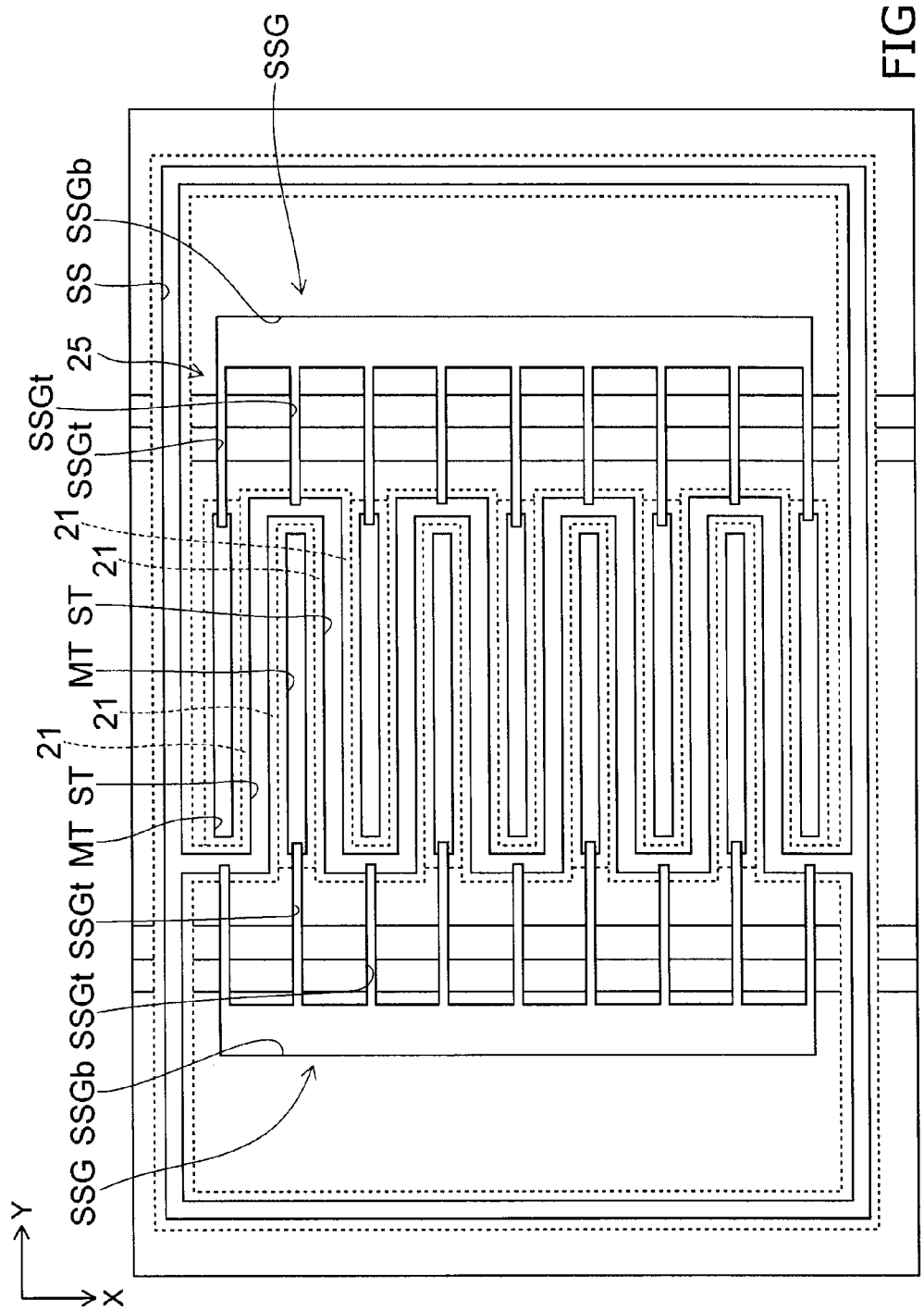

Next, as shown in FIG. 93, a slit SSG is formed in the upper part of the multilayer body 25. The tooth part SSGt of the slit SSG is extended into one end part of the memory trench MT, and into the portion of the slit ST in contact with the other end part of the memory trench MT. Thus, the control gate electrode films 21 sandwiching the memory trench MT are connected to each other. The control gate electrode films 21 sandwiching the slit ST are insulated from each other.

Figure 94:
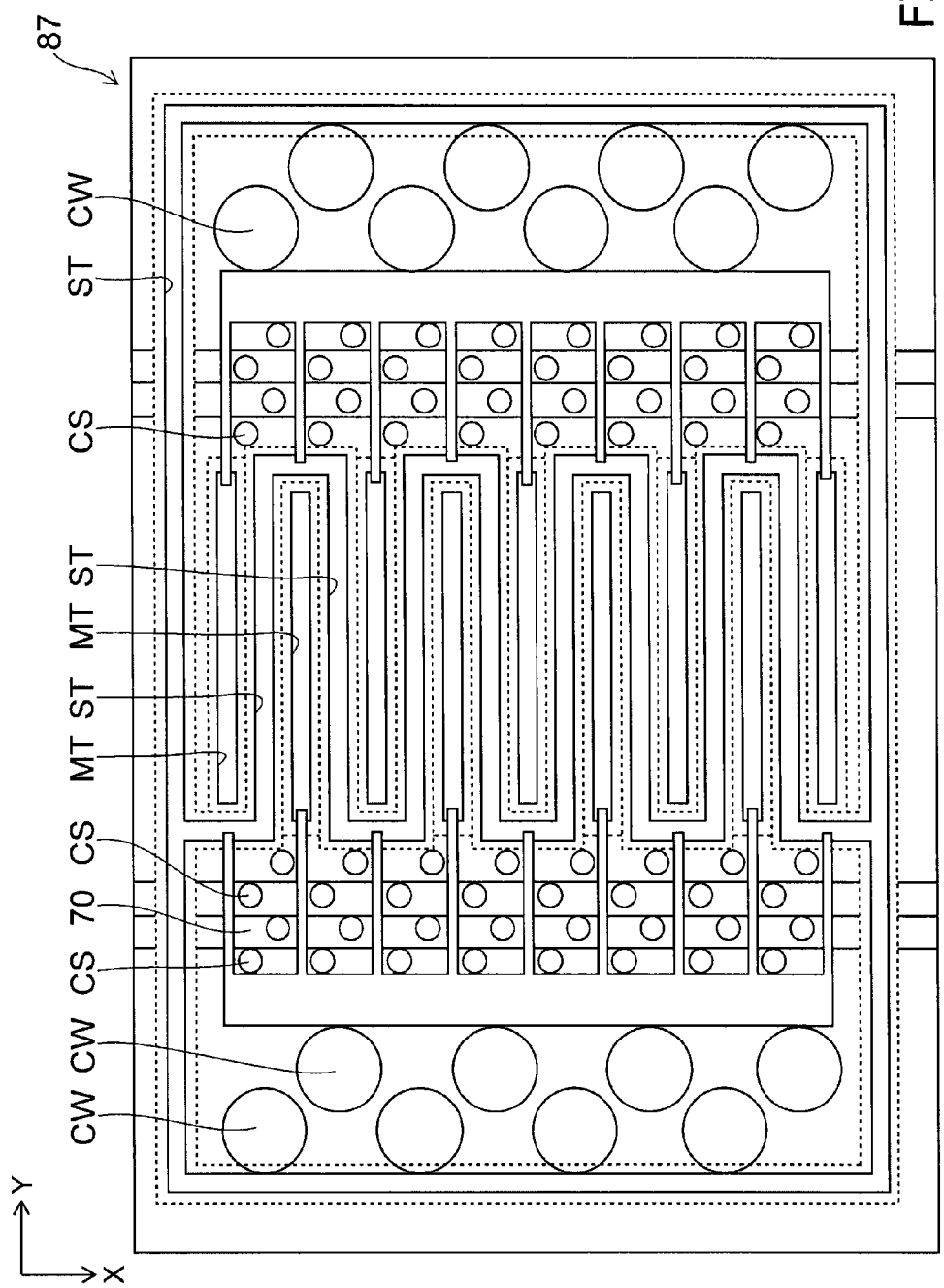

Next, as shown in FIG. 94, both Y-direction end parts of the portion of the multilayer body 25 other than the upper part are processed into a staircase pattern. An upper select contact CS and a word line contact CW are formed. Thus, the semiconductor memory device 87 according to the embodiment is manufactured. The configuration, manufacturing method, and effect of the embodiment other than the foregoing are similar to those of the tenth embodiment.

In the example of the above embodiments, interlayer insulating films 24 made of silicon oxide and polysilicon films 52 are alternately stacked to form a multilayer body 25. Then, the polysilicon films 52 are turned to a floating gate electrode film 31 and a control gate electrode film 21. However, the material forming the multilayer body 25 is not limited thereto. For instance, silicon oxide films and silicon nitride films may be alternately stacked to form a multilayer body. The silicon nitride films may be turned to a floating gate electrode film and a control gate electrode film.

The embodiments described above can realize a semiconductor memory device and a method for manufacturing the same capable of easily forming pullout interconnects.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

What is claimed is:

1. A semiconductor memory device comprising:
a substrate comprising a cell source line;
a first bit line extending in a first direction, the first direction being parallel to an upper surface of the substrate;
a first signal line extending in a second direction crossing the first direction and the upper surface of the substrate, the first signal line having a first portion contacting the cell source line at an end of the first signal line,
a first select transistor being electrically connected to the first bit line and the first signal line;
a second signal line being arranged apart from and adjacent to the first signal line in the first direction, the second signal line extending in the second direction, the second signal line having a second portion contacting the cell source line at an end of the second signal line in the second direction;
a second select transistor being electrically connected to the first bit line and the second signal line;
a first insulator disposed between the first signal line and the second signal line;
a first gate electrode extending in a third direction crossing the first and the second directions;
a second gate electrode extending in the third direction, the first signal line and the second signal line being disposed between the first gate electrode and the second gate electrode in the first direction;
a first memory cell between the first signal line and the first gate electrode to store first information by applying voltage between the first signal line and the first gate electrode;
a second memory cell between the second signal line and the second gate electrode to store second information by applying voltage between the second signal line and the second gate electrode;
a third signal line being arranged apart from the second signal line in the first direction, the third signal line extending in the second direction, the third signal line having a third portion contacting the cell source line at an end of the third signal line in the second direction;
a third select transistor being electrically connected to the first bit line and the third signal line;
a fourth signal line being arranged apart from the third signal line in the first direction, the fourth signal line extending in the second direction, the fourth signal line having a fourth portion contacting the cell source line at an end of the fourth signal line in the second direction;
a fourth select transistor being electrically connected to the first bit line and the fourth signal line;
a second insulator disposed between the third signal line and fourth signal line;
a third gate electrode extending in the third direction, the second gate electrode and the third gate electrode being disposed between the second signal line and the third signal line in the first direction;
a fourth gate electrode extending in the third direction, the first gate electrode being electrically connected to one of the third gate electrode and the fourth gate electrode, and the second gate electrode being electrically connected to the other one of the third gate electrode and the fourth gate electrode;
a third insulator disposed between the second gate electrode and the third gate electrode;

a third memory cell between the third signal line and the third gate electrode to store third information by applying voltage between the third signal line and the third gate electrode; and a fourth memory cell between the fourth signal line and the fourth gate electrode to store fourth information by applying voltage between the fourth signal line and the fourth gate electrode, wherein the first portion and the second portion face each other in the first direction and contact each other beneath the first insulator and above the cell source line in the second direction, the first portion is dented in the first direction from an upper part of the first signal line and the second portion is dented in the first direction from an upper part of the second signal line.

2. The semiconductor memory device according to claim 1, further comprising:

a first contact electrically connected to the first select transistor; and a second contact electrically connected to the second select transistor.

3. The semiconductor memory device according to claim 2, wherein the first contact and the second contact are next to each other in the first direction.

4. The semiconductor memory device according to claim 2, further comprising:

a fifth select transistor provided directly above the second select transistor in the second direction; and a third contact electrically connected to the fifth select transistor, the third contact being shorter than the second contact in the second direction.

5. The semiconductor memory device according to claim 2, further comprising:

a fourth contact electrically connected to the first gate electrode, the fourth contact being longer than both of the first and the second contact in the second direction.

6. The semiconductor memory device according to claim 1, wherein a space between the second gate electrode and the third gate electrode is free from semiconductor.

7. The semiconductor memory device according to claim 1, wherein the first gate electrode, the first memory cell, the first signal line, the first insulator, the second memory cell, the second signal line, the third insulator, the third gate electrode, the third memory cell, the third signal line, the second insulator, the fourth memory cell, and the fourth signal line exist along the first direction in this order.

8. The semiconductor memory device according to claim 1, wherein the third portion and the fourth portion face each other in the first direction and contact each other beneath the second insulator and above the cell source line in the second direction, the third portion is dented in the first direction from an upper part of the third signal line, and the fourth portion is dented in the first direction from an upper part of the fourth signal line.

* * * * *